US009147666B2

(12) United States Patent
Yoshihara et al.

(10) Patent No.: US 9,147,666 B2
(45) Date of Patent: Sep. 29, 2015

(54) SEMICONDUCTOR DEVICE

(75) Inventors: Katsuhiko Yoshihara, Kyoto (JP);
Masaru Ishii, Kyoto (JP); Kouichi Kitaguro, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 13/320,238

(22) PCT Filed: May 12, 2010
(Under 37 CFR 1.47)

(86) PCT No.: PCT/JP2010/058049
§ 371 (c)(1),
(2), (4) Date: Apr. 27, 2012

(87) PCT Pub. No.: WO2010/131679
PCT Pub. Date: Nov. 18, 2010

(65) Prior Publication Data
US 2012/0256194 A1 Oct. 11, 2012

(30) Foreign Application Priority Data

May 14, 2009 (JP) ................................. 2009-117271
Oct. 1, 2009 (JP) ................................. 2009-230017

(51) Int. Cl.
*H01L 23/52* (2006.01)
*H01L 23/00* (2006.01)
(Continued)

(52) U.S. Cl.
CPC .............. *H01L 24/72* (2013.01); *H01L 23/645* (2013.01); *H01L 24/32* (2013.01); *H01L 24/49* (2013.01);
(Continued)

(58) Field of Classification Search
CPC ....... H01L 24/72; H01L 24/49; H01L 23/645; H01L 29/24; H01L 23/48; H01L 23/49531
USPC ................ 257/77, E31.03, E29.04, 773, 121; 438/617, 237, 328
See application file for complete search history.

(56) References Cited

U.S. PATENT DOCUMENTS 5,130,784 A * 7/1992 Saeki et al. ................... 257/726
6,566,750 B1 5/2003 Sofue et al.
(Continued)

FOREIGN PATENT DOCUMENTS

JP 53-015762 A 2/1978
JP 59-031048 A 2/1984
(Continued)

OTHER PUBLICATIONS

Tetsujiro Tsunoda, Tadashi Matsuda, Yoshikuni Nakadaira Hirofurni Nakayama, Yorimichi Sasada; "Low-Iinductance Module Construction for H.igh Speed, High Current IGBT Module Suitable for Electric Vehicle Application"; 0-7!I03"1313-5/93/0000-0292/$3.00 © 1993 TEEE; 1993; Toshiba Corporation, Microelectronics Center, System Engineering Center, J Komukai Toshiba-cho, Saiwai-ku, Kawasaki, 210, Japan," 580-1 Horikawa-cho, Saiwai-ku, Kawasaki, 210, Japan; 292-295.

*Primary Examiner* — Jarrett Stark
*Assistant Examiner* — Shahed Ahmed
(74) *Attorney, Agent, or Firm* — Rabin & Berdo, P.C.

(57) ABSTRACT

Disclosed is a semiconductor device having a structure capable of reducing the self-inductance of internal wiring. The semiconductor device includes: a lower board having a lower conductor layer formed on the surface thereof; a switching element bonded to the lower conductor layer in an element bonding area; a terminal bonded to the lower conductor layer in a terminal bonding area; an upper board stacked on the lower board in a board bonding area between the element bonding area and the terminal bonding area, and having an upper conductor layer on the surface thereof; and a switching element connecting member which connects the switching element with the upper conductor layer.

20 Claims, 40 Drawing Sheets

(51) Int. Cl.
*H01L 23/64* (2006.01)
*H01L 25/07* (2006.01)
*H01L 23/373* (2006.01)

(52) U.S. Cl.
CPC .............. *H01L 24/73* (2013.01); *H01L 25/072* (2013.01); *H01L 23/3735* (2013.01); *H01L 24/45* (2013.01); *H01L 24/48* (2013.01); *H01L 2223/6611* (2013.01); *H01L 2224/291* (2013.01); *H01L 2224/29111* (2013.01); *H01L 2224/32225* (2013.01); *H01L 2224/45014* (2013.01); *H01L 2224/45015* (2013.01); *H01L 2224/45124* (2013.01); *H01L 2224/45144* (2013.01); *H01L 2224/48091* (2013.01); *H01L 2224/48137* (2013.01); *H01L 2224/48227* (2013.01); *H01L 2224/49111* (2013.01); *H01L 2224/73265* (2013.01); *H01L 2224/85205* (2013.01); *H01L 2924/014* (2013.01); *H01L 2924/0105* (2013.01); *H01L 2924/01006* (2013.01); *H01L 2924/01013* (2013.01); *H01L 2924/01014* (2013.01); *H01L 2924/01023* (2013.01); *H01L 2924/01028* (2013.01); *H01L 2924/01029* (2013.01); *H01L 2924/0132* (2013.01); *H01L 2924/01033* (2013.01); *H01L 2924/01078* (2013.01); *H01L 2924/01079* (2013.01); *H01L 2924/01082* (2013.01); *H01L 2924/01322* (2013.01); *H01L 2924/10253* (2013.01); *H01L 2924/12032* (2013.01); *H01L 2924/12041* (2013.01); *H01L 2924/1305* (2013.01); *H01L 2924/1306* (2013.01); *H01L 2924/13055* (2013.01); *H01L 2924/13091* (2013.01); *H01L 2924/15747* (2013.01); *H01L 2924/2076* (2013.01); *H01L 2924/30107* (2013.01)

(56) References Cited

U.S. PATENT DOCUMENTS

| | | |
|---|---|---|
| 2002/0024129 A1 | 2/2002 | Hirahara et al. |
| 2007/0033260 A1 | 2/2007 | Grouzdev et al. |
| 2007/0132102 A1* | 6/2007 | Nishimura et al. ........... 257/758 |
| 2007/0215999 A1 | 9/2007 | Kashimoto et al. |
| 2008/0105896 A1 | 5/2008 | Kawaguchi et al. |
| 2009/0072356 A1* | 3/2009 | Sugawara ...................... 257/632 |
| 2009/0217976 A1* | 9/2009 | Cart et al. ...................... 136/256 |
| 2010/0295094 A1* | 11/2010 | Albers et al. ................... 257/173 |
| 2011/0019381 A1* | 1/2011 | Kawano et al. ................ 361/783 |

FOREIGN PATENT DOCUMENTS

| | | |
|---|---|---|
| JP | 1-255257 A | 10/1989 |
| JP | 3-025963 B1 | 3/2000 |
| JP | 2000-091498 A | 3/2000 |
| JP | 2002-026251 A | 1/2002 |
| JP | 2002-033446 A | 1/2002 |
| JP | 2003-289130 A | 10/2003 |
| JP | 2005-223141 A | 8/2005 |
| JP | 2006-041098 A | 2/2006 |
| JP | 2008-085169 A | 4/2008 |
| JP | 2009-200416 A | 9/2009 |
| JP | 5643752 B2 | 11/2014 |

* cited by examiner

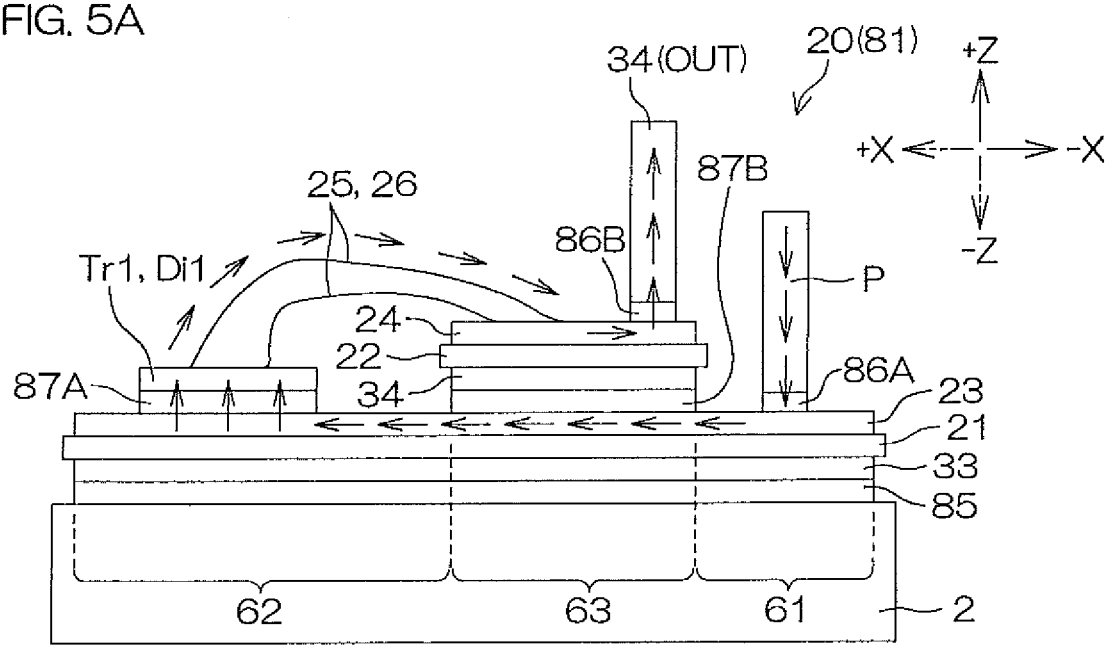
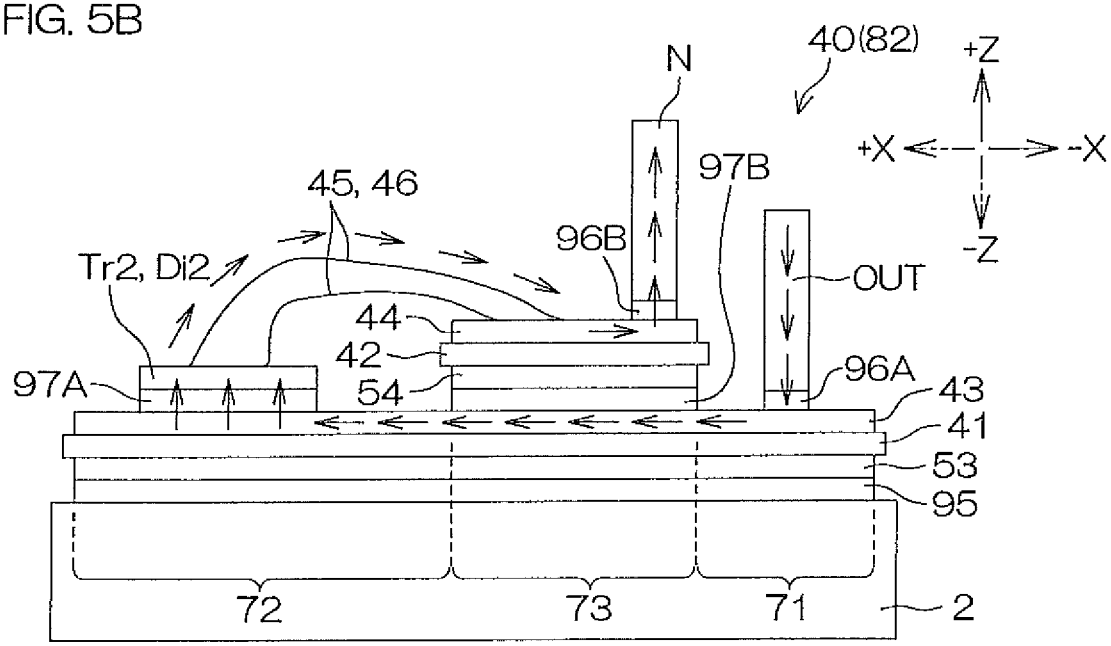

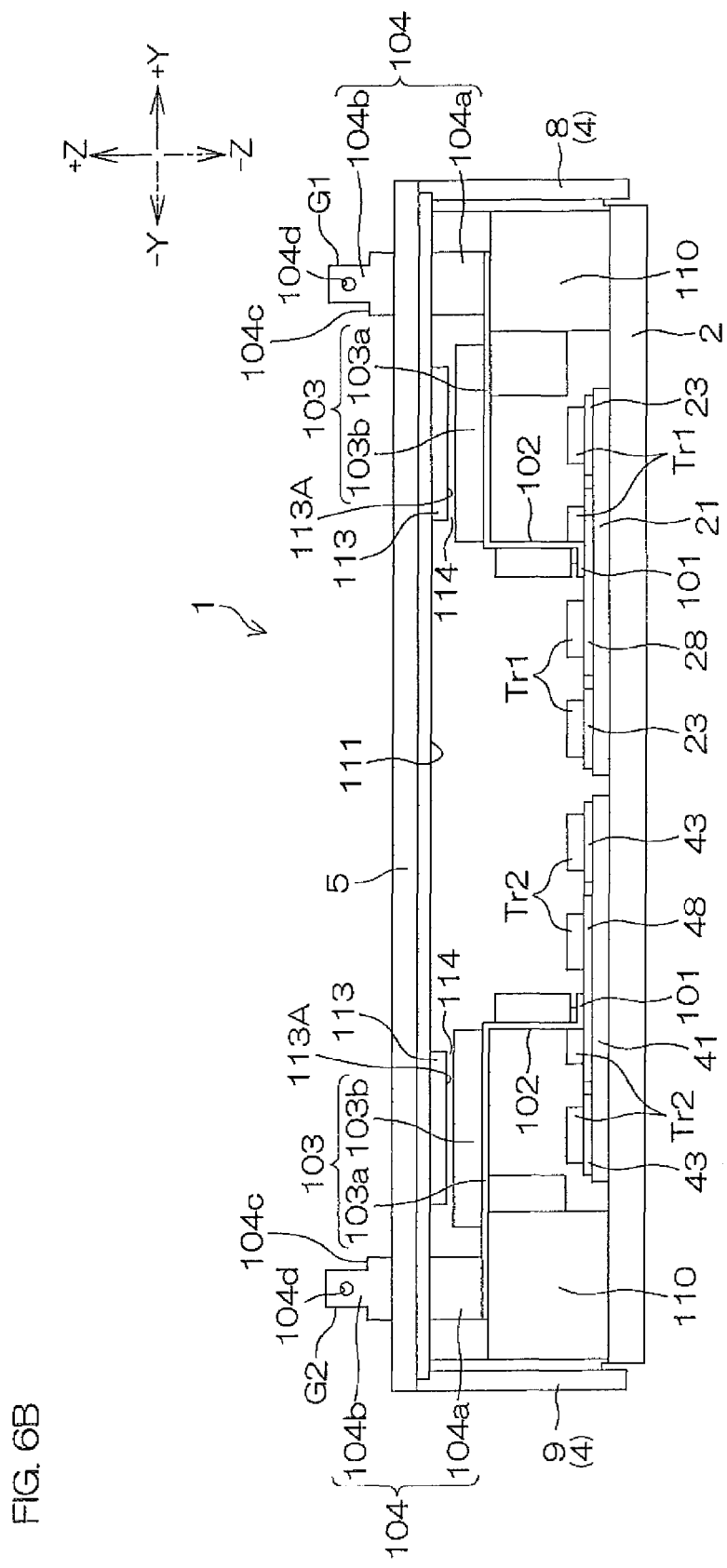

FIG. 7B
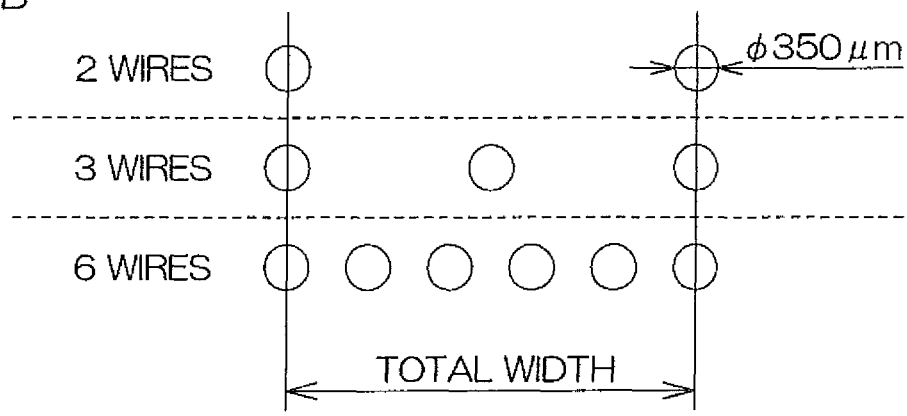
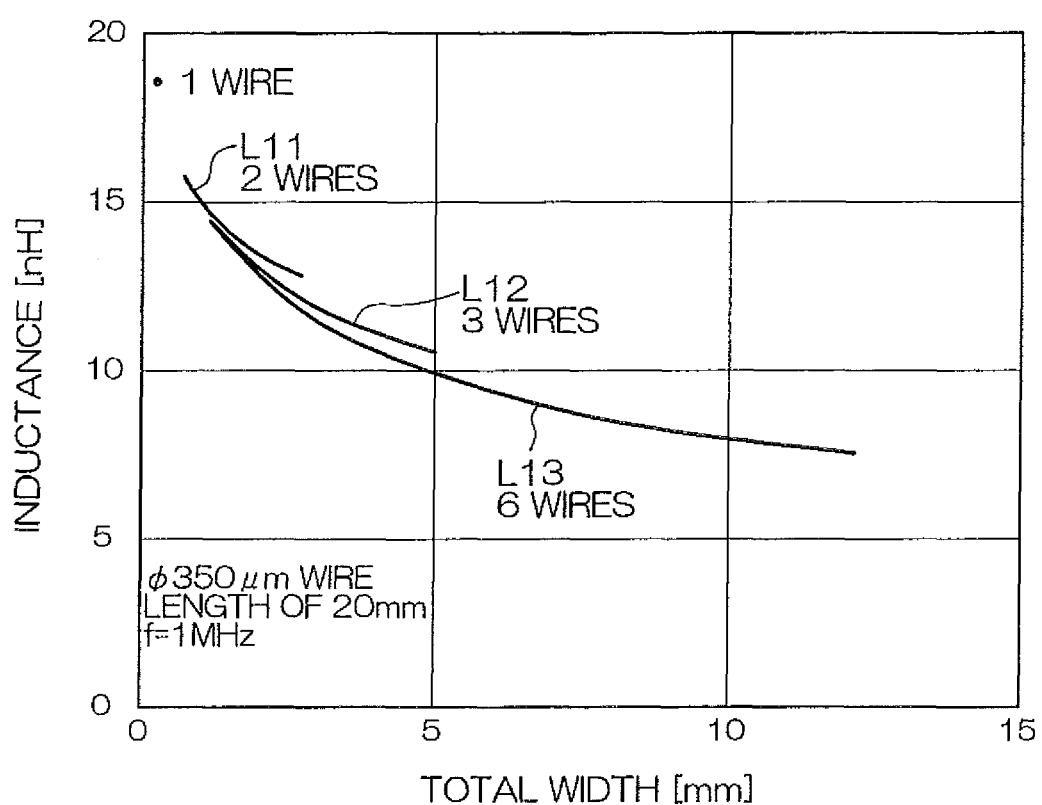

0
SEMICONDUCTOR DEVICE

TECHNICAL FIELD

The present invention relates to a semiconductor device such as a power module.

BACKGROUND ART

A power module is a device for which a pair of switching elements are connected in series to a power supply, and which obtains an output from between the pair of switching elements. Such a power module is used for, for example, an inverter circuit that forms a driving circuit to drive an electric motor. The electric motor is used as, for example, a power source of an electric vehicle (including a hybrid car), a train, an industrial robot, and the like. The power module is also applied to an inverter circuit that converts electric power generated by a solar battery, a wind power generator, and other power generators (particularly, a private electric generator) so as to be consistent with the electric power of a commercial power supply.

For the switching elements of power modules, devices using Si (silicon) semiconductors have been conventionally used. However, there has been a problem of losses in the devices at the time of power conversion, and the situation is that a further improvement in efficiency of the devices using Si materials is no longer feasible.

Therefore, a power module using as its switching elements power devices using SiC (silicon carbide) semiconductors has been proposed. The SiC power devices are capable of a high-speed ON/OFF operation because the switching speed is high. Consequently, a current quickly decreases at the time of switch-off, so that switching loss can be reduced.

However, high-speed switching by the SiC power devices causes a new problem that an increase in surge voltage at the time of switching occurs.

The surge voltage V is, as shown in the following formula (A), given by a product of a self-inductance L which internal wiring of the power module has and a differential (di/dt) of a current i by a time t (a current change ratio per hour).

$$V = L \cdot (di/dt) \quad (A)$$

The higher the switching speed, the greater the change ratio (di/dt) of the current i, so that the surge voltage V is increased. When the surge voltage loads the devices with a voltage not less than a breakdown voltage, the devices may be broken. Moreover, when the surge voltage is great, there are also concerns of an increase in EMI (electromagnetic interference) noise and a reduction in reliability.

Therefore, in order to reduce surge voltage while applying high-speed switching elements such as SiC devices, it is necessary to reduce the self-inductance L which the internal wiring of the power module has. This challenge is common not only to power modules but also to semiconductor devices having switching elements. Of course, also in semiconductor devices having switching elements using Si semiconductors, a reduction in surge voltage is a significant challenge.

CITATION LIST

Patent Literature

Patent Document 1: Japanese Published Unexamined Patent Application No. 2002-026251

SUMMARY OF INVENTION

Technical Problem

An object of this invention is to provide a semiconductor device having a structure capable of effectively reducing the self-inductance of internal wiring.

Another object of this invention is to provide a semiconductor device capable of realizing a power module with a small self-inductance of internal wiring.

Still another object of this invention is to provide a semiconductor device which allows terminal lead-out in a direction parallel to the principal surface of a board.

Still another object of this invention is to provide a semiconductor device improved in reliability against an external force to be applied to terminals.

Still another object of this invention is to provide a semiconductor device capable of reducing self-inductance and capable of improving the reliability against heat cycle.

Solution to Problem

A semiconductor device according to a first aspect of this invention includes a lower board having a lower conductor layer formed on a surface thereof, a switching element bonded to the lower conductor layer in an element bonding area, a terminal bonded to the lower conductor layer in a terminal bonding area, an upper board stacked on the lower board in a board bonding area between the element bonding area and the terminal bonding area, and having an upper conductor layer on a surface thereof, and a switching element connecting member which connects the switching element with the upper conductor layer.

According to this configuration, a current path provided by the lower conductor layer that interconnects the terminal and the switching element and a current path that leads to the upper conductor layer via the switching element connecting member from the switching element are close to each other. Moreover, currents in reverse directions flow in the current paths. Accordingly, inductances of the current paths are at least partially cancelled out, so that a semiconductor device with a low self-inductance of internal wiring can be provided. Accordingly, even when the switching speed of the switching element is high, a surge voltage can be suppressed. Consequently, a semiconductor device that is capable of high-speed switching, has a small loss accordingly, and has a high breakdown voltage margin can be realized. Moreover, because heat generation at the time of high-frequency operation can be suppressed due to a small loss, a semiconductor device that is unlikely to cause thermal runaway can be provided. Further, because a surge voltage can be suppressed, an increase in EMI (electromagnetic interference) noise and a reduction in reliability can be avoided.

The switching element connecting member may be a metal wire made of aluminum or other metals, may be a narrow band-shaped ribbon, and may be a lead frame made of a plate-like body. In any case, it is preferable that the switching element connecting member is arranged so as to connect the switching element and the upper conductor layer at a minimum distance. Accordingly, the inductance of the internal wiring can be reduced.

The switching element may have a form of a MOS field-effect transistor. Silicon (Si) may be the semiconductor to be applied to the switching element, but it is preferable to apply a SiC (silicon carbide) semiconductor capable of high-speed operation.

The lower board may be a board for which a metal foil (for example, a copper foil) serving as a conductor layer is formed on the surface of an insulating board. Specifically, the lower board may be a DBC (Direct Bonding Copper) board for which a copper foil is directly bonded onto a ceramic. Similarly, the upper board may be a board for which a metal foil (for example, a copper foil) serving as a conductor layer is formed on the surface of an insulating board. That is, the upper board may be a DBC board for which a copper foil is directly bonded onto a ceramic.

In one embodiment of this invention, the upper conductor layer is formed in a rectangular shape, a plurality of switching elements are facing one side of the rectangular-shaped upper conductor layer, and the switching elements include a pair of switching elements facing both end portions of the one side.

According to this configuration, because a pair of switching elements are arranged facing both end portions of one side of the upper conductor layer, the width as a whole (entire arrangement width) of switching element connecting members to connect the switching elements and the upper conductor layer can be increased (substantially maximized). Accordingly, the inductance due to the switching element connecting members can be reduced, so that the self-inductance due to the internal wiring of the semiconductor device can be further reduced.

When the switching element connecting member is made of a metal wire or a metal ribbon, it is preferable that a plurality of metal wires or metal ribbons are arranged parallel to each other. Accordingly, the entire arrangement width can be increased (maximized).

In one embodiment of this invention, the semiconductor device further includes a diode element bonded to the lower conductor layer in the element bonding area, and a diode element connecting member which connects the diode element with the upper conductor layer.

According to this configuration, a current path provided by the lower conductor layer that interconnects the terminal and the diode element and a current path that leads to the upper conductor layer via the diode element connecting member from the diode element are close to each other. Moreover, currents in reverse directions flow in the current paths. Accordingly, inductances of the current paths are at least partially cancelled out, so that a semiconductor device with a low self-inductance of internal wiring can be provided. Accordingly, a surge voltage can be suppressed, so that a semiconductor device that has a high breakdown voltage margin can be realized.

The diode element connecting member may be a metal wire made of aluminum or other metals, may be a narrow band-shaped ribbon, and may be a lead frame made of a plate-like body. In any case, it is preferable that the diode element connecting member is arranged so as to connect the diode element and the upper conductor layer at a minimum distance. Accordingly, the inductance of the internal wiring can be reduced.

In one embodiment of this invention, the upper conductor layer is formed in a rectangular shape, a plurality of diode elements are facing one side of the rectangular-shaped upper conductor layer, and the diode elements include a pair of diode elements facing both end portions of the one side.

According to this configuration, because a pair of diode elements are arranged facing both end portions of one side of the upper conductor layer, the width as a whole (entire arrangement width) of diode element connecting members to connect the diode elements and the upper conductor layer can be increased (substantially maximized). Accordingly, the inductance due to the diode element connecting members can be reduced, so that the self-inductance due to the internal wiring of the semiconductor device can be further reduced.

When the diode element connecting member is made of a metal wire or a metal ribbon, it is preferable that a plurality of metal wires or metal ribbons are arranged parallel to each other. Accordingly, the entire arrangement width can be increased (maximized).

In one embodiment of this invention, the switching element is an element using a SiC semiconductor. Due to this configuration, the switching speed of the switching element is increased, so that a switching loss can be reduced. Moreover, because the inductance of the internal wiring is low, a surge voltage can be suppressed. Consequently, a semiconductor device that is capable of high-speed switching, has a small loss accordingly, and has a high breakdown voltage margin can be realized.

In one embodiment of this invention, the switching element includes a plurality of switching elements, the element bonding area includes a first area along one side of the upper conductor layer, a second area extending from the first area in a direction to separate from the upper board, and a third area extending from the first area in a direction to separate from the first area at a position different from the second area, and at least one switching element is bonded to each of the first area, second area, and third area, and the semiconductor device further includes a first controlling conductor layer arranged facing the first area, a second controlling conductor layer arranged facing the first controlling conductor layer from an opposite side to the first area, and extending between the first controlling conductor layer and the second area and third area, and controlling wiring members for respective connections between the switching elements arranged in the first area, second area and third area and the first controlling conductor layer and second controlling conductor layer.

Due to this configuration, intersection of the controlling wiring members with each other in a plan view from a normal direction of the lower board is avoided, while the switching elements can be connected to the first and second controlling conductor layers. That is, because there is no need for a grade-separated intersection of the controlling wiring members with each other, the length of the controlling wiring members can be reduced.

A semiconductor device according to a second aspect of this invention includes a first lower board having a first lower conductor layer formed on a surface thereof, a first switching element bonded to the first lower conductor layer in a first element bonding area, a first power supply terminal bonded to the first lower conductor layer in a first terminal bonding area, a first upper board stacked on the first lower board in a first board bonding area between the first element bonding area and the first terminal bonding area, and having a first upper conductor layer on a surface thereof, a first switching element connecting member which connects the first switching element with the first upper conductor layer, a second lower board having a second lower conductor layer formed on a surface thereof, a second switching element bonded to the second lower conductor layer in a second element bonding area, an output terminal electrically connected to the first upper conductor layer, and bonded to the second lower conductor layer in a second terminal bonding area, a second upper board stacked on the second lower board in a second board bonding area between the second element bonding area and the second terminal bonding area, and having a second upper conductor layer on a surface thereof, a second switching element connecting member which connects the second switching element with the second upper conductor layer, a second power supply terminal bonded to the second upper conductor layer, and a holding base which holds the first lower board and the second lower board so that the first and second terminal bonding areas are adjacent to each other.

Due to this configuration, a power module for which the first and second switching elements are connected in series between the first and second power supply terminals, and the output terminal is connected between the first and second switching elements can be provided. In addition, a current path provided by the first lower conductor layer that interconnects the first power supply terminal and the first switching element and a current path that leads to the first upper conductor layer via the first switching element connecting member from the first switching element are close to each other. Moreover, currents in reverse directions flow in the current paths. Similarly, a current path provided by the second lower conductor layer that interconnects the output terminal and the second switching element and a current path that leads to the second power supply terminal through the second switching element connecting member and the second upper conductor layer from the second switching element are close to each other. Moreover, currents in reverse directions flow in the current paths. Accordingly, inductances of the current paths are at least partially cancelled out, so that a semiconductor device (power module) with a low self-inductance of internal wiring can be provided. For example, a power module having a self-inductance of approximately 20 nH due to internal wiring can be provided. Accordingly, even when the switching speed of the first and second switching elements is high, a surge voltage can be suppressed. Consequently, a semiconductor device (power module) that is capable of high-speed switching, has a small loss accordingly, and has a high breakdown voltage margin can be realized. Further, because the first and second lower boards are arranged adjacent to each other on the holding base, the connection wiring length therebetween is short. Also whereby, inductance can be reduced.

It is preferable that the holding base is formed of copper or other materials with high heat conductivity. Accordingly, the holding base can function as a heat radiating base to radiate heat generated by the switching element to the outside. In this case, it is preferable that a heat sink or other cooling means are mounted on the holding base (heat radiating base).

The configurations described in relation to the semiconductor device according to the first aspect can be applied also to the semiconductor device according to the second aspect.

In one embodiment of this invention, the first power supply terminal and second power supply terminal have plate-shaped parts facing each other with a predetermined interval kept therebetween. Due to this configuration, inductances of the first and second power supply terminals can be cancelled out by currents that flow through the first and second power supply terminals in reverse directions to each other. Accordingly, the self-inductance can be reduced more.

A semiconductor device according to a third aspect includes a board assembly including a semiconductor element and a board, a terminal bonded to the board assembly, and extending parallel to a principal surface of the board, and a resin case which surrounds the wiring board, and the resin case is made of an assembly including a first case component having an insertion hole through which the terminal is inserted and a second case component which is combined with the first case component. The semiconductor element may include a switching element, or may include a diode element.

According to this configuration, the terminal extends in a direction parallel to the principal surface of the board to be led out of the resin case. Accordingly, the terminal length can be reduced, which can accordingly contribute to a reduction in inductance. On the other hand, the first case component of the resin case is formed with an insertion hole. By inserting the terminal through the insertion hole, the first case component can be combined with the second case component to assemble the resin case. Therefore, the resin case can be assembled after bonding the terminal to the board assembly.

Because the terminal is led out parallel to the principal surface of the board, if the resin case is an integrally molded piece, the resin case cannot be attached after bonding of the terminal. This problem is solved by insert molding of the terminal together with the resin case, but in this case, because the resin case is exposed to a high temperature at the time of terminal bonding (for example, solder bonding), extremely high heat resistance is required.

The semiconductor device according to the third aspect provides a solution to these problems.

Attachment of the first case component to the second case component may be performed by, for example, screwing, or may be performed by adhesion.

A semiconductor device according to a fourth aspect includes a board assembly including a semiconductor element and a board, a terminal having a bonding portion bonded to the board, a first rising portion rising from the bonding portion in a direction to separate from a principal surface of the board, a transverse portion extending from an upper end of the first rising portion along the principal surface of the board, and a second rising portion rising from the transverse portion in a direction to separate from the principal surface of the board, a terminal pedestal arranged between the second rising portion and the principal surface of the board, and a terminal retainer arranged so as to make contact with or approximate the transverse portion from an opposite side to the principal surface of the board.

According to this configuration, the transverse portion is restricted from displacement to the board side by the terminal pedestal, and the second rising portion is restricted from displacement to an opposite side to the board by the terminal retainer. Accordingly, even if, for example, an external force along a normal direction of the board acts on the second rising portion, the second rising portion is not greatly displaced. Therefore, damage to the terminal and separation of bonding between the terminal and board can be inhibited or prevented, so that a semiconductor device excellent in reliability can be provided.

In one embodiment of this invention, the semiconductor device further includes a case which surrounds the board assembly, and the case includes a case plate in which an insertion hole through which the second rising portion is inserted is formed, and the case plate is provided with the terminal retainer. Due to this configuration, the case plate (for example, a top plate of the case) is provided with the terminal retainer, so that displacement or deformation of the terminal can be suppressed by the simple structure.

In one embodiment of this invention, the terminal retainer is an inner surface of the case plate facing the transverse portion, and the case plate is attached to the case so that the inner surface is arranged substantially flush with the transverse portion. According to this configuration, the inner surface of the case plate (for example, a top plate of the case) functions as a terminal retainer, so that the configuration can be further simplified. Moreover, because a small case can be realized, the semiconductor device can be downsized.

The configurations of the semiconductor device according to the third aspect and the semiconductor device according to the fourth aspect can also be combined with the configuration of the semiconductor device according to the first aspect or the semiconductor device according to the second aspect.

In one embodiment of this invention, the switching element connecting member is a switching element connecting frame made of a plate-like body. The switching element connecting frame made of a plate-like body has a sectional area larger than that of bonding wires. For this reason, the self-inductance can be reduced more than in a structure for which bonding wires are adopted as switching element connecting members.

In one embodiment of this invention, the semiconductor device further includes a switching element connecting resilient member with conductivity interposed between the switching element and the switching element connecting frame, and a pressing member which presses the switching element connecting frame to the switching element side so that the switching element connecting resilient member is pressed to the switching element side by the switching element connecting frame.

In this configuration, the switching element connecting resilient member with conductivity is interposed between the switching element and the switching element connecting frame. In addition, the switching element connecting frame is pressed by the pressing member to the switching element side so that the switching element connecting resilient member is pressed to the switching element side by the switching element connecting frame. That is, a connection between the switching element and the switching element connecting frame is achieved not by soldering but as a result of the switching element connecting resilient member being pressed to the switching element side by the switching element connecting frame. Therefore, even if a thermal expansion/contraction difference occurs between the switching element and the switching element connecting frame, the thermal expansion/contraction difference can be absorbed by deformation of the resilient member or a relative shift between the switching element connecting frame and the switching element connecting resilient member. Thus, separation of the switching element connecting frame from the switching element can be prevented. Moreover, propagation of a stress caused by a thermal expansion/contraction difference to the switching element can be prevented, and the occurrence of cracks of the switching element resulting from the propagation of stress can be prevented. Therefore, according to this configuration, the self-inductance can be reduced, and reliability against heat cycle can be improved.

In one embodiment of this invention, the diode element connecting member is a diode element connecting frame made of a plate-like body. The diode element connecting frame made of a plate-like body has a sectional area larger than that of bonding wires. For this reason, the self-inductance can be reduced more than in a structure for which bonding wires are adopted as diode element connecting members.

In one embodiment of this invention, the semiconductor device further includes a diode element connecting resilient member with conductivity interposed between the diode element and the diode element connecting frame, and a pressing member which presses the diode element connecting frame to the diode element side so that the diode element connecting resilient member is pressed to the diode element side by the diode element connecting frame.

In this configuration, a connection between the diode element and the diode element connecting frame is achieved not by soldering but as a result of the diode element connecting resilient member being pressed to the diode element side by the diode element connecting frame. Therefore, even if a thermal expansion/contraction difference occurs between the diode element and the diode element connecting frame, the thermal expansion/contraction difference can be absorbed by deformation of the resilient member or a relative shift between the diode element connecting frame and the diode element connecting resilient member. Thus, separation of the diode element connecting frame from the diode element can be prevented. Moreover, propagation of a stress caused by a thermal expansion/contraction difference to the diode element can be prevented, and the occurrence of cracks of the diode element resulting from the propagation of stress can be prevented. Therefore, according to this configuration, the self-inductance can be reduced, and reliability against heat cycle can be improved.

In one embodiment of this invention, the switching element connecting member and the diode element connecting member are a single element connecting frame made of a plate-like body. In this configuration, the self-inductance can be reduced more than in a structure for which bonding wires are adopted as switching element connecting members and diode element connecting members. Moreover, the switching element and diode element can be connected to the upper conductor layer by the same element connecting frame, so that the number of components can be reduced, and a semiconductor device is easily manufactured.

In one embodiment of this invention, the semiconductor device further includes a switching element connecting resilient member with conductivity interposed between the switching element and the element connecting frame, a diode element connecting resilient member with conductivity interposed between the diode element and the element connecting frame, and a pressing member which presses the element connecting frame to the switching element side and the diode element side so that the switching element connecting resilient member is pressed to the switching element side and the diode element connecting resilient member is pressed to the diode element side by the element connecting frame.

In this configuration, a connection between the switching element and diode element and the element connecting frame is achieved not by soldering but as a result of the switching element connecting resilient member and the diode element connecting resilient member being pressed by the element connecting frame to the switching element side and the diode element side, respectively. Therefore, even if a thermal expansion/contraction difference occurs between the switching element and diode element and the element connecting frame, the thermal expansion/contraction difference can be absorbed by deformation of the resilient member or a relative shift between the element connecting frame and the resilient member. Thus, separation of the element connecting frame from the switching element or diode element can be prevented. Moreover, propagation of a stress caused by a thermal expansion/contraction difference to the switching element and diode element can be prevented, and the occurrence of cracks of the switching element and diode element resulting from the propagation of stress can be prevented. Therefore, according to this configuration, the self-inductance can be reduced, and reliability against heat cycle can be improved.

The above and other objects, features, and advantages of the present invention will become apparent through the following description of embodiments with reference to the accompanying drawings.

BRIEF DESCRIPTION OF DRAWINGS

FIG. 5A is an illustrative sectional view for explaining a current path in an upper arm circuit (first board assembly), and FIG. 5B is an illustrative sectional view for explaining a current path in a lower arm circuit (second board assembly).

FIG. 6B is an illustrative side view for explaining another example of a holding structure of gate terminals and source sense terminals.

FIG. 7B is a view for explaining an effect of reducing inductance by an increase in the entire arrangement width of wires.

DESCRIPTION OF EMBODIMENTS

Hereinafter, embodiments of this invention will be described in detail with reference to the accompanying drawings.

[First Embodiment]

Figure 1:
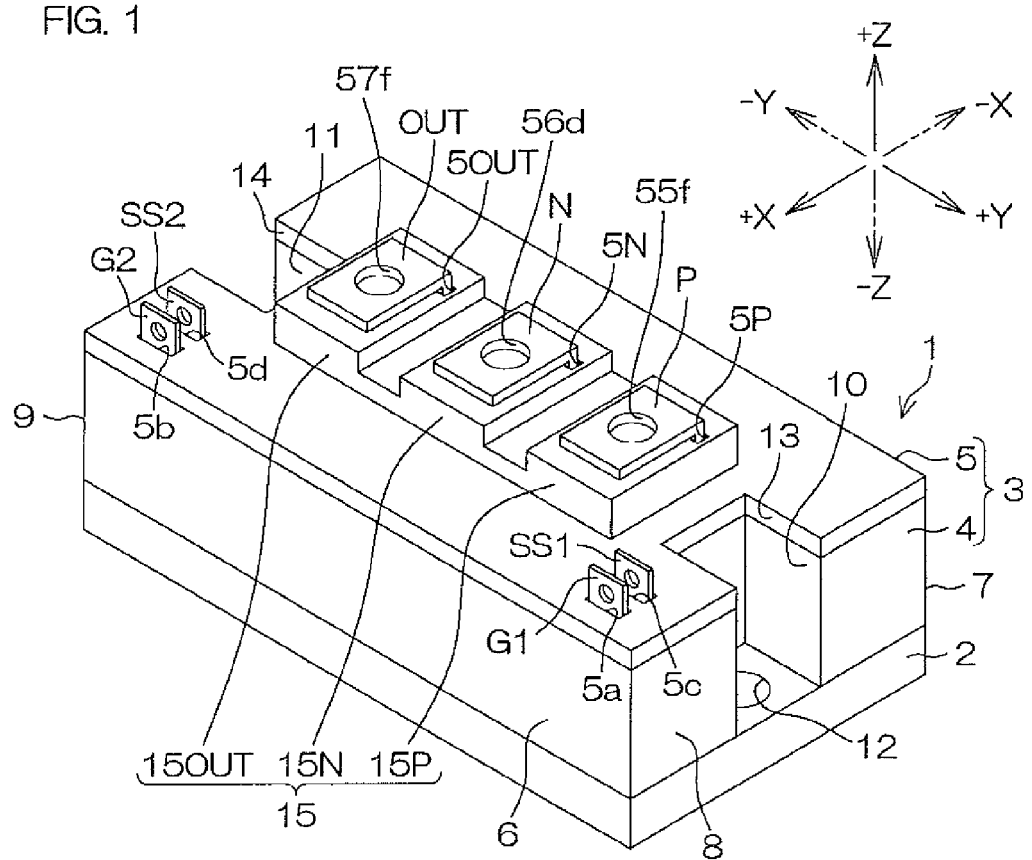
FIG. 1 is a perspective view showing an external appearance of a power module according to a first embodiment of this invention.

FIG. 1 is a perspective view showing an external appearance of a power module according to a first embodiment of this invention. The power module 1 includes a heat radiating base 2, a case 3, a first power supply terminal P, a second power supply terminal N, and an output terminal OUT. For convenience of description, in the following, the +X direction, −X-direction, +Y direction, −Y direction, +Z direction, and −Z direction shown in FIG. 1 may be used. The +X direction and the −X direction are two directions along a short side of the heat radiating base 2 having a rectangular shape in a plan view, and these directions are simply called an "X direction" when collectively mentioned. The +Y direction and the −Y direction are two directions along a long side of the heat radiating base 2, and these directions are simply called a "Y direction" when collectively mentioned. The +Z direction and the −Z direction are two directions along a normal of the heat radiating base 2, and these directions are simply called a "Z direction" when collectively mentioned. When the heat radiating base 2 is placed on a horizontal plane, the X direction and the Y direction serve as two horizontal directions (first horizontal direction and second horizontal direction) along two horizontal straight lines (X-axis and Y-axis) perpendicular to each other, and the Z direction serves as a vertical direction (height direction) along a vertical straight line (Z-axis).

The heat radiating base 2 is a plate-like body with a uniform thickness having a rectangular shape in a plan view, and is made of a material with a high heat conductivity. More specifically, the heat radiating base 2 may be a copper base made of copper. The copper base may have a nickel plating layer formed on its surface. At a principal surface of a −Z direction side of the heat radiating base 2, a heat sink or other cooling means are mounted, as necessary.

The case 3 is formed in a substantially rectangular parallelepiped shape, and is formed of a resin material. Particularly, it is preferable to use a heat resistant resin such as PPS (polyphenylene sulfide). The case 3 shows a rectangular shape substantially in alignment with the heat radiating base 2 in a plan view, and includes a frame portion 4 fixed to one surface (a +Z direction-side surface) of the heat radiating base 2 and a top plate 5 fixed to the frame portion 4. The top plate 5 blocks one side (a +Z direction side) of the frame portion 4, and faces the principal surface of the heat radiating base 2 that blocks the other side (a −Z direction side) of the frame portion 4. Accordingly, the heat radiating base 2, the frame portion 4, and the top plate 5 define a circuit housing space inside of the case 3. The frame portion 4 includes a pair of side plates 6, 7 and a pair of end plates 8, 9 that join both ends of the paired side plates 6, 7, respectively. The end plates 8, 9, in the vicinity of their respective intermediate portions, have recess portions 10, 11 that are recessed inward. In the recess portion 10, 11, the +Z direction-side surface of the heat radiating base 2 is exposed. In the exposed region, a mounting hole 12 that penetrates through the heat radiating base 2 in its thickness direction is formed. The power module 1 is, by a bolt (not shown) inserted through the mounting hole 12, fixed to a predetermined fixing position of a mounting target. The foregoing cooling means such as a heat sink may be mounted by using the mounting hole 12. Recess portions 13, 14 are formed in the vicinity of intermediate portions of a pair of end sides of the top plate 5 so as to be in alignment with the recess portions 10, 11 of the endplates 8, 9.

On a +Z direction-side surface (outer surface) of the top plate 5, a terminal block 15 is formed. The terminal block 15 is arranged between the recess portions 13, 14, and includes three terminal blocks 15P, 15N, and 15OUT aligned along the longitudinal direction (Y direction) of the top plate 5. The three terminal blocks 15 are each formed in a rectangular shape in a plan view, and provided with a hexagonal cylinder-shaped recess portion (not shown) opened in substantially the center. A nut (not shown) is embedded and fixed into the hexagonal cylinder-shaped recess portion.

On a surface (+Z direction-side surface) of the terminal block 15P arranged at one end, the first power supply terminal P is arranged. Moreover, on a surface (+Z direction-side surface) of the terminal block 15N arranged at the middle, the second power supply terminal N is arranged. Further, on a surface (+Z direction-side surface) of the terminal block 15OUT arranged at the other end, the output terminal OUT is arranged.

The first power supply terminal P, the second power supply terminal N, and the output terminal OUT are each prepared by cutting out a metal plate (for example, a copper plate applied with nickel plating) into a predetermined shape, and applying thereto a bending process, and is electrically connected to a circuit inside the case 3. Front end portions of the first power supply terminal P, the second power supply terminal N, and the output terminal OUT are led out to the terminal blocks 15P, 15N, and 15OUT, respectively. The front end portions of the first power supply terminal P, the second power supply terminal N, and the output terminal OUT are molded in band shapes, and molded so as to extend along the surfaces of the terminal blocks 15P, 15N, and 15OUT, respectively. The first power supply terminal P, the second power supply terminal N, and the output terminal OUT have insertion holes 55f, 56d, 57f in their respective front end portions. By using bolts that are inserted through the insertion holes 55f, 56d, 57f, and fitted by screwing into the nuts described above, the terminals P, N, OUT can be connected to a bus bar provided on the mounting target side of the power module 1.

Figure 2:
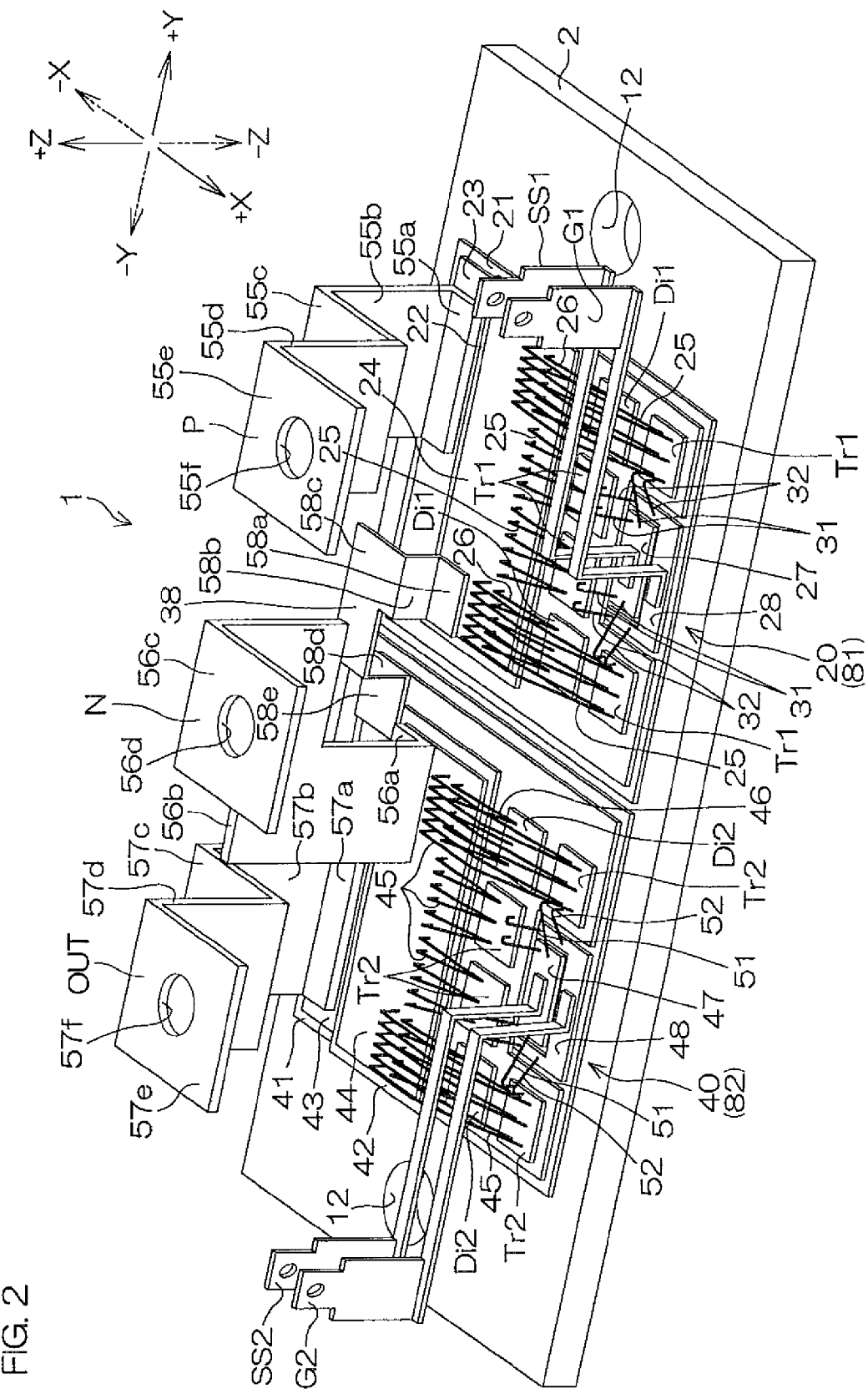
FIG. 2 is an illustrative perspective view for explaining a configuration of a power module circuit housed inside a case.

FIG. 2 is an illustrative perspective view for explaining a configuration of a power module circuit housed inside of the case 3. On the heat radiating base 2, a first board assembly 20 that forms an upper arm (high-side) circuit 81 and a second board assembly 40 that forms a lower arm (low-side) circuit 82 are arranged side by side in the Y direction. The first power supply terminal P is connected to the first board assembly 20, and the second power supply terminal N is connected to the second board assembly 40. The output terminal OUT is electrically connected to both of the first and second board assemblies 20, 40.

The first board assembly 20 includes a first lower board 21, a plurality of first switching elements Tr1, a plurality of first diode elements Di1, and a first upper board 22.

The first lower board 21 is formed in a rectangular shape in a plan view, and is, in a position that its four sides are parallel to the four sides of the heat radiating base 2, respectively, bonded to one surface (+Z direction-side surface) of the heat radiating base 2. On a surface (a +Z direction-side surface) of the first lower board 21 of an opposite side to the heat radiating base 2, a first lower conductor layer 23 is formed. The first lower board 21 is formed of, for example, a board (DBC: Direct Bonding Copper) for which a copper foil is directly bonded onto a ceramic. The first lower conductor layer 23 can be formed by the copper foil. The first upper board 22 is bonded to the first lower conductor layer 23, whereby the first upper board 22 is stacked on the first lower board 21. Moreover, to the first lower conductor layer 23, the first switching elements Tr1 and the first diode elements Di1 are bonded. Further, to the first lower conductor layer 23, a base end portion of the first power supply terminal P is bonded.

The first upper board 22 has a first upper conductor layer 24 on a surface (+Z direction-side surface) of an opposite side to the first lower board 21. The first upper board 22 is formed of, for example, a board (DBC) for which a copper foil is directly bonded onto a ceramic. The first upper conductor layer 24 can be formed by the copper foil. The first upper conductor layer 24 and the first switching elements Tr1 and the first diode elements Di1 are connected by a plurality of wires (for example, aluminum wires) 25, 26, respectively. That is, the first switching elements Tr1 and the first diode elements Di1 are connected in parallel between the first lower conductor layer 23 and the first upper conductor layer 24.

On the surface (+Z direction-side surface) of the first lower board 21, a pair of controlling conductor layers 27, 28 are formed insulated from the first lower conductor layer 23. To the controlling conductor layers 27, 28, a source sense terminal SS1 and a gate terminal G1 are bonded, respectively. The controlling conductor layers 27, 28 and the first switching elements Tr1 are connected therebetween by wires 31, 32, respectively.

The second board assembly 40 includes a second lower board 41, a plurality of second switching elements Tr2, a plurality of second diode elements Di2, and a second upper board 42.

The second lower board 41 is formed in a rectangular shape in a plan view, and is, in a position that its four sides are parallel to the four sides of the heat radiating base 2, respectively, bonded to one surface (+Z direction-side surface) of the heat radiating base 2. Moreover, the second lower board 41 is arranged close to a −Y direction side of the first lower board 21. On a surface (+Z direction-side surface) of the second lower board 41 of an opposite side to the heat radiating base 2, a second lower conductor layer 43 is formed. The second lower board 41 is formed of, for example, a board (DBC) for which a copper foil is directly bonded onto a ceramic. The second lower conductor layer 43 can be formed by the copper foil. The second upper board 42 is bonded to the second lower conductor layer 43, whereby the second upper board 42 is stacked on the second lower board 41. Moreover, to the second lower conductor layer 43, the second switching elements Tr2 and the second diode elements Di2 are bonded. Further, to the second lower conductor layer 43, a base end portion of the output terminal OUT is bonded.

The second upper board 42 has a second upper conductor layer 44 on a surface (+Z direction-side surface) of an opposite side to the second lower board 41. The second upper board 42 is formed of, for example, a board (DBC) for which a copper foil is directly bonded onto a ceramic. The second upper conductor layer 44 can be formed by the copper foil. The second upper conductor layer 44 and the second switching elements Tr2 and the second diode elements Di2 are connected by a plurality of wires (for example, aluminum wires) 45, 46, respectively. That is, the second switching elements Tr2 and the second diode elements Di2 are connected in parallel between the second lower conductor layer 43 and the second upper conductor layer 44.

On the surface (+Z direction-side surface) of the second lower board 41, further, a pair of controlling conductor layers 47, 48 are formed insulated from the first lower conductor layer 43. To the controlling conductor layers 47, 48, a source sense terminal SS2 and a gate terminal G2 are bonded, respectively. The controlling conductor layers 47, 48 and the second switching elements Tr2 are connected therebetween by wires 51, 52.

The first board assembly 20 and the second board assembly 40 are connected by a connecting member 38 that is prepared by applying a cut-out and bending process to a metal plate. The connecting member 38 is formed in a band shape, its one end is bonded to the first upper conductor layer 24, and its other end is bonded to the second lower conductor layer 43.

Figure 3:
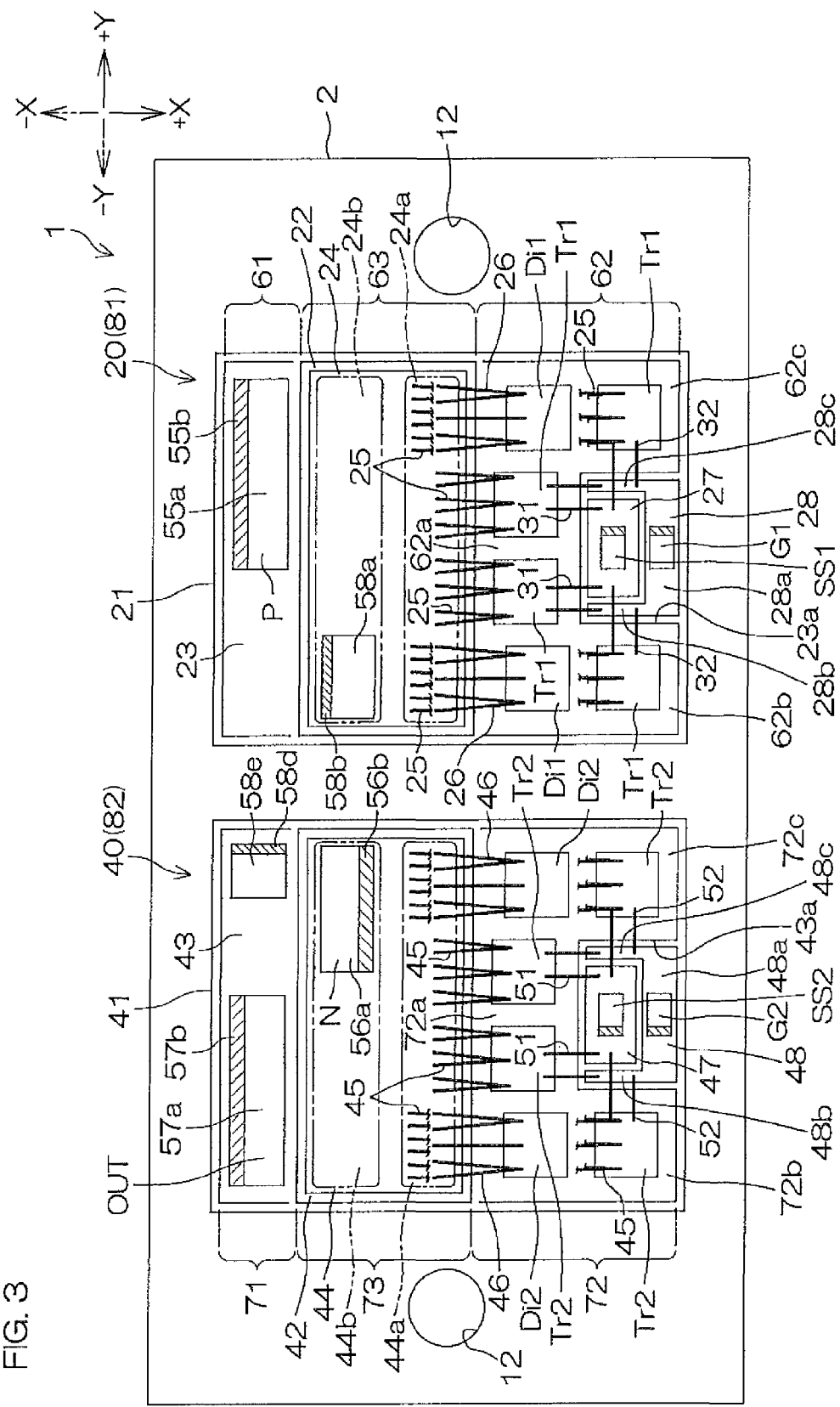
FIG. 3 is an illustrative plan view for explaining an arrangement of components of first and second board assemblies.

FIG. 3 is an illustrative plan view for explaining an arrangement of components of the first and second board assemblies 20, 40.

First, a configuration of the first board assembly 20 will be explained. In the first lower conductor layer 23 formed on the first lower board 21, a first terminal bonding area 61 is arranged at a −X direction-side marginal portion. The base end portion of the first power supply terminal P is bonded to the first terminal bonding area 61. Moreover, in the first lower conductor layer 23, a first element bonding area 62 is arranged at a +X direction-side marginal portion. To the first element bonding area 62, the first switching elements Tr1 and the first diode elements Di1 are bonded. Between the first terminal bonding area 61 and the first element bonding area 62, a first board bonding area 63 is arranged. In the first board bonding area 63, the first upper board 22 is bonded to the first lower conductor layer 23.

The first lower conductor layer 23 is formed so as to cover substantially the entire area of the surface (+Z direction-side surface) of the first lower board 21, and is formed as a roughly rectangular region. The first lower conductor layer 23 has a rectangular cut-away 23a at the marginal portion on the first element bonding area 62 side. The cut-away 23a is formed in a shape recessed inward (−X direction) from the vicinity of the middle of one side (a side at the +X direction side) of the first lower conductor layer 23. The controlling conductor layers 27, 28 are arranged in the cut-away 23a.

The first element bonding area 62 has a first area 62a facing one side (a side at the +X direction side) of the first upper board 22 and a pair of second areas 62b, 62c extending parallel to each other from both end portions (both end portions in the Y direction) of the first area 62a in a direction (+X direction) to separate from the first upper board 22. In the vicinity of both end portions (both end portions in the Y direction) of the first area 62a, a pair of first diode elements Di1 are arranged, respectively. In the vicinity of the middle sandwiched by the paired first diode elements Di1, a pair of first switching elements Tr1 are arranged side by side in the Y direction. That is, in the first area 62a, a pair of first diode elements Di1 and a pair of first switching elements Tr1 are arranged aligned in the Y direction, and these are facing one side of the first upper board 22. In the pair of second areas 62b, 62c, first switching elements Tr1 are arranged one each. The pair of first switching elements Tr1 are, with respect to the pair of first diode elements Di1, arranged at the opposite side (+X direction side) to the first upper board 22, and are, in terms of the direction (X direction) perpendicular to one side (a side at the +X direction side) of the first upper board 22, positionally in alignment with the pair of first diode elements Di1. That is, the pair of first diode elements Di1 and the pair of first switching elements Tr1 that are positionally in alignment with the first diode elements Di1, respectively, in terms of the X direction are facing both end portions of one side of the first upper board 22 (in other words, one side of the first upper conductor layer 24. A side at the +X direction side).

The first upper conductor layer 24 is formed in a rectangular shape over substantially the entire area of the surface (+Z direction-side surface) of the first upper board 22. In the first upper conductor layer 24, an area facing the first element bonding area 62 is a wire bonding area 24a to which the wires 25, 26 are bonded, and an area facing the first terminal bonding area 61 is an assembly interconnection area 24b for a connection with the second board assembly 40. To the wire bonding area 24a, one-side ends of the wires 25, 26 are bonded.

To a bonding pad (not shown) formed on an upper surface (+Z direction-side surface) of each first diode element Di1, one-side ends of a plurality of (for example, five) wires 26 are bonded. The other-side ends of the wires 26 are bonded to the first upper conductor layer 24 at a plurality of positions aligned in the Y direction along one side (a side at the +X direction side) of the first upper conductor layer 24. The wires 26 form loops along the direction (X direction) perpendicular to one side (a side at the +X direction side) of the first upper conductor layer 24 so as not to contact each other and so as to have the minimum lengths. Therefore, the wires 26, along the X direction, pass through a path above the first lower conductor layer 23 (a path separating in the +Z direction from the first lower conductor layer 23) to connect the first diode elements Di1 with the first upper conductor layer 24.

Similarly, to a bonding pad (not shown) formed on an upper surface (+Z direction-side surface) of each first switching element Tr1, one-side ends of a plurality of (for example, six) wires 25 are bonded. The other-side ends of the wires 25 are bonded to the first upper conductor layer 24 at a plurality of positions aligned in the Y direction along one side (a side at the +X direction side) of the first upper conductor layer 24. The wires 25 form loops along the direction (X direction) perpendicular to one side (a side at the +X direction side) of the first upper conductor layer 24 so as not to contact each other and so as to have the minimum lengths. Therefore, the wires 25, along the X direction, pass through a path above the first lower conductor layer 23 (a path separating in the +Z direction from the first lower conductor layer 23) to connect the first switching elements Tr1 with the first upper conductor layer 24.

However, the wires 25 bonded to the pair of first switching elements Tr1 arranged in the second areas 62b, 62c of the first element bonding area 62, respectively, pass through a path above the wires 26 corresponding to the first diode elements Di1 arranged in alignment in the X direction (a path separating in the +Z direction) so as not to contact with those wires 26. Further, those wires 25 are bonded to the first upper conductor layer 24 at positions further on the first terminal bonding area 61 side (−X direction side) than those of the wires 26. In FIG. 3, for the sake of clarification, the wires 25 of the first switching elements Tr1 arranged in the second areas 62b, 62c are shown with their halfway portions omitted.

As described above, the wires 26 to connect the first diode elements Di1 to the first upper conductor layer 24 are arranged so as to have the minimum lengths, respectively. Further, the arrangement width of the wires 26 as a whole (the width in the Y direction. Hereinafter, referred to as an "entire arrangement width.") covers substantially the entire width of one side (a side at the +X direction side) of the first upper conductor layer 24. Similarly, as described above, the wires 25 to connect the first switching elements Tr1 to the first upper conductor layer 24 are arranged so as to have the minimum lengths, respectively. Further, the arrangement width of the wires 25 as a whole (the width in the Y direction. Entire arrangement width) covers substantially the entire width of one side (a side at the +X direction side) of the first upper conductor layer 24.

The controlling conductor layer 27 corresponding to the source sense terminal SS1 has a rectangular shape facing the first area 62a of the first element bonding area 62, and extending in the direction (Y direction) parallel to one side (a side at the +X direction side) of the first upper conductor layer 24. In the vicinity of the center of the controlling conductor layer 27, the source sense terminal SS1 is bonded.

The controlling conductor layer 28 corresponding to the gate terminal G1 is, in a plan view in the −Z direction, formed in a substantially U-shape holding the controlling conductor layer 27 inside. That is, the controlling conductor layer 28 has a central portion 28a that faces the controlling conductor layer 27 from the opposite side (+X direction side) to the first area 62a of the first element bonding area 62 and a pair of arm portions 28b, 28c that extend from both end portions of the central portion 28a in the −X direction toward the first area 62a. The central portion 28a extends in the Y direction, and in the vicinity of its center, the gate terminal G1 is bonded. The pair of arm portions 28b, 28c pass between the controlling conductor layer 27 and the second area 62b and the third area 62c of the first element bonding area 62, respectively, and reach the neighborhood of the first area 62a.

The first switching elements Tr1 are, via the wires 31, respectively, connected to the controlling conductor layer 27 for the source sense terminal SS1. The wires 31 corresponding to, out of the first switching elements Tr1, the pair of first switching elements Tr1 arranged in the first area 62a are bonded at one-side ends to the first switching elements Tr1, and bonded at the other-side ends to the controlling conductor layer 27 in the neighborhood of one side (a side at the −X direction side) facing the first area 62a. The wires 31 form loops along the X direction so as to have the minimum lengths. On the other hand, the wires 31 corresponding to, out of the first switching elements Tr1, the pair of first switching elements Tr1 arranged in the second areas 62b, 62c pass through a path above the arm portions 28b, 28c of the controlling conductor layer 28 (a path separating in the +Z direction from the controlling conductor layer 28). The wires 31 are bonded at one-side ends to the first switching elements Tr1, and bonded at the other-side ends to the controlling conductor layer 27 in the neighborhood of sides (a side at the −Y direction side and a side at the +Y direction side) facing the second areas 62b, 62c, respectively. The wires 31 form loops along the Y direction so as to have the minimum lengths.

Further, the first switching elements Tr1 are, via the wires 32, respectively, connected to the controlling conductor layer 28 for the gate terminal G1. The wires 32 corresponding to, out of the first switching elements Tr1, the pair of first switching elements Tr1 arranged in the first area 62a are bonded at one-side ends to the first switching elements Tr1, and bonded at the other-side ends to front end portions of the pair of arm portions 28b, 28c of the controlling conductor layer 28, respectively. The bonding positions are located further on the first upper board 22 side (−X direction side) than the path of the wires 31 led out of the pair of first switching elements Tr1 arranged in the second areas 62b, 62c. Therefore, the wires 31, 32 do not intersect each other in a plan view. The wires 32 form loops along the X direction so as to have the minimum lengths. On the other hand, the wires 32 corresponding to, out of the first switching elements Tr1, the pair of first switching elements Tr1 arranged in the second areas 62b, 62c are connected to base end portions of the arm portions 28b, 28c of the controlling conductor layer 28, respectively. The wires 32 are bonded at one-side ends to the first switching elements Tr1, and bonded at the other-side ends to the base end portions (+X direction-side end portions) of the arm portions 28b, 28c of the controlling conductor layer 28. The wires 32 form loops along the Y direction so as to have the minimum lengths.

Next, a configuration of the second board assembly 40 will be explained. In the second lower conductor layer 43 formed on the second lower board 41, a second terminal bonding area 71 is arranged at a −X direction-side marginal portion. The base end portion of the output terminal OUT is bonded to the second terminal bonding area 71. Moreover, in the second lower conductor layer 43, a second element bonding area 72 is arranged at a +X direction-side marginal portion. To the second element bonding area 72, the second switching elements Tr2 and the second diode elements Di2 are bonded. Between the second terminal bonding area 71 and the second element bonding area 72, a second board bonding area 73 is arranged. In the second board bonding area 73, the second upper board 42 is bonded to the second lower conductor layer 43.

The second lower conductor layer 43 is formed so as to cover substantially the entire area of the surface (+Z direction-side surface) of the second lower board 41, and is formed as a roughly rectangular region. The second lower conductor layer 43 has a rectangular cut-away 43a at the marginal portion on the second element bonding area 72 side. The cut-away 43a is formed in a shape recessed inward (−X direction) from the vicinity of the middle of one side (a side at the +X direction side) of the second lower conductor layer 43. The controlling conductor layers 47, 48 are arranged in the cut-away 43a.

The second element bonding area 72 has a first area 72a facing one side (a side at the +X direction side) of the second upper board 42 and a pair of second areas 72b, 72c extending parallel to each other from both end portions (both end portions in the Y direction) of the first area 72a in a direction (+X direction) to separate from the second upper board 42. In the vicinity of both end portions (both end portions in the Y direction) of the first area 72a, a pair of second diode elements Di2 are arranged, respectively. In the vicinity of the middle sandwiched by the paired second diode elements Di2, a pair of second switching elements Tr2 are arranged side by side in the Y direction. That is, in the first area 72a, a pair of second diode elements Di2 and a pair of second switching elements Tr2 are arranged aligned in the Y direction, and these are facing one side of the second upper board 42. In the pair of second areas 72b, 72c, second switching elements Tr2 are arranged one each. The pair of second switching elements Tr2 are, with respect to the pair of second diode elements Di2, arranged at the opposite side (+X direction side) to the second upper board 42, and are, in terms of the direction (X direction) perpendicular to one side (a side at the +X direction side) of the second upper board 42, positionally in alignment with the pair of second diode elements Di2. That is, the pair of second diode elements Di2 and the pair of second switching elements Tr2 that are positionally in alignment with the second diode elements Di2, respectively, in terms of the X direction are facing both end portions of one side of the second upper board 42 (in other words, one side of the second upper conductor layer 44. A side at the +X direction side).

The second upper conductor layer 44 is formed in a rectangular shape over substantially the entire area of the surface (+Z direction-side surface) of the second upper board 42. In the second upper conductor layer 44, an area facing the second element bonding area 72 is a wire bonding area 44a to which the wires 45, 46 are bonded, and an area facing the second terminal bonding area 71 is a terminal bonding area 44b to which the second power supply terminal N is bonded. To the wire bonding area 44a, one-side ends of the wires 45, 46 are bonded.

To a bonding pad (not shown) formed on an upper surface (+Z direction-side surface) of each second diode element Di2, one-side ends of a plurality of (for example, five) wires 46 are bonded. The other-side ends of the wires 46 are bonded to the second upper conductor layer 44 at a plurality of positions aligned in the Y direction along one side (a side at the +X direction side) of the second upper conductor layer 44. The wires 46 form loops along the direction (X direction) perpendicular to one side (a side at the +X direction side) of the second upper conductor layer 44 so as not to contact each other and so as to have the minimum lengths. Therefore, the wires 46, along the X direction, pass through a path above the second lower conductor layer 43 (a path separating in the +Z direction from the second lower conductor layer 43) to connect the second diode elements Di2 with the second upper conductor layer 44.

Similarly, to a bonding pad (not shown) formed on an upper surface (+Z direction-side surface) of each second switching element Tr2, one-side ends of a plurality of (for example, six) wires 45 are bonded. The other-side ends of the wires 45 are bonded to the second upper conductor layer 44 at a plurality of positions aligned in the Y direction along one side (a side at the +X direction side) of the second upper conductor layer 44. The wires 45 form loops along the direction (X direction) perpendicular to one side (a side at the +X direction side) of the second upper conductor layer 44 so as not to contact each other and so as to have the minimum lengths. Therefore, the wires 45, along the X direction, pass through a path above the second lower conductor layer 43 (a path separating in the +Z direction from the second lower conductor layer 43) to connect the second switching elements Tr2 with the second upper conductor layer 44.

However, the wires 45 bonded to the pair of second switching elements Tr2 arranged in the second areas 72b, 72c of the second element bonding area 72, respectively, pass through a path above the wires 46 corresponding to the second diode elements Di2 arranged in alignment in the X direction (a path separating in the +Z direction) so as not to contact with those wires 46. Further, those wires 45 are bonded to the second upper conductor layer 44 at positions further on the second terminal bonding area 71 side (−X direction side) than those of the wires 46. In FIG. 3, for the sake of clarification, the wires 45 of the second switching elements Tr2 arranged in the second areas 72b, 72c are shown with their halfway portions omitted.

As described above, the wires 46 to connect the second diode elements Di2 to the second upper conductor layer 44 are arranged so as to have the minimum lengths, respectively. Further, the arrangement width of the wires 46 as a whole (the width in the Y direction. Hereinafter, referred to as an "entire arrangement width.") covers substantially the entire width of one side (a side at the +X direction side) of the second upper conductor layer 44. Similarly, as described above, the wires 45 to connect the second switching elements Tr2 to the second upper conductor layer 44 are arranged so as to have the minimum lengths, respectively. Further, the arrangement width of the wires 45 as a whole (the width in the Y direction. Entire arrangement width) covers substantially the entire width of one side (a side at the +X direction side) of the second upper conductor layer 44.

The controlling conductor layer 47 corresponding to the source sense terminal SS2 has a rectangular shape facing the first area 72a of the second element bonding area 72, and extending in the direction (Y direction) parallel to one side (a side at the +X direction side) of the second upper conductor layer 44. In the vicinity of the center of the controlling conductor layer 47, the source sense terminal SS2 is bonded.

The controlling conductor layer 48 corresponding to the gate terminal G2 is, in a plan view in the −Z direction, formed in a substantially U-shape holding the controlling conductor layer 47 inside. That is, the controlling conductor layer 48 has a central portion 48a that faces the controlling conductor layer 47 from the opposite side (+X direction side) to the first area 72a of the second element bonding area 72 and a pair of arm portions 48b, 48c that extend from both end portions of the central portion 48a in the −X direction toward the first area 72a. The central portion 48a extends in the Y direction, and in the vicinity of its center, the gate terminal G2 is bonded. The pair of arm portions 48b, 48c pass between the controlling conductor layer 47 and the second area 72b and the third area 72c of the second element bonding area 72, respectively, and reach the neighborhood of the first area 72a.

The second switching elements Tr2 are, via the wires 51, respectively, connected to the controlling conductor layer 47 for the source sense terminal SS2. The wires 51 corresponding to, out of the second switching elements Tr2, the pair of second switching elements Tr2 arranged in the first area 72a are bonded at one-side ends to the second switching elements Tr2, and bonded at the other-side ends to the controlling conductor layer 47 in the neighborhood of one side (a side at the −X direction side) facing the first area 72a. The wires 51 form loops along the X direction so as to have the minimum lengths. On the other hand, the wires 51 corresponding to, out of the second switching elements Tr2, the pair of second switching elements Tr2 arranged in the second areas 72b, 72c pass through a path above the arm portions 48b, 48c of the controlling conductor layer 48 (a path separating in the +Z direction from the controlling conductor layer 48). The wires 51 are bonded at one-side ends to the second switching elements Tr2, and bonded at the other-side ends to the controlling conductor layer 47 in the neighborhood of sides (a side at the −Y direction side and a side at the +Y direction side) facing the second areas 72b, 72c, respectively. The wires 51 form loops along the Y direction so as to have the minimum lengths.

Further, the second switching elements Tr2 are, via the wires 52, respectively, connected to the controlling conductor layer 48 for the gate terminal G2. The wires 52 corresponding to, out of the second switching elements Tr2, the pair of second switching elements Tr2 arranged in the first area 72a are bonded at one-side ends to the second switching elements Tr2, and bonded at the other-side ends to front end portions of the pair of arm portions 48b, 48c of the controlling conductor layer 48, respectively. The bonding positions are located further on the second upper board 42 side (−X direction side) than the path of the wires 51 led out of the pair of second switching elements Tr2 arranged in the second areas 72b, 72c. Therefore, the wires 51, 52 do not intersect each other in a plan view. The wires 52 form loops along the X direction so as to have the minimum lengths. On the other hand, the wires 52 corresponding to, out of the second switching elements Tr2, the pair of second switching elements Tr2 arranged in the second areas 72b, 72c are connected to base end portions of the arm portions 48b, 48c of the controlling conductor layer 48, respectively. The wires 52 are bonded at one-side ends to the second switching elements Tr2, and bonded at the other-side ends to the base end portions (+X direction-side end portions) of the arm portions 48b, 48c of the controlling conductor layer 48. The wires 52 form loops along the Y direction so as to have the minimum lengths.

Next, referring to FIG. 2 and FIG. 3, description will be given of the structure of the first power supply terminal P, the second power supply terminal N, the output terminal OUT, and the connecting member 38 will be described.

The first power supply terminal P is formed of a conductive plate-like body (for example, a copper plate applied with nickel plating). The first power supply terminal P has a bonding portion 55a bonded to the first lower conductor layer 23, a first rising portion 55b joined to the bonding portion 55a, a transverse portion 55c joined to the first rising portion 55b, a second rising portion 55d joined to the transverse portion 55c, and a connection end 55e joined to the second rising portion 55d.

The bonding portion 55a is bonded to a region closer to the +Y direction of the first terminal bonding area 61, and is formed in a rectangular shape extending in the Y direction in a plan view. The bonding portion 55a is formed of a plate-like body parallel to the first lower conductor layer 23, and is joined to the first lower conductor layer 23. The first rising portion 55b rises in the +Z direction from a −X direction-side edge portion of the bonding portion 55a. The first rising portion 55b is formed of a band-shaped plate-like body along a plane (a Y-Z plane) parallel to the Y direction and the Z direction, and is formed with substantially the same width as that of the bonding portion 55a. The transverse portion 55c is joined to a +Z direction-side edge portion of the first rising portion 55b, and extends in the +X direction. The transverse portion 55c is formed of a band-shaped plate-like body parallel to the principal surface of the heat radiating base 2, and is formed with substantially the same width as that of the first rising portion 55b. The second rising portion 55d rises in the +Z direction from a +X direction-side edge portion of the transverse portion 55c, and penetrates through the top plate 5 (refer to FIG. 1) of the case 3. The second rising portion 55d is formed of a band-shaped plate-like body along a plane (a Y-Z plane) parallel to the Y direction and the Z direction, and has substantially the same width as that of the transverse portion 55c. The connection end 55e extends in the +X direction from a +Z direction-side end edge of the second rising portion 55d, and is along an upper surface of the terminal block 15P (refer to FIG. 1). The connection end 55e is formed of a band-shaped plate-like body along the principal surface of the heat radiating base 2, has substantially the same width as that of the second rising portion 55d, and has an insertion hole 55f for connection in its substantially central portion. When assembled, the connection end 55e is in a standing position (a position along a Y-Z plane) extended from the second rising portion 55d. After the connection end 55e in a standing position is inserted through a slit-shaped insertion hole 5P (refer to FIG. 1) formed in the top plate 5, the connection end 55e is bent down, so that the connection end 55e is brought into a prone position along an X-Y plane.

The second power supply terminal N is formed of a conductive plate-like body (for example, a copperplate applied with nickel plating). The second power supply terminal N has a bonding portion 56a, a rising portion 56b, and a connection end 56c. The bonding portion 56a is, in the terminal bonding area 44b of the second upper conductor layer 44, bonded to a region closer to the +Y direction. The bonding portion 56a is formed in a rectangular shape extending in the Y direction, and is formed of a band-shaped plate-like body. The rising portion 56b is joined to a +X direction-side edge portion of the bonding portion 56a. The rising portion 56b is formed of a plate-like body parallel to a plane (a Y-Z plane) including the Y direction and the Z direction, and is formed in a substantially crank shape when viewed from a normal direction (X direction) of the plate-like body. That is, the rising portion 56b rises in the +Z direction, further extends transversely in the +Y direction, and then again rises in the +Z direction. The connection end 56c is joined to a +Z direction-side edge portion of the rising portion 56b. The connection end 56c extends in the +X direction, and is along an upper surface of the terminal block 15N (refer to FIG. 1). The connection end 56c is formed of a band-shaped plate-like body along the principal surface of the heat radiating base 2, and has an insertion hole 56d for connection in its substantially central portion. When assembled, the connection end 56c is in a standing position (a position along a Y-Z plane) extended from the rising portion 56b. After the connection end 56c in a standing position is inserted through a slit-shaped insertion hole 5N (refer to FIG. 1) formed in the top plate 5, the connection end 56c is bent down, so that the connection end 56c is brought into a prone position along an X-Y plane.

The output terminal OUT is formed of a conductive plate-like body (for example, a copper plate applied with nickel plating). The output terminal OUT has a bonding portion 57a bonded to the second lower conductor layer 43, a first rising portion 57b joined to the bonding portion 57a, a transverse portion 57c joined to the first rising portion 57b, a second rising portion 57d joined to the transverse portion 57c, and a connection end 57e joined to the second rising portion 57d.

The bonding portion 57a is bonded to a region closer to the −Y direction of the second terminal bonding area 71, and is formed in a rectangular shape extending in the Y direction in a plan view. The bonding portion 57a is formed of a plate-like body parallel to the second lower conductor layer 43, and is bonded to the second lower conductor layer 43. The first rising portion 57b rises in the +Z direction from a −X direction-side edge portion of the bonding portion 57a. The first rising portion 57b is formed of a band-shaped plate-like body along a plane (a Y-Z plane) parallel to the Y direction and the Z direction, and is formed with substantially the same width as that of the bonding portion 57a. The transverse portion 57c is joined to a +Z direction-side edge portion of the first rising portion 57b, and extends in the +X direction. The transverse portion 57c is formed of a band-shaped plate-like body parallel to the principal surface of the heat radiating base 2, and is formed with substantially the same width as that of the first rising portion 57b. The second rising portion 57d rises in the +Z direction from a +X direction-side edge portion of the transverse portion 57c, and penetrates through the top plate 5 (refer to FIG. 1) of the case 3. The second rising portion 57d is formed of a band-shaped plate-like body along a plane (a Y-Z plane) parallel to the Y direction and the Z direction, and has substantially the same width as that of the transverse portion 57c. The connection end 57e extends in the +X direction from a +Z direction-side end edge of the second rising portion 57d, and is along an upper surface of the terminal block 15OUT (refer to FIG. 1). The connection end 57e is formed of a band-shaped plate-like body along the principal surface of the heat radiating base 2, has substantially the same width as that of the second rising portion 57d, and has an insertion hole 57f for connection in its substantially central portion. When assembled, the connection end 57e is in a standing position (a position along a Y-Z plane) extended from the second rising portion 57d. After the connection end 57e in a standing position is inserted through a slit-shaped insertion hole 5OUT (refer to FIG. 1) formed in the top plate 5, the connection end 57e is bent down, so that the connection end 57e is brought into a prone position along an X-Y plane.

The connecting member 38 is formed of a conductive plate-like body (for example, a copper plate applied with nickel plating). The connecting member 38 has a first bonding portion 58a, a first rising portion 58b, a transverse connecting portion 58c, a second rising portion 58d, and a second bonding portion 58e. The first bonding portion 58a is formed of a rectangular plate-like body parallel to a principal surface of the first upper board 22, and is bonded to a position closer to the −Y direction (closer to the second board assembly 40) in the assembly interconnection area 24b of the first upper conductor layer 24. The first rising portion 58b is joined to a −X direction-side edge portion of the first bonding portion 58a, and rises up to a predetermined height in the +Z direction. The first rising portion 58b is formed of a band-shaped plate-like body parallel to a plane (a Y-Z plane) along the Y direction and the Z direction, and is formed with substantially the same width as that of the first bonding portion 58a. On the other hand, the second bonding portion 58e is formed of a rectangular plate-like body parallel to a principal surface of the second lower board 41, and is bonded to a position closer to the +Y direction (closer to the first board assembly 20) in the second terminal bonding area 71 of the second lower conductor layer 43. The second rising portion 58d is joined to a +Y direction-side edge portion of the second bonding portion 58e, and rises up to the predetermined height in the +Z direction. The second rising portion 58d is formed of a band-shaped plate-like body parallel to a plane (an X-Z plane) along the X direction and the Z direction, and is formed with substantially the same width as that of the second bonding portion 58e. The transverse connecting portion 58c is formed in a shape bent in a hook shape in a plan view in the −Z direction, its one end is joined to the first rising portion 58b, and its other end is joined to the second rising portion 58d. The transverse connecting portion 58c is formed of a plate-like body parallel to the principal surface of the heat radiating base 2. Because the first and second bonding portions 58a, 58e are arranged in proximity, the connecting member 38 interconnects the first and second board assemblies 20, 40 with the minimum path length, thereby contributing to a reduction in inductance.

Figure 4:
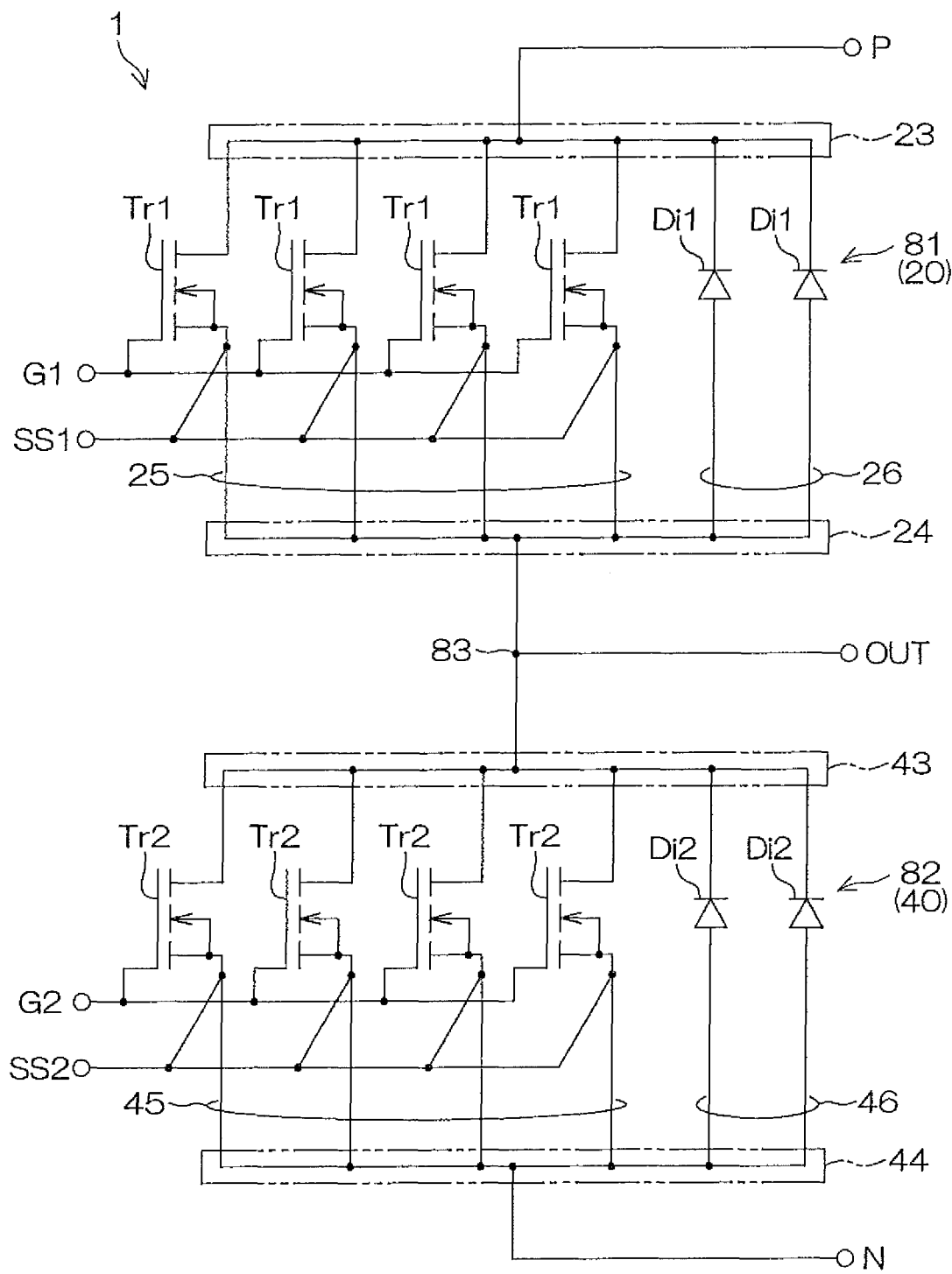
FIG. 4 is an electrical circuit diagram for explaining an electrical configuration of a power module.

FIG. 4 is an electrical circuit diagram for explaining an electrical configuration of the power module 1. The first switching elements Tr1 and the first diode elements Di1 included in the first board assembly 20 are connected in parallel between the first lower conductor layer 23 and the first upper conductor layer 24 to form an upper arm circuit (high-side circuit) 81. Similarly, the second switching elements Tr2 and the second diode elements Di2 included in the second board assembly 40 are connected in parallel between the second lower conductor layer 43 and the second upper conductor layer 44 to form a lower arm circuit (low-side circuit) 82. The upper arm circuit 81 and the lower arm circuit 82 are connected in series between the high voltage-side first power supply terminal P and the low voltage-side second power supply terminal N, and the output terminal OUT is connected to a connection point 83 between the upper arm circuit 81 and the lower arm circuit 82. A half-bridge circuit is thus formed. The half-bridge circuit can be used as a single-phase bridge circuit. Alternatively, by connecting a plurality of (for example, three) half-bridge circuits (power modules 1) in parallel to a power supply, a multi-phase (for example, 3-phase) bridge circuit can be formed.

The first and second switching elements Tr1, Tr2 are, in this embodiment, made of N-channel DMOS (Double-Diffused Metal Oxide Semiconductor) field-effect transistors. Particularly, in this embodiment, the first and second switching elements Tr1, Tr2 are high-speed switching MOSFETs (SiC-DMOS) made of SiC semiconductor devices.

Moreover, the first and second diode elements Di1, Di2 are, in this embodiment, made of Schottky barrier diodes. Particularly, in this embodiment, the first and second diode elements Di1, Di2 are made of SiC semiconductor devices (SiC-SBDs).

The drains of the first switching elements Tr1 and the cathodes of the first diode elements Di1 are connected in common to the first lower conductor layer 23. Moreover, the sources of the first switching elements Tr1 and the anodes of the first diode elements Di1 are connected in common to the first upper conductor layer 24. Further, the gates of the first switching elements Tr1 are connected in common to the gate terminal G1. To the sources of the first switching elements Tr1, the source sense terminal SS1 is connected in common. A current flowing from the output terminal OUT toward the first power supply terminal P bypasses the first switching elements Tr1 to flow through the first diode elements Di1, whereby breakdown of the first switching elements Tr1 due to a reverse current is prevented.

On the other hand, the drains of the second switching elements Tr2 and the cathodes of the second diode elements Di2 are connected in common to the second lower conductor layer 43. Moreover, the sources of the second switching elements Tr2 and the anodes of the second diode elements Di2 are connected in common to the second upper conductor layer 44. Further, the gates of the second switching elements Tr2 are connected in common to the gate terminal G2. To the sources of the second switching elements Tr2, the source sense terminal SS2 is connected in common. A current flowing from the second power supply terminal N toward the output terminal OUT bypasses the second switching elements Tr2 to flow through the second diode elements Di2, whereby breakdown of the second switching elements Tr2 due to a reverse current is prevented.

FIG. 5A is an illustrative sectional view for explaining a current path in the upper arm circuit 81 (first board assembly 20), and illustratively shows a cross section taken along a plane (an X-Z plane) including the X direction and the Z direction. The heat radiating base 2 and the first lower board 21 are bonded to each other by a medium-temperature solder 85. The first lower board 21 includes as a base substrate an insulating substrate made of an insulating material such as a ceramic. The first lower conductor layer 23 described above is formed on an upper surface (a +Z direction-side surface) of the insulating substrate, and on a lower surface (a −Z direction-side surface) thereof, a bonding conductor layer 33 is formed. The bonding conductor layer 33 is made of, for example, a copper foil formed on the surface of the first lower board 21. The bonding conductor layer 33 is bonded to the heat radiating base 2 via the medium-temperature solder 85. The medium-temperature solder 85 is a solder whose melting point belongs to a medium temperature range of approximately 220° C.

To the first terminal bonding area 61 set at one-side end portion (a −X direction-side end portion) of the first lower conductor layer 23, the base end portion of the first power supply terminal P is bonded by a low-temperature solder 86A. The low-temperature solder 86A is a solder whose melting point is lower than the melting point of the medium-temperature solder 85, and belongs to a low temperature range of approximately 180° C.

To the first element bonding area 62 set at the other-side end portion (a +X direction-side end portion) of the first lower conductor layer 23, a first switching element Tr1 and a first diode element Di1 (semiconductor chips) are bonded by a high-temperature solder 87A. The first switching element Tr1 has a drain terminal at its lower surface (−Z direction-side surface) facing the first lower conductor layer 23, and has a source terminal and a gate terminal at its upper surface (+Z direction-side surface) of an opposite side to the first lower conductor layer 23. Therefore, the drain terminal is bonded to the first lower conductor layer 23 by the high-temperature solder 87A. To the source terminal, a wire 25 is bonded. Although not shown in FIG. 5A, the gate terminal is bonded to a wire 32 (refer to FIG. 3), and the source terminal is bonded also to a wire 31. The first diode element Di1 has a cathode terminal at its lower surface (−Z direction-side surface) facing the first lower conductor layer 23, and has an anode terminal at its upper surface (+Z direction-side surface) of an opposite side to the first lower conductor layer 23. Therefore, the cathode terminal is bonded to the first lower conductor layer 23 by the high-temperature solder 87A. To the anode terminal, a wire 26 is bonded. The high-temperature solder 87A is a solder whose melting point is higher than that of the medium-temperature solder 85, and belongs to a high temperature range of approximately 300° C.

To the first board bonding area 63 set, on a surface (+Z direction-side surface) of the first lower conductor layer 23, between the first terminal bonding area 61 and the first element bonding area 62, the first upper board 22 is bonded by a high-temperature solder 87B. The first upper board 22 includes as a base substrate an insulating substrate made of an insulating material such as a ceramic. The first upper conductor layer 24 described above is formed on an upper surface (a +Z direction-side surface) of the insulating substrate, and on a lower surface (a −Z direction-side surface) thereof, a bonding conductor layer 34 is formed. The bonding conductor layer 34 is made of, for example, a copper foil formed on the surface of the first upper board 22. The bonding conductor layer 34 is bonded to the first lower conductor layer 23 via the high-temperature solder 87B. The high-temperature solder 87B is the same solder as the high-temperature solder 87A.

At a −X direction-side marginal portion of the first upper conductor layer 24, the connecting member 38 is bonded by a low-temperature solder 86B. The low-temperature solder 86B is the same solder as the low-temperature solder 86A.

When the first switching element Tr1 conducts, a current that has flowed in from the first power supply terminal P flows in the +X direction through the first lower conductor layer 23, and reaches the first switching element Tr1. The current that has flowed through the first switching element Tr1 is turned back, flows in the −X direction through the wire 25, and reaches the first upper conductor layer 24. Inside the first upper conductor layer 24, a current flows in the −X direction toward the connecting member 38. The current is led from the connecting member 38 to the second lower conductor layer 43 of the second board assembly 40, and is supplied from the output terminal OUT to a motor or other loads. A current flow at this time is shown in FIG. 5A.

On the other hand, when a reverse-direction voltage is applied with the first switching element Tr1 cut off, a current in the +X direction that leads to the first diode element Di1 flows through the wire 26. The current that has flowed through the first diode element Di1 is turned back, and flows in the −X direction through the first lower conductor layer 23.

Thus, a current to flow in the first switching element Tr1 flows in the +X direction and a current from the first switching element Tr1 flows in the −X direction, so that the current directions are reverse to each other. In addition, the first lower conductor layer 23 that provides a path of the current to flow in the +X direction and the wire 25 and the first upper conductor layer 24 that provide a path of the current to flow in the −X direction are close to each other. Similarly, a current to flow in the first diode element Di1 flows in the +X direction and a current from the first diode element Di1 flows in the −X direction, so that the current directions are reverse to each other. In addition, the wire 26 and the first upper conductor layer 24 that provide a path of the current to flow in the +X direction and the first lower conductor layer 23 that provides a path of the current to flow in the −X direction are close to each other. That is, the paths of currents that flow in reverse directions to each other are arranged closely. Accordingly, a self-inductance of the first lower conductor layer 23 and self-inductances of the wires 25, 26 and the first upper conductor layer 24 are at least partially cancelled out by mutual inductances therebetween. Accordingly, the inductance of the power module 1 can be reduced.

FIG. 5B is an illustrative sectional view for explaining a current path in the lower arm circuit 82 (second board assembly 40), and illustratively shows a cross section taken along a plane (an X-Z plane) including the X direction and the Z direction. The heat radiating base 2 and the second lower board 41 are bonded to each other by a medium-temperature solder 95. The second lower board 41 uses as a base substrate an insulating substrate made of an insulating material such as a ceramic. The second lower conductor layer 43 described above is formed on an upper surface (a +Z direction-side surface) of the insulating substrate, and on a lower surface (a −Z direction-side surface) thereof, a bonding conductor layer 53 is formed. The bonding conductor layer 53 is made of, for example, a copper foil formed on the surface of the second lower board 41. The bonding conductor layer 53 is bonded to the heat radiating base 2 via the medium-temperature solder 95. The medium-temperature solder 95 is a solder whose melting point belongs to a medium temperature range of approximately 220° C.

To the second terminal bonding area 71 set at one-side end portion (a −X direction-side end portion) of the second lower conductor layer 43, the base end portion of the output terminal OUT is bonded by a low-temperature solder 96A. The low-temperature solder 96A is a solder whose melting point is lower than the melting point of the medium-temperature solder 95, and belongs to a low temperature range of approximately 180° C.

To the second element bonding area 72 set at the other-side end portion (+X direction-side end portion) of the second lower conductor layer 43, a second switching element Tr2 and a second diode element Di2 (semiconductor chips) are bonded by a high-temperature solder 97A. The second switching element Tr2 has a drain terminal at its lower surface (−Z direction-side surface) facing the second lower conductor layer 43, and has a source terminal and a gate terminal at its upper surface (+Z direction-side surface) of an opposite side to the second lower conductor layer 43. Therefore, the drain terminal is bonded to the second lower conductor layer 43 by the high-temperature solder 97A. To the source terminal, a wire 45 is bonded. Although not shown in FIG. 5B, the gate terminal is bonded to a wire 52 (refer to FIG. 3), and the source terminal is bonded also to a wire 51. The second diode element Di2 has a cathode terminal at its lower surface (−Z direction-side surface) facing the second lower conductor layer 43, and has an anode terminal at its upper surface (+Z direction-side surface) of an opposite side to the second lower conductor layer 43. Therefore, the cathode terminal is bonded to the second lower conductor layer 43 by the high-temperature solder 97A. To the anode terminal, a wire 46 is bonded. The high-temperature solder 97A is a solder whose melting point is higher than that of the medium-temperature solder 95, and belongs to a high temperature range of approximately 300° C.

To the second board bonding area 73 set, on a surface (+Z direction-side surface) of the second lower conductor layer 43, between the second terminal bonding area 71 and the second element bonding area 72, the second upper board 42 is bonded by a high-temperature solder 97B. The second upper board 42 uses as a base substrate an insulating substrate made of an insulating material such as a ceramic. The second upper conductor layer 44 described above is formed on an upper surface (a +Z direction-side surface) of the insulating substrate, and on a lower surface (a −Z direction-side surface) thereof, a bonding conductor layer 54 is formed. The bonding conductor layer 54 is made of, for example, a copper foil formed on the surface of the second upper board 42. The bonding conductor layer 54 is bonded to the second lower conductor layer 43 via the high-temperature solder 97B. The high-temperature solder 97B is the same solder as the high-temperature solder 97A.

At a −X direction-side marginal portion of the second upper conductor layer 44, the second power supply terminal N is bonded by a low-temperature solder 96B. The low-temperature solder 96B is the same solder as the low-temperature solder 96A.

When the second switching element Tr2 conducts, a current that has flowed in from the output terminal OUT flows in the +X direction through the second lower conductor layer 43, and reaches the second switching element Tr2. The current that has flowed through the second switching element Tr2 is turned back, flows in the −X direction through the wire 45, and reaches the second upper conductor layer 44. Inside the second upper conductor layer 44, a current flows in the −X direction toward the second power supply terminal N. A current flow at this time is shown in FIG. 5B.

On the other hand, when a reverse-direction voltage is applied with the second switching element Tr2 cut off, a current in the +X direction that leads to the second diode element Di2 flows through the wire 46. The current that has flowed through the second diode element Di2 is turned back, and flows in the −X direction through the second lower conductor layer 43.

Thus, a current to flow in the second switching element Tr2 flows in the +X direction and a current from the second switching element Tr2 flows in the −X direction, so that the current directions are reverse to each other. In addition, the second lower conductor layer 43 that provides a path of the current to flow in the +X direction and the wire 45 and the second upper conductor layer 44 that provide a path of the current to flow in the −X direction are close to each other. Similarly, a current to flow in the second diode element Di2 flows in the +X direction and a current from the second diode element Di2 flows in the −X direction, so that the current directions are reverse to each other. In addition, the wire 46 and the second upper conductor layer 44 that provide a path of the current to flow in the +X direction and the second lower conductor layer 43 that provides a path of the current to flow in the −X direction are close to each other. That is, the paths of currents that flow in reverse directions to each other are arranged closely. Accordingly, a self-inductance of the second lower conductor layer 43 and self-inductances of the wire 45, 46 and the second upper conductor layer 44 are at least partially cancelled out by mutual inductances therebetween. Accordingly, the inductance of the power module 1 can be reduced.

Next, one example of a preparation method of the power module 1 will be outlined. By executing the following procedures 1 to 7 in order, a power module 1 is prepared.

Procedure 1: Bond the first switching element Tr1, the first diode element Di1, and the first upper board 22 to the first lower board 21 by the high-temperature solders 87A, 87B. Similarly, bond the second switching element Tr2, the second diode element Di2, and the second upper board 42 to the second lower board 41 by the high-temperature solders 97A, 97B.

Procedure 2: Bond the first and second lower boards 21, 41 to the surface of the heat radiating base 2 by the medium-temperature solders 85, 95.

Procedure 3: Bond terminals to predetermined positions by a low-temperature solder. The terminals include the first power supply terminal P, the second power supply terminal N, the output terminal OUT, the connecting member 38, the gate terminals G1, G2, and the source sense terminals SS1, SS2. The low-temperature solder may be, for example, a eutectic tin-lead solder.

Procedure 4: Bond the frame portion 4 of the case 3 to the surface of the heat radiating base 2. For bonding, for example, a thermosetting adhesive such as a silicone adhesive may be used. For example, a silicone adhesive can be set by heating at a temperature of approximately 150° C. for approximately 1 hour. This temperature is lower than the melting points of the solders, and lower than the temperature of a constituent material (for example, PPS) of the frame portion 4.

Procedure 5: Arrange a gel material (not shown) made of an insulating material inside the frame portion 4. For example, a silicon gel can be used. The gel material has a function of filling up gaps such as between wires, and maintaining an insulated condition therebetween. Therefore, it is preferable to fill the gel material inside the frame 4 up to at least a position higher than the loop heights of all wires.

Procedure 6: Fix the top plate 5 to the frame portion 4. The fixation may be performed using an adhesive, or may be performed by screwing. For fixing the top plate 5, insert the terminals P, N, OUT through the slit-shaped insertion holes 5P, 5N, 5OUT (refer to FIG. 1) formed in the top plate 5, and insert the gate terminals G1, G2 and the source sense terminals SS1, SS2 through insertion holes 5a, 5b, 5c, 5d (refer to FIG. 1).

Procedure 7: Bend down the terminals P, N, OUT into prone positions to extend along the upper surfaces of the terminal blocks 15P, 15N, 15OUT.

Figure 6A:
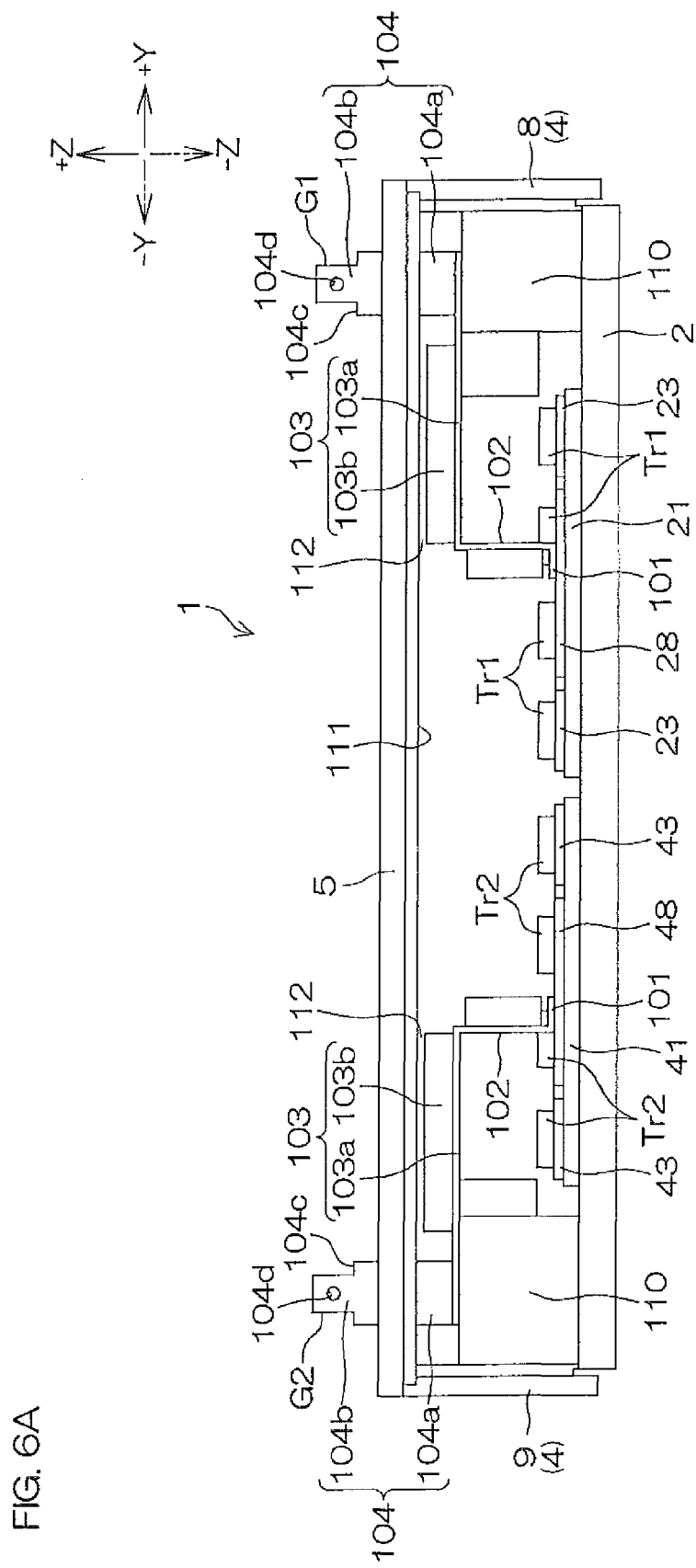
FIG. 6A is an illustrative side view for explaining an example of a holding structure of gate terminals and source sense terminals.

FIG. 6A is an illustrative side view for explaining a holding structure of the gate terminals G1, G2 and the source sense terminals SS1, SS2, and shows a state with the +X direction-side side plate 6 (refer to FIG. 1) removed. Because the gate terminals G1, G2 and the source sense terminals SS1, SS2 are the same in structure, the holding structure of the gate terminals G1, G2 will be described.

The gate terminal G1, G2 has a bonding portion 101, a first rising portion 102, a transverse portion 103, and a second rising portion 104. The bonding portion 101 is solder-bonded to the controlling conductor layer 28, 48, and is formed in a plate shape parallel to the principal surface of the lower board 21, 41. The first rising portion 102 is joined to one edge portion of the bonding portion 101, rises in a direction (+Z direction) to separate from the lower board 21, 41, and is formed in an L-shape in section. The transverse portion 103 is joined to an upper end of the first rising portion 102, and extends in a direction (in this embodiment, the Y direction) parallel to the principal surface of the lower board 21, 41. The traverse portion 103 is formed in an L-shape in section in a region from its base end portion on the first rising portion 102 side up to the length of a predetermined length. That is, the transverse portion 103 has a first plate-shaped portion 103a formed in a band shape parallel to the principal surface of the lower board 21, 41 and a band-shaped second plate-shaped portion 103b rising in the +Z direction from one side edge (in this embodiment, a −X direction-side side edge) of the first plate-shaped portion 103a. The second plate-shaped portion 103b is formed shorter than the first plate-shaped portion 103a. The second plate-shaped portion 103b rises in a direction (+Z direction) to separate from the lower board 21, 41, and its upper end edge (+Z direction-side end edge) is formed parallel to the principal surface of the lower board 21, 41. The second rising portion 104 is joined to a front end portion of the transverse portion 103. The second rising portion 104 is made of a plate-shaped body rising in a direction (+Z direction) to separate from the lower board 21, 41, and has a wide-width main body portion 104a and a narrow width portion 104b linked with an upper end edge (a +Z direction-side end edge) of the main body portion 104a. Accordingly, in a joining portion between the main body portion 104a and the narrow width portion 104b, a pair of shoulders 104c are formed on both sides of the narrow width portion 104b. The narrow width portion 104b provides an external wiring connecting portion, and has a hole for making wiring connection easy in its substantially central portion.

The second rising portion 104 is inserted through the insertion hole 5a, 5b (refer to FIG. 1) formed in the top plate 5 of the case 3. Accordingly, an upper end portion of the main body portion 104a and the narrow width portion 104b are located above (+Z direction) an upper surface of the top plate 5. The source sense terminals SS1, SS2 are also similarly configured, and are inserted through the insertion holes 5c, 5d (refer to FIG. 1) formed in the top plate 5 to project in the +Z direction from the upper surface of the top plate 5.

Below the second rising portion 104, a pedestal 110 (terminal pedestal) is arranged inside the case 3. The pedestal 110 may be made of a resin material (for example, the same material as that of the case 3). The pedestal 110 may be fixed to an inside surface of the frame portion 4 (for example, the end plate 8, 9) of the case 3, or may be fixed to the surface (+Z direction-side surface) of the heat radiating base 2. The pedestal 110 is formed in, for example, a rectangular parallelepiped shape, and its upper surface (+Z direction-side surface) that is substantially flush (that is, substantially the same height) with a lower surface of the transverse portion 103 is in contact with or in proximity to the lower surface. On the upper surface of the pedestal 110, a partition wall 110a may be provided in a standing condition between the gate terminal G1, G2 and the source sense terminal SS1, SS2.

On the other hand, a lower surface 111 of the top plate 5 of the case 3 is formed substantially flush (that is, substantially the same height) with the upper end edge of the second plate-shaped portion 103b of the transverse portion 103. Accordingly, the lower surface 111 is in contact with or in proximity to the upper end edge of the transverse portion 103, and has a function as a terminal retainer that restricts the transverse portion 103 from moving upward (+Z direction). In FIG. 6A, shown is an example where a minute clearance 112 is formed between the lower surface 111 of the top plate 5 and the upper end edge of the transverse portion 103 in consideration of dimensional tolerances of the gate terminals G1, G2, the top plate 5, etc.

Due to such a structure, the gate terminals G1, G2 are reliably held. That is, in the case of connection or removal of wiring and the like with respect to the gate terminals G1, G2, external force is applied to the gate terminals G1, G2. At this time, a push-in force applied downward (−Z direction) to the second rising portion 104 is received by the pedestal 110, and a pull-out force applied upward (+Z direction) to the second rising portion 104 is received by the lower surface 111 of the top plate 5. Accordingly, displacement in the Z direction or deformation of the gate terminals G1, G2 can be prevented, and further, application of an external force applied to the gate terminals G1, G2 can be inhibited or prevented from being applied to the bonding portion 101. Accordingly, connection reliability of the gate terminals G1, G2 can be improved. For the same reason, connection reliability can be improved also for the source sense terminals SS1, SS2. Therefore, the power module 1 has sufficient reliability, and thus has sufficient durability.

FIG. 6B is an illustrative side view for explaining another example of a holding structure of the gate terminals G1, G2 and the source sense terminals SS1, SS2, and shows a state with the +X direction-side side plate 6 (refer to FIG. 1) removed. In FIG. 6B, corresponding parts of the parts of FIG. 6A described above are denoted by the same reference signs as in FIG. 6A.

In this structure example, the lower surface 111 of the top plate 5 is not substantially flush with the upper end edge of the transverse portion 103. In the position corresponding to a position above (+Z direction) the transverse portion 103, a terminal retainer 113 is provided at the lower surface 111 of the top plate 5. The terminal retainer 113 projects downward (−Z direction) from the lower surface 111 of the top plate 5, has at its lower surface a restriction surface 113A that is parallel to the transverse portion 103. The restriction surface 113A is formed substantially flush (that is, substantially the same height) with the transverse portion 103. Accordingly, the restriction surface 113A is in contact with or in proximity to the upper end edge of the transverse portion 103, and restricts the transverse portion 103 from moving upward (+Z direction). Also by such a structure, the same advantageous effects as those of the structure of FIG. 6A can be realized. In FIG. 6B, shown is an example where a minute clearance 114 is formed between the restriction surface 113A and the upper end edge of the transverse portion 103 in consideration of dimensional tolerances of the gate terminals G1, G2, the top plate 5, the terminal retainer 113, etc.

Figure 7A:
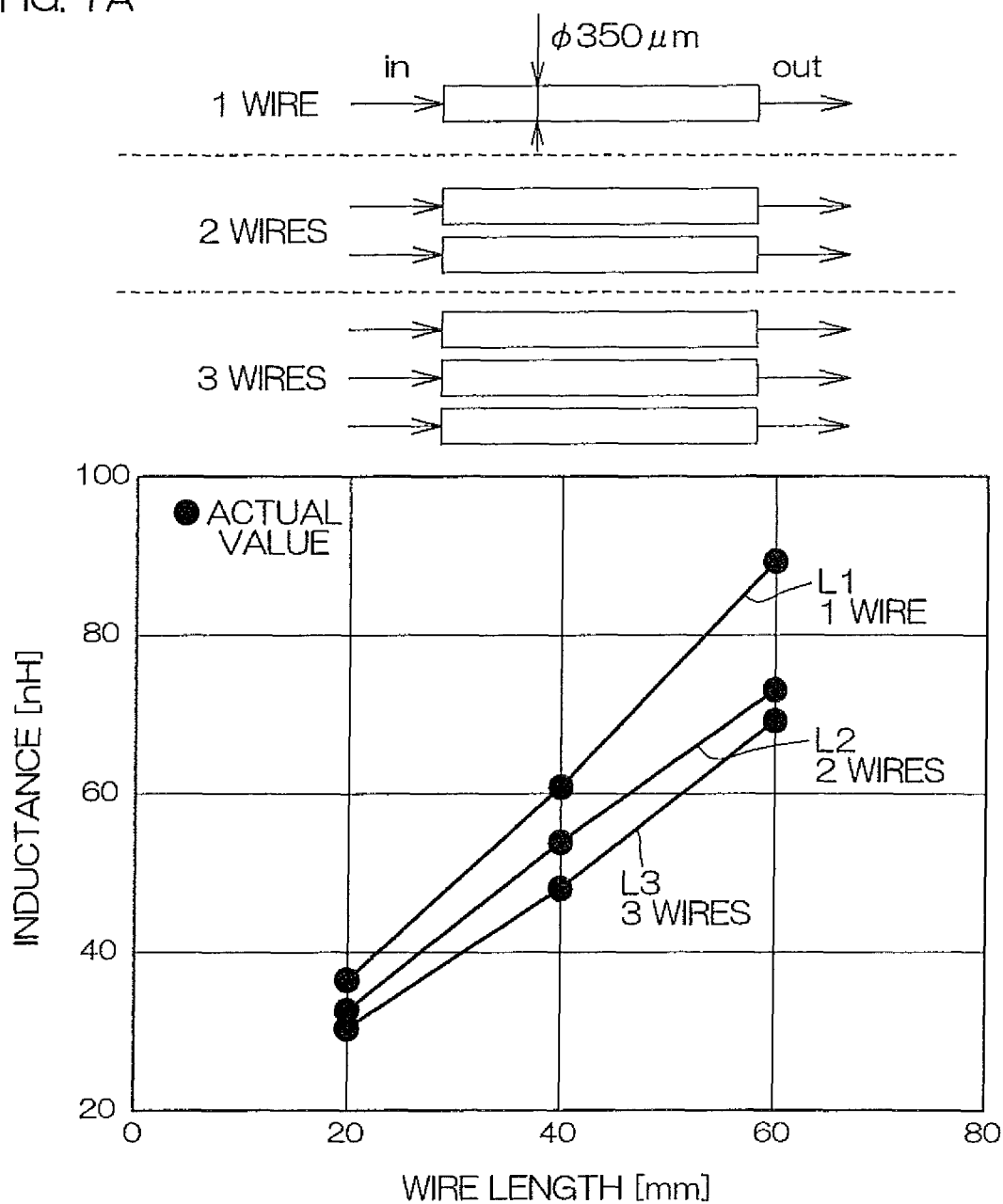
FIG. 7A is a view for explaining an effect of reducing inductance by a reduction in the length of wires.

FIG. 7A is a view for explaining an effect of reducing inductance by a reduction in the length of wires. In FIG. 7A, shown are calculation examples in which signals of a frequency of 1 MHz are input to aluminum wires with a diameter of 350 μm to determine inductance. Curve L1 shows a result of inductance measured for single wires of various lengths. Curve L2 shows a result of inductance measured for two parallel wires of various lengths. Curve L3 shows a result of inductance measured for three parallel wires of various lengths.

It can be understood from curves L1 to L3 that the larger the number of wires, the more inductance is reduced, and the shorter the wire length, the more inductance is reduced. Further, it can be understood from curves L1 to L3 that a reduction in the wire length is more effective for a reduction in inductance than an increase in the number of wires.

FIG. 7B is a view for explaining an effect of reducing inductance by an increase in the entire arrangement width of wires. In FIG. 7B, shown are calculation examples in which signals of a frequency of 1 MHz are input to aluminum wires with a diameter of 350 μm and a length of 20 mm to determine inductance. Curve L11 shows a result of inductance calculated by variously setting the interval (entire arrangement width) of two parallel wires. Curve L12 shows a result of inductance calculated by arranging in parallel three wires at equal intervals with variously set entire arrangement widths. Curve L13 shows a result of inductance calculated by arranging in parallel six wires at equal intervals with variously set entire arrangement widths.

It can be understood from curves L11 to L13 that the larger the entire arrangement width, the more advantageous for a reduction in inductance. Moreover, it can be understood by a comparison of curves L11 to L13 that an increase in the entire arrangement width is more effective for a reduction in inductance than an increase in the number of wires.

As in the above, according to the first embodiment, the current path in the first board assembly 20 that forms an upper arm circuit 81 flows from the first power supply terminal P toward the first switching element Tr1, and is turned back by the first switching element to lead to the first upper conductor layer 24. The current path is thus turned back, and moreover, the first lower conductor layer 23 and 'the wire 25 and the first upper conductor layer 24' that form a pair of current paths where currents flow in reverse directions to each other are close to each other. Accordingly, the inductance is reduced. Further, the first switching elements Tr1 and the first upper conductor layer 24 are connected therebetween by a plurality of wires 25 arranged along paths to have the minimum lengths, respectively. Accordingly, the inductance is further reduced. In addition, the wires 25 are routed so as to have an entire arrangement width extending substantially the entire width of one side (a side at the X direction side) of the first upper conductor layer 24. The wires 26 that connect the diode elements Di1 and the first upper conductor layer 24 are also arranged so as to have an entire arrangement width extending substantially the entire width of one side (a side at the X direction side) of the first upper conductor layer 24. Accordingly, the inductance is still further reduced. For the second board assembly 40 that forms a lower arm circuit 82, the inductance is reduced in the same manner. Therefore, the power module 1 as a whole has a small inductance. As a result, loss is reduced by using high-speed switching-type switching elements Tr1, Tr2 made of SiC semiconductor devices, while a surge voltage is reduced to increase the margin of breakdown voltage concurrently.

[Second Embodiment]

Figure 8:
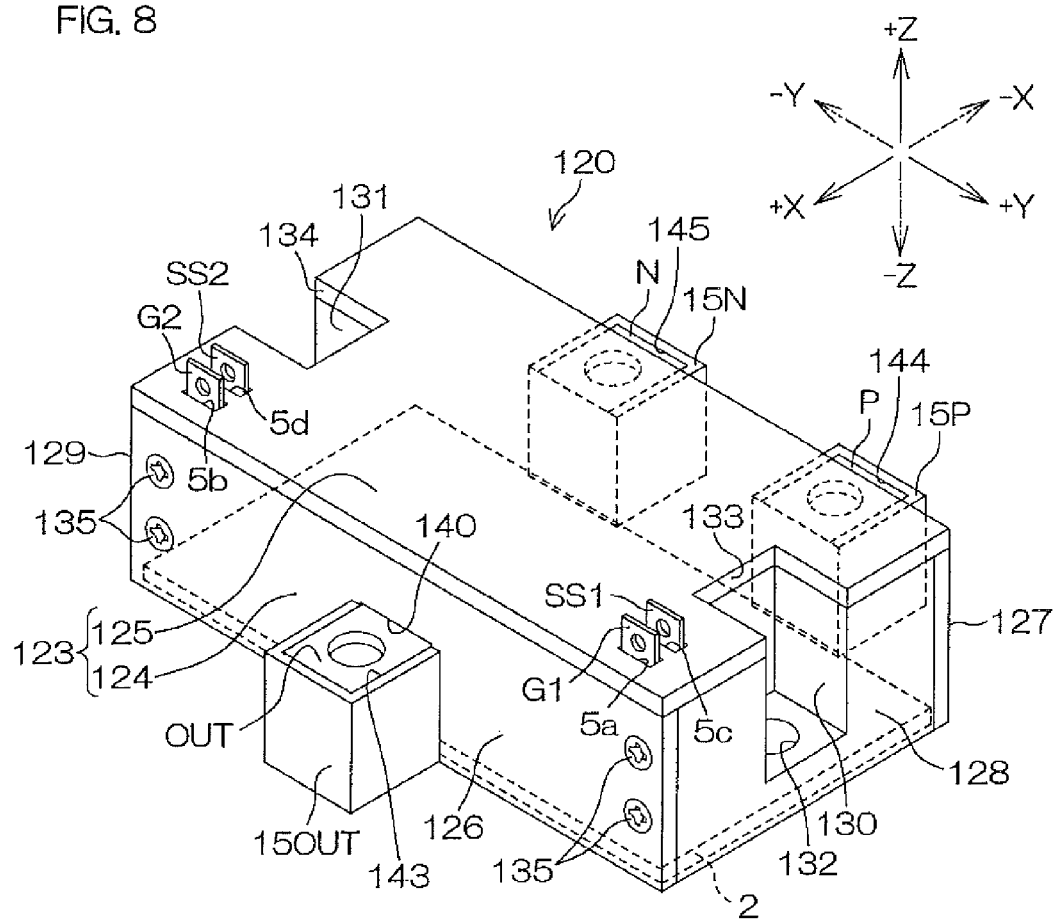
FIG. 8 is a perspective view showing an external appearance of a power module according to a second embodiment of this invention.

FIG. 8 is a perspective view showing an external appearance of a power module according to a second embodiment of this invention. In FIG. 8, corresponding parts of the parts shown in FIG. 1 etc., described above are shown with the same reference signs.

The power module 120 includes a case 123 having a substantially rectangular parallelepiped shape. The case 123, in this embodiment, surrounds a side surface of the heat radiating base 2. The case 123 is formed of a resin material. As the resin material, particularly, it is preferable that a heat resistant resin such as PPS (polyphenylene sulfide) is applied. The case 123 shows a rectangular shape substantially in alignment with the heat radiating base 2 in a plan view, and includes a frame portion 124 fixed to one surface (a +Z direction-side surface) of the heat radiating base 2 and a top plate 125 fixed to the frame portion 124. The top plate 125 blocks one side (a +Z direction side) of the frame portion 124, and faces the principal surface of the heat radiating base 2 that blocks the other side (a −Z direction side) of the frame portion 124. Accordingly, the heat radiating base 2, the frame portion 124, and the top plate 125 define a circuit housing space inside of the case 123.

The frame portion 124 includes a pair of side plates 126, 127 (first case components) and a pair of end plates 128, 129 (second case components) that join both ends of the paired side plates 126, 127, respectively. The end plates 128, 129, in the vicinity of their respective intermediate portions, have recess portions 130, 131 that are recessed inward. At bottom surfaces of the recess portions 130, 131, mounting holes 132 that penetrate therethrough in the Z direction are formed. The power module 120 is, by a bolt (not shown) inserted through the mounting hole 132 and the corresponding mounting hole 12 (refer to FIG. 9) of the heat radiating base 2, fixed to a predetermined fixing position of a mounting target. A heat sink or other cooling means may be mounted by using the mounting hole 132. Recess portions 133, 134 are formed in the vicinity of intermediate portions of a pair of end sides of the top plate 125 so as to be in alignment with the recess portions 130, 131 of the end plates 128, 129.

On one side plate 126 (a +X direction-side side plate), a terminal block 15OUT for an output terminal OUT is formed projecting outward (+X direction) to separate from a principal surface of the side plate 126. The terminal block 15OUT has a substantially rectangular shape, and at its upper surface, a rectangular-shaped depression that forms a receiving portion 143 (refer to FIG. 11) to receive a front end portion of the output terminal OUT is formed. The front end portion of the output terminal OUT is led out of the case 123 along the X direction via a slit-shaped insertion hole 140 formed in the side plate 126, and is arranged at the receiving portion 143 of the terminal block 15OUT.

On the other side plate 127 (a −X direction-side side plate), a pair of terminal blocks 15P, 15N are formed projecting outward (−X direction) to separate from a principal surface of the side plate 127. The terminal blocks 15P, 15N have substantially rectangular shapes. At an upper surface of the terminal block 15P, a depression that forms a receiving portion 144 (refer to FIG. 11) to receive a front end portion of the first power supply terminal P is formed. Similarly, at an upper surface of the terminal block 15N, a depression that forms a receiving portion 145 (refer to FIG. 11) to receive a front end portion of the second power supply terminal N is formed. The first power supply terminal P is led out of the case 123 along the −X direction via a slit-shaped insertion hole 141 (refer to FIG. 11) extending linearly in the longitudinal direction (Y direction) of the side plate 127, and is arranged at the receiving portion 144 of the terminal block 15P. Similarly, the second power supply terminal N is led out of the case 123 along the −X direction via a slit-shaped insertion hole 142 (refer to FIG. 11) extending linearly in the longitudinal direction (Y direction) of the side plate 127, and is arranged at the receiving portion 145 of the terminal block 15N.

The terminal blocks 15OUT, 15P, 15N are each provided with a hexagonal cylinder-shaped recess portion (not shown) opened in substantially the center. Nuts 146, 147, 148 (refer to FIG. 11) are embedded and fixed to the hexagonal cylinder-shaped recess portions, respectively. The terminals OUT, P, N are connected to a bus bar (not shown) provided on the mounting target side by using bolts (not shown) that are screwed into the nuts 146, 147, 148.

Figure 9:
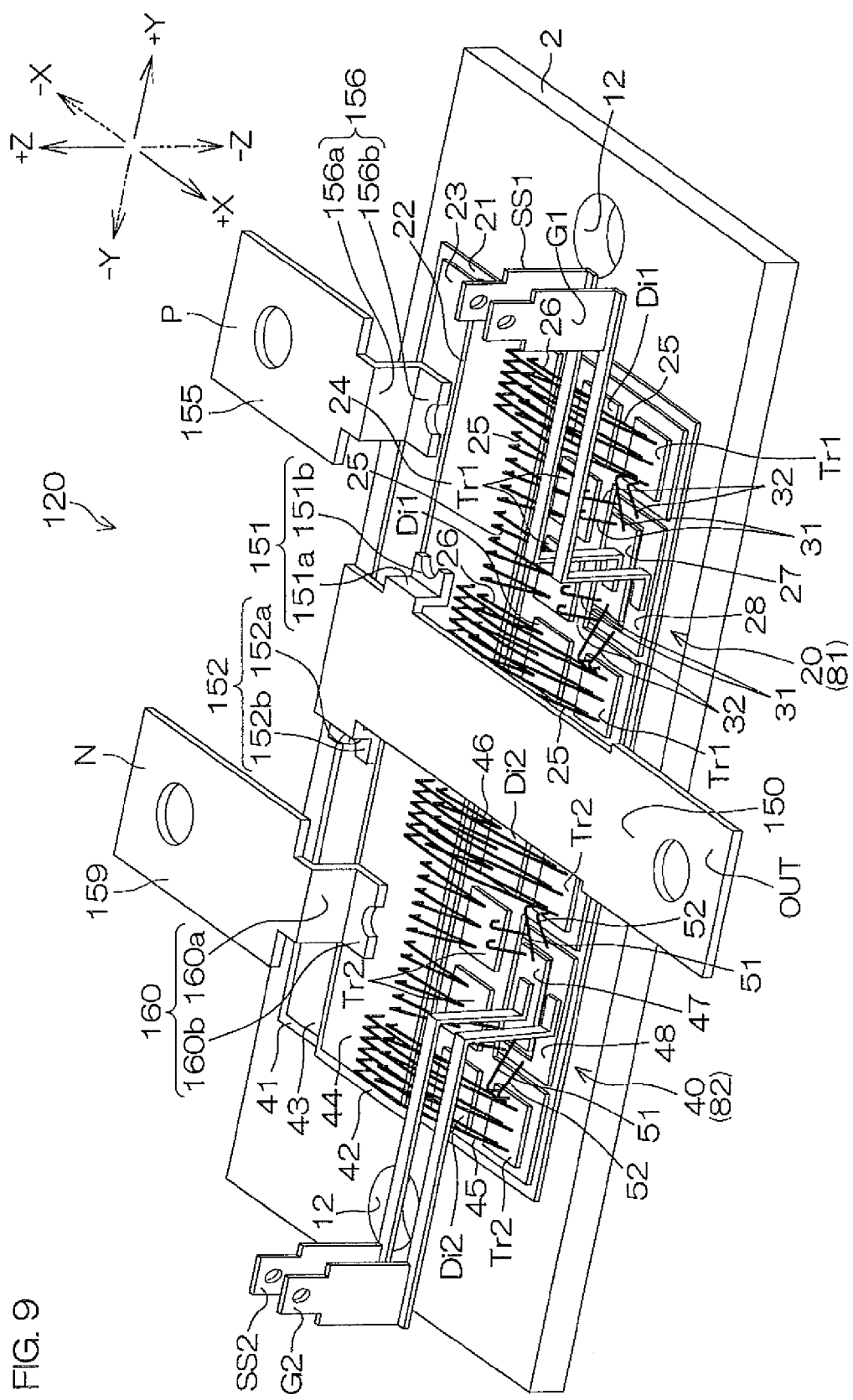
FIG. 9 is an illustrative perspective view for explaining a configuration of a power module circuit housed inside a case.
Figure 10:
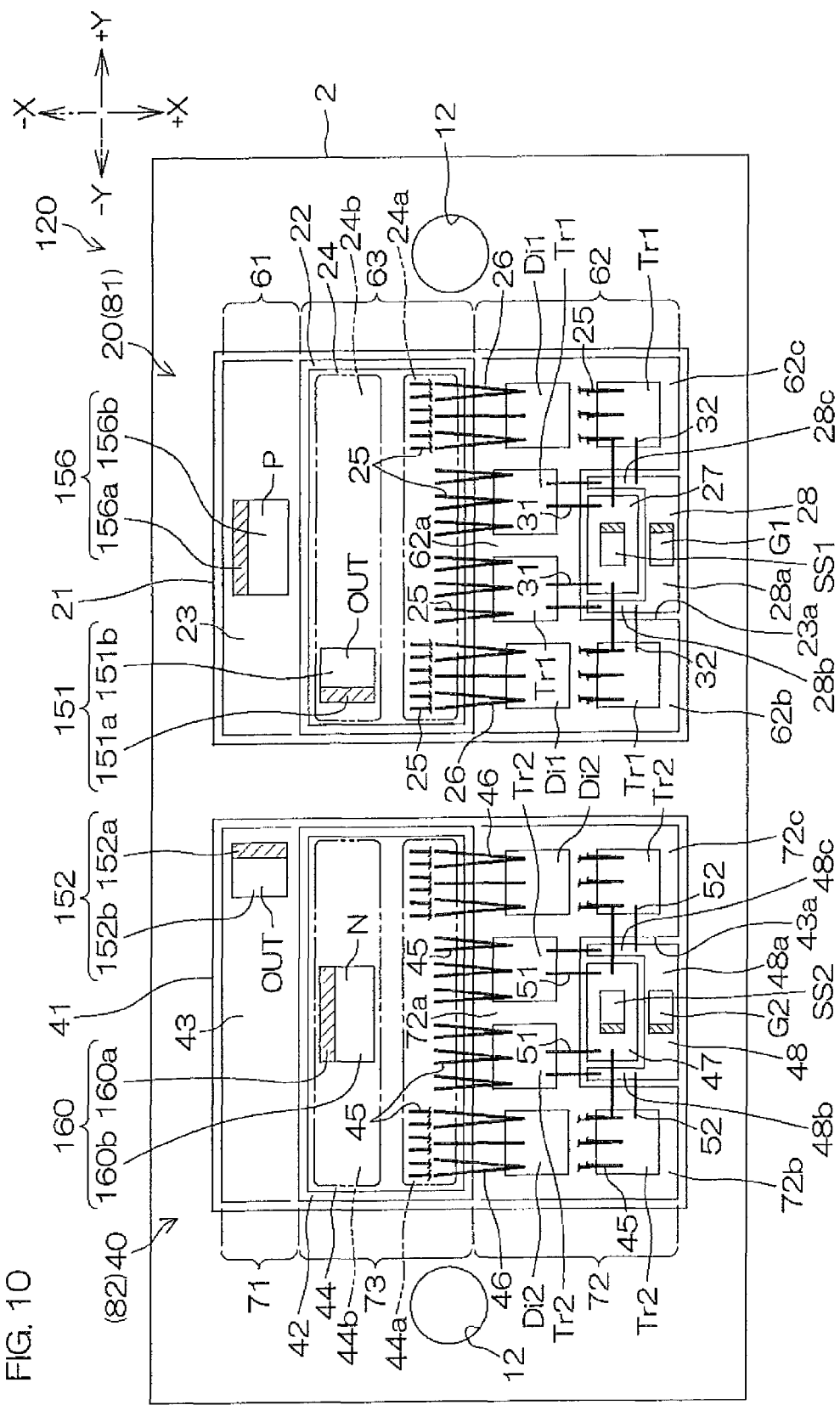
FIG. 10 is a plan view of the configuration of FIG. 9.

FIG. 9 is an illustrative perspective view for explaining a configuration of a power module circuit housed inside the case 123, and FIG. 10 is a plan view thereof. In FIG. 9 and FIG. 10, corresponding parts of the parts shown in FIG. 2 and FIG. 3 described above are denoted with the same reference signs.

Also in this embodiment, a first board assembly 20 and a second board assembly 40 are loaded on one surface (a +Z direction-side surface) of the heat radiating base 2. However, in the first embodiment described above, an interconnection between the first and second board assemblies 20, 40 is achieved by the connecting member 38, while in the second embodiment, the output terminal OUT takes charge of an interconnection between the first and second board assemblies 20, 40.

When described more specifically, the output terminal OUT is, in this embodiment, made of a band-shaped plate-like body arranged, along a boundary portion between the first and second board assemblies 20, 40, parallel to the principal surface of the heat radiating base 2. That is, the output terminal OUT includes a main body portion 150 made of a band-shaped plate-like body extending along the X direction, a first leg portion 151 drooping from one side edge of a base end portion (a −X direction-side end portion) of the main body portion 150 and bonded to the first upper conductor layer 24, and a second leg portion 152 drooping from the other side edge of the base end portion and connected to the second lower conductor layer 43. The main body portion 150 extends linearly along the X direction, and is formed entirely with a substantially uniform width, and its front end portion is led out onto the terminal block 15OUT outside of the case 123 after being inserted through the side plate 126. The first leg portion 151 has a drooping portion 151*a* drooping from the main body portion 150 and a bonding portion 151*b* bent from a lower edge (a −Z direction-side edge) of the drooping portion 151*a* toward inside (+Y direction) of the first upper conductor layer 24, and the bonding portion 151*b* is bonded to a −Y direction-side marginal portion of the first upper conductor layer 24. The drooping portion 151*a* is made of a band-shaped plate-like body along a plane (an X-Z plane) including the X direction and the Z direction. The bonding portion 151*b* is made of a band-shaped plate-like body parallel to the principal surface of the heat radiating base 2, and is formed with the same width as that of the drooping portion 151*a*. The second leg portion 152 has a drooping portion 152*a* drooping from the main body portion 150 and a bonding portion 152*b* bent from a lower edge of the drooping portion 152*a* toward inside (−Y direction) of the second lower conductor layer 43, and the bonding portion 152*b* is bonded to a +Y direction-side marginal portion of the second lower conductor layer 43. The drooping portion 152*a* is made of a band-shaped plate-like body along a plane (an X-Z plane) including the X direction and the Z direction. The bonding portion 152*b* is made of a band-shaped plate-like body parallel to the principal surface of the heat radiating base 2, and is formed with the same width as that of the drooping portion 152*a*. Therefore, the first upper conductor layer 24 and the second lower conductor layer 43 are connected with the minimum path length via a base end-side part of the main body portion 150 and the first and second leg portions 151, 152. The first upper conductor layer 24 and the second terminal bonding area 71 of the second lower conductor layer 43 are misaligned in the X direction, and thus accordingly, the first and second leg portions 151, 152 are also formed at positions misaligned in the X direction.

The first power supply terminal P has a main body portion 155 made of a band-shaped plate-like body parallel to the principal surface of the heat radiating base 2 and a leg portion 156 drooping from one end (an X direction end) of the main body portion 155 and bonded to the first terminal bonding area 61 of the first lower conductor layer 23. The main body portion 155 extends backward (−X direction) along the principal surface of the heat radiating base 2, and is led out onto the terminal block 15P outside of the case 123 after being inserted through the side plate 127. The leg portion 156 is formed by bending a band-shaped plate-like body narrower in width than the main body portion 155. That is, the leg portion 156 has a drooping portion 156*a* drooping from the main body portion 155 and a bonding portion 156*b* bent from a lower end edge (a −Z direction-side edge) of the drooping portion 156*a* in the +X direction, and the bonding portion 156*b* is bonded to the first terminal bonding area 61 of the first lower conductor layer 23. The drooping portion 156*a* is made of a band-shaped plate-like body along a plane (a Y-Z plane) including the Y direction and the Z direction. The bonding portion 156*b* is made of a band-shaped plate-like body parallel to the principal surface of the heat radiating base 2, and is formed with the same width as that of the drooping portion 156*a*.

The second power supply terminal N has a main body portion 159 made of a band-shaped plate-like body parallel to the principal surface of the heat radiating base 2 and a leg portion 160 drooping from one end (an X direction end) of the main body portion 159 and bonded to the second upper conductor layer 44. The main body portion 159 extends backward (−X direction) along the principal surface of the heat radiating base 2, and is led out onto the terminal block 15N outside of the case 123 after being inserted through the side plate 127. The leg portion 160 is formed by bending a band-shaped plate-like body narrower in width than the main body portion 159. That is, the leg portion 160 has a drooping portion 160*a* drooping from the main body portion 159 and a bonding portion 160*b* bent from a lower edge of the drooping portion 160*a* in the +X direction, and the bonding portion 160*b* is bonded to the second upper conductor layer 44. The drooping portion 160*a* is made of a band-shaped plate-like body along a plane (a Y-Z plane) including the Y direction and the Z direction. The bonding portion 160*b* is made of a band-shaped plate-like body parallel to the principal surface of the heat radiating base 2, and is formed with the same width as that of the drooping portion 160*a*.

By such a configuration, a lateral lead-out terminal-type power module 120 whose terminals P, N, OUT are led out in the directions parallel to the principal surfaces of the heat radiating base 2 and the first lower board 21 and the second lower board 41 can be provided. Moreover, because the lengths of the first and second power supply terminals P, N can be reduced, the self-inductances of the terminals P, N can be reduced. As a result, the power module 120 has a further reduced inductance, and thus a surge voltage can be reduced to improve the margin of breakdown voltage concurrently. With regard to this configuration, an inductance calculated for the upper arm circuit 81 (first board assembly 20) in response to a signal of a frequency of 1 MHz was 18.8 nH.

Because the terminals P, N, OUT are led out laterally, for example, a control board to control the switching elements Tr1, Tr2 can be arranged at an upper surface side of the case 123. Accordingly, a power module including also the control board can be downsized.

In addition, the electrical configuration of the power module 120 according to the second embodiment is the same as that of the first embodiment described above, and as shown in FIG. 4. The current paths in the first and second board assemblies 20, 40 (the upper arm circuit 81 and lower arm circuit 82) are also the same as those of the first embodiment, and as shown in FIG. 5. Therefore, in the same manner as in the first embodiment, the current paths where currents flow in reverse directions to each other are close to each other in the first and second board assemblies 20, 40, and accordingly, an effect to cancel out inductances can be obtained.

Figure 11:
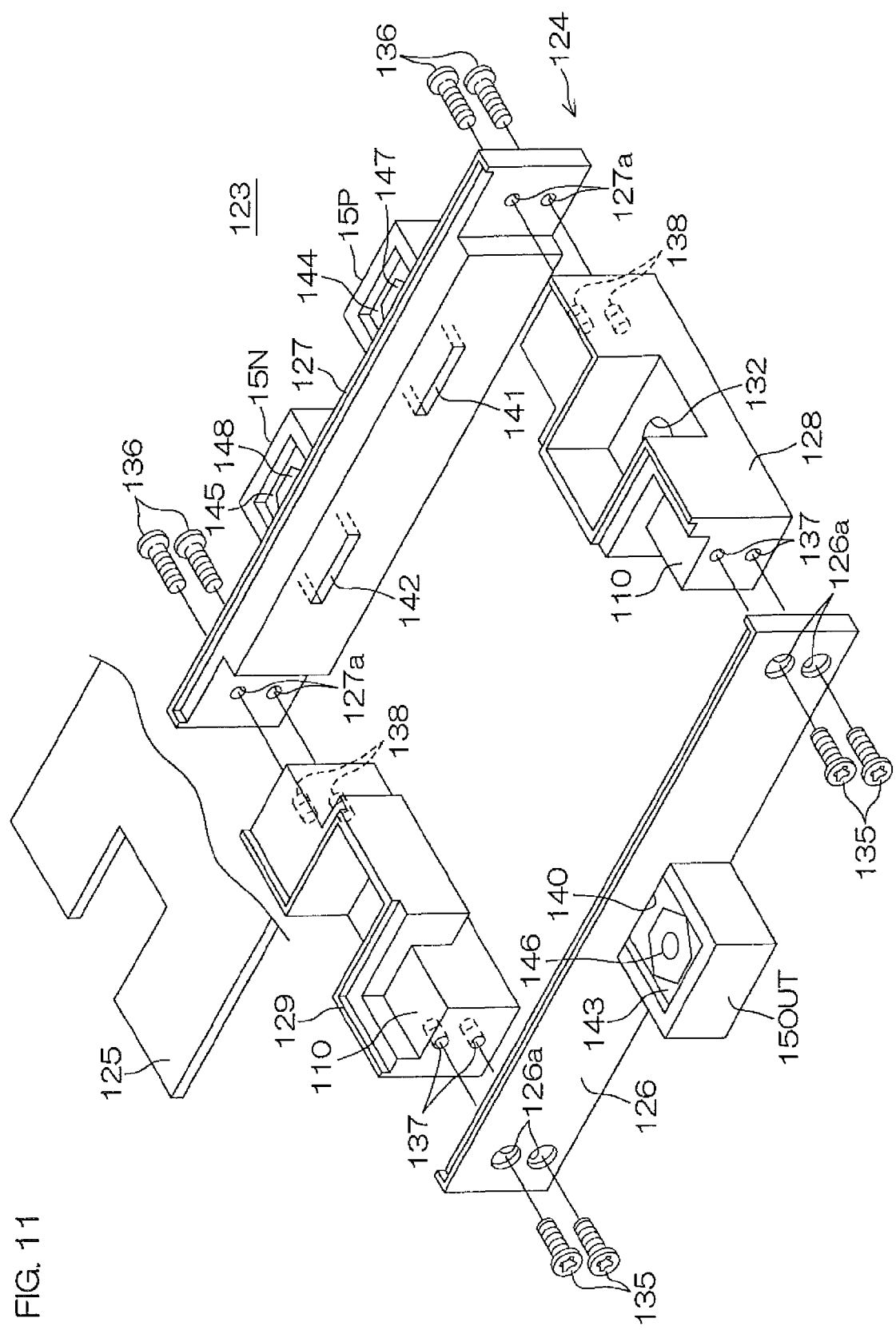
FIG. 11 is an exploded perspective view of a case.

FIG. 11 is an exploded perspective view of the case 123. In this embodiment, the side plates 126, 127 are attached to both end portions of the end plates 128, 129 by pluralities of bolts 135, 136. That is, in the side plates 126, 127, a plurality of bolt insertion holes 126a, 127a are formed in the vicinity of both longitudinal (Y direction) end edges, respectively. In both end surfaces of the endplates 128, 129, a plurality of screw holes 137 corresponding to the bolt insertion holes 126a and a plurality of screw holes 138 corresponding to the bolt insertion holes 127a are formed. The bolts 135 are fitted by screwing into the screw holes 137 after being inserted through the bolt insertion holes 126a. Accordingly, the side plate 126 is attached to the end plates 128, 129. The bolts 136 are fitted by screwing into the screw holes 138 after being inserted through the bolt insertion holes 127a. Accordingly, the side plate 127 is attached to the end plates 128, 129, and thus a frame portion 124 made of an assembly of a pair of side plates 126, 127 and a pair of end plates 128, 129 is assembled. Further, as a result of a top plate 125 being fixed to the frame portion 124 by an adhesive (for example, a thermosetting adhesive), a case 123 is assembled.

In the second embodiment, the terminals P, N, OUT are lead out laterally after being inserted through the side plates 126, 127. For this reason, the frame portion 124 cannot be assembled in advance before bonding the terminals P, N, OUT to the first and second board assemblies 20, 40. Therefore, the terminals P, N, OUT are soldered and bonded to the first and second board assemblies 20, 40, and then the frame portion 124 is assembled. After the terminals P, N, OUT are bonded to the first and second board assemblies 20, 40, the pair of end plates 128, 129 are adhered to both end portions (Y direction both end portions) of the heat radiating base 2 by use of an adhesive (for example, a thermosetting adhesive). Next, the side plate 126 is made to approach the heat radiating base 2 from the +X direction, the output terminal OUT is inserted through the slit-shaped insertion hole 140, and then the side plate 126 is fixed to the endplates 128, 129 by the bolts 135. Further, the side plate 127 is made to approach the heat radiating base 2 from the −X direction, the first and second power supply terminals P, N are inserted through the slit-shaped insertion holes 141, 142, respectively, and then the side plate 127 is fixed to the endplates 128, 129 by the bolts 136. Thereafter, a gel material (not shown. For example, a silicon gel) to maintain insulation between wires is arranged inside the frame portion 124. Then, the top plate 125 is adhered to the frame portion 124, so that the case 123 is sealed. Thereafter, a heating treatment to set the adhesive may be performed as necessary.

In order to realize a lateral lead-out terminal-type power module, it may be considered to integrate in advance the terminals P, N, OUT into the frame portion 124 by insert molding. In this case, the frame portion 124 is not necessarily be an assembly, and can be formed of an integrally molded piece. However, if such a configuration is adopted, the frame portion 124 and an adhesive to adhere the frame portion 124 to the heat radiating base 2 must withstand a high temperature when the terminals P, N, OUT is soldered. For this reason, it becomes difficult to select the material of the frame portion 124 and select an adhesive. Therefore, as described above, it is preferable to provide the frame portion 124 as an assembly, and fix the frame portion 124 to the heat radiating base 2 after solder bonding of the terminals P, N, OUT.

In addition, preparation of the first and second board assemblies 20, 40, mounting of these onto the heat radiating base 2, and bonding of the terminals P, N, OUT can be performed by the same procedures (procedures 1 to 3 described above) as in the case of the first embodiment described above.

Also in the second embodiment, the same structure as in the first embodiment described above is adopted for stable holding of the gate terminals G1, G2 and the source sense terminals SS1, SS2 (refer to FIG. 6A and FIG. 6B). However, in the second embodiment, pedestals 110 are fixed to X direction-side end portions of the end plates 128, 129. The pedestals 110 may be integrally molded with the end plates 128, 129.

[Terminal Variations]

FIG. 12 to FIG. 30 are perspective views for explaining various variations of the terminals P, N, OUT. In these figures, corresponding parts of the parts shown in FIG. 1 to FIG. 11 described above are denoted by the same reference signs.

Figure 12:
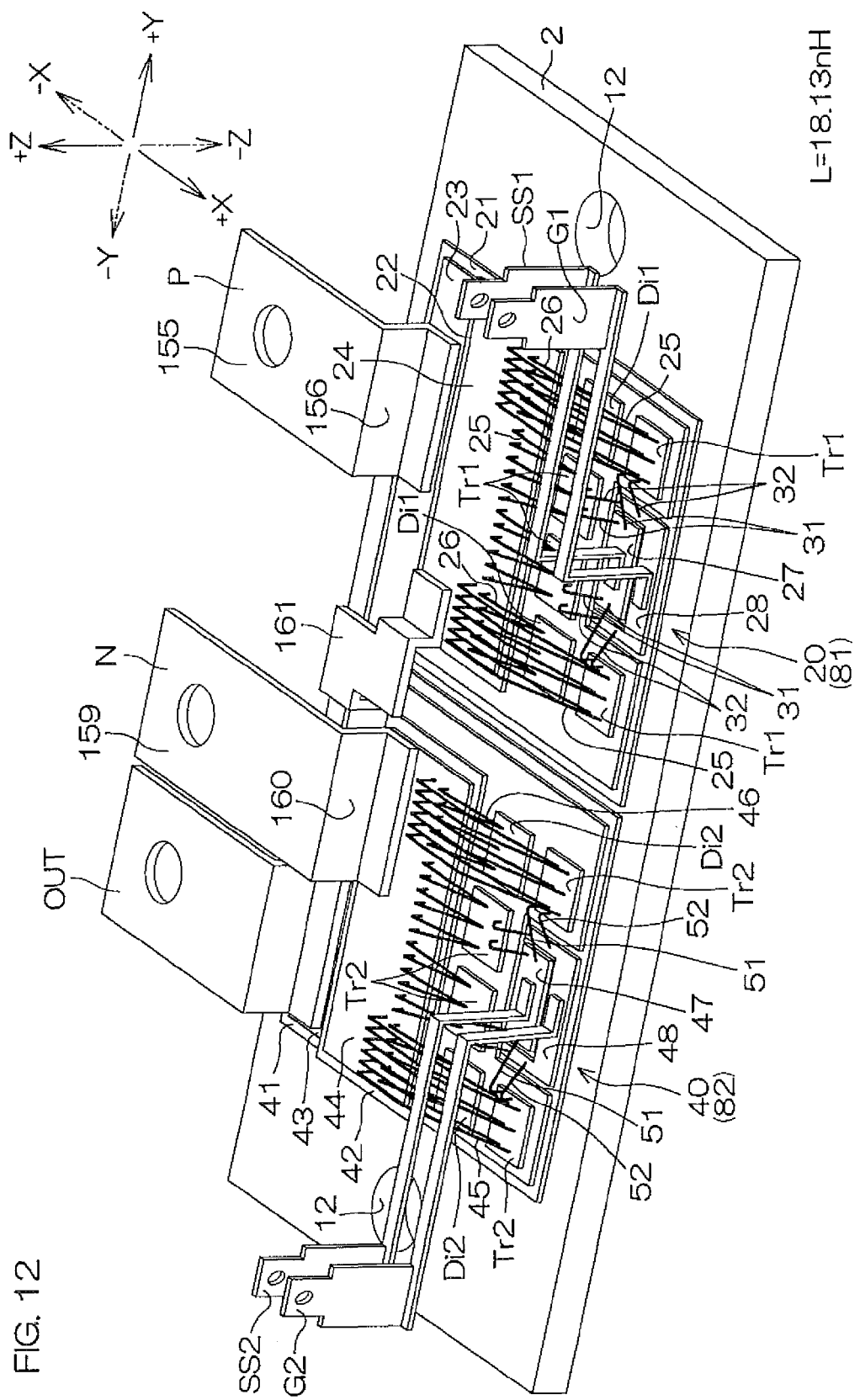
FIG. 12 is a perspective view for explaining a variation of terminals.

In a configuration example of FIG. 12, the terminals P, N, OUT are led out to one side (−X direction) parallel to the principal surface of the heat radiating base 2. The output terminal OUT is arranged closer to the −Y direction than the second power supply terminal N, and has a connecting portion 161 bonded to the first upper conductor layer 24 after passing below the second power supply terminal N (−Z direction side. Second lower board 41 side). The connecting portion 161 connects the first upper conductor layer 24 and the second lower conductor layer 43. The leg portion 156 of the first power supply terminal P is formed with a width substantially equal to that of the main body portion 155, and similarly, the leg portion 160 of the second power supply terminal N is formed with a width substantially equal to that of its main body portion 159. In this configuration, the lengths of not only the first and second power supply terminals P, N but also the output terminal OUT are reduced, and thus the inductance can be further reduced. With regard to this configuration, an inductance calculated for the upper arm circuit 81 (first board assembly 20) in response to a signal of a frequency of 1 MHz was 18.13 nH.

Figure 13:
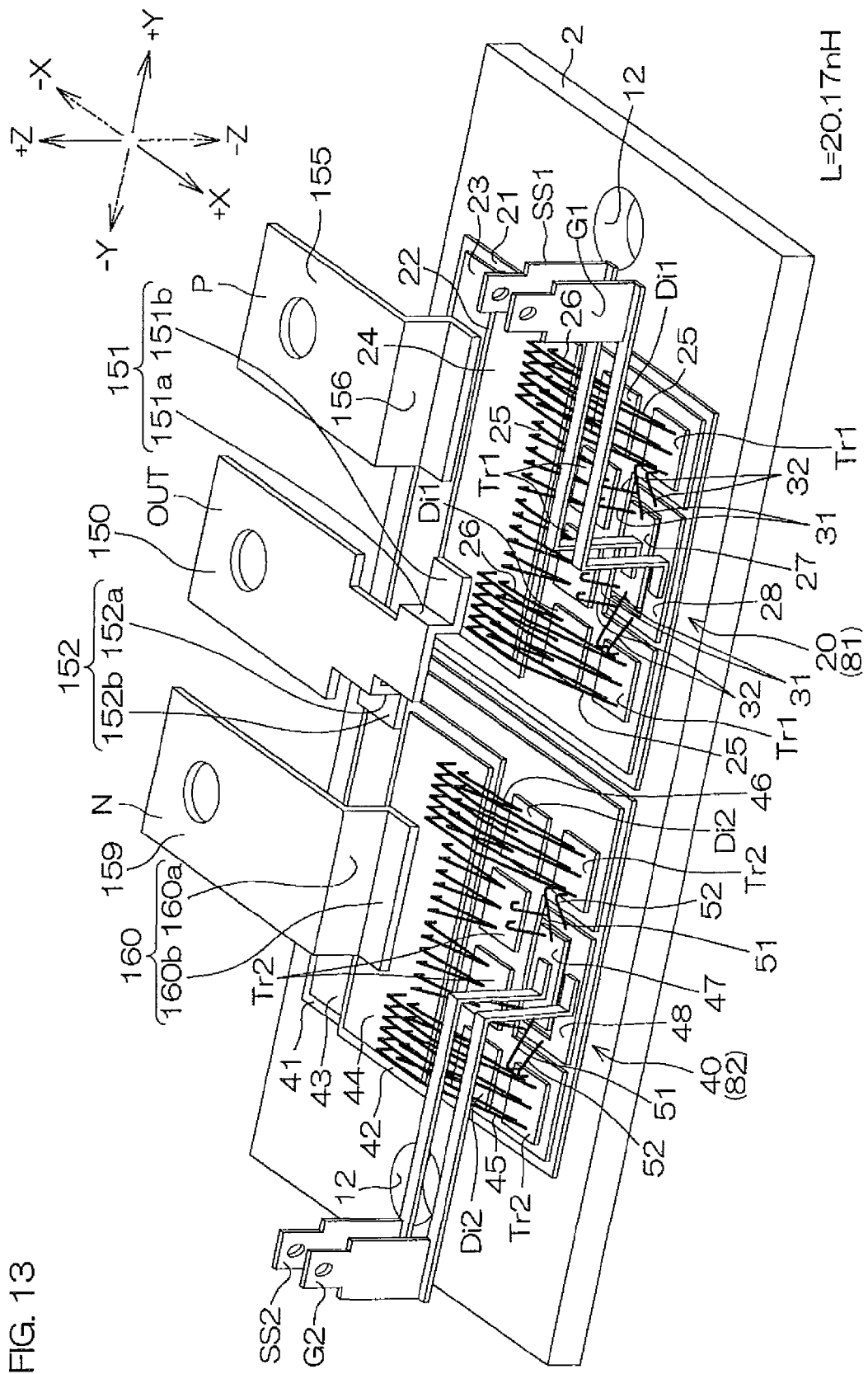
FIG. 13 is a perspective view for explaining a variation of terminals.

In a configuration example of FIG. 13, the output terminal OUT is arranged between the first and second power supply terminals P, N, and this configuration example is similar to the second embodiment described above. However, the output terminal OUT is, together with the first and second power supply terminals P, N, led out to one side (−X direction) parallel to the principal surface of the heat radiating base 2. However, the main body portion 150 of the output terminal OUT is formed with a narrow width at its base end side. Accordingly, the connection path length of an interconnection between the first and second board assemblies 20, 40 via the output terminal OUT is reduced. The leg portion 156 of the first power supply terminal P is formed with a width substantially equal to that of the main body portion 155, and similarly, the leg portion 160 of the second power supply terminal N is formed with a width substantially equal to that of its main body portion 159. In this configuration, the lengths of the terminals P, N, OUT are shortened, and further the interconnection path length between the first and second board assemblies 20, 40 is reduced, and thus the inductance is reduced accordingly. Additionally, the path of a current that flows in from the power supply terminal P and flows out to the output terminal OUT and the path of a current that flows in from the output terminal OUT and flows out from the power supply terminal N do not cross each other within the output terminal OUT. Also whereby, the inductance can be reduced. With regard to this configuration, an inductance calculated for the upper arm circuit 81 (first board assembly 20) in response to a signal of a frequency of 1 MHz was 20.17 nH.

Figure 14:
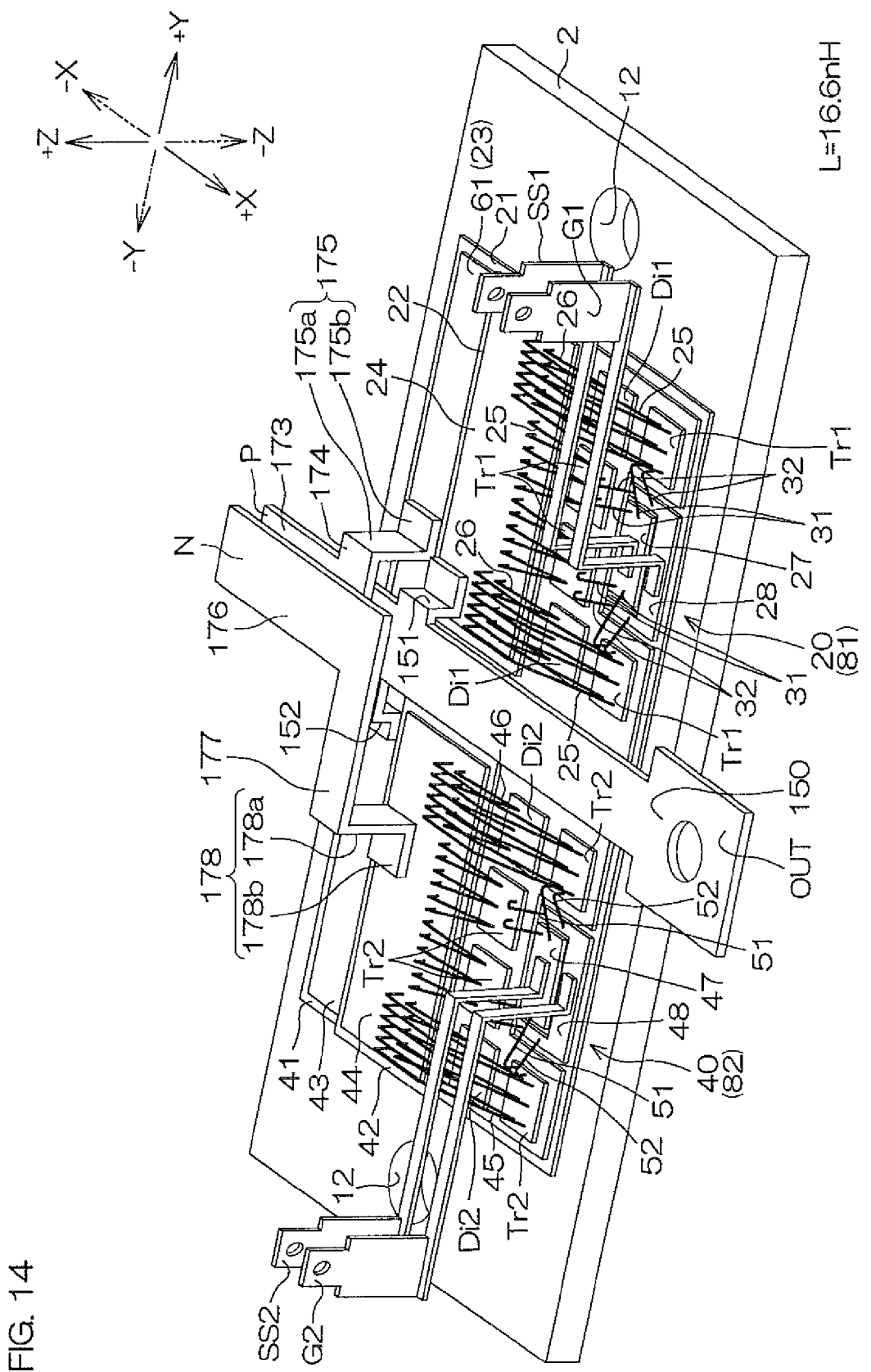
FIG. 14 is a perspective view for explaining a variation of terminals.

In a configuration example of FIG. 14, the first and second power supply terminals P, N and the output terminal OUT are all led out in directions parallel to the principal surface of the heat radiating base 2, and further, the first and second power supply terminals P, N overlap each other across a minute distance from each other. More specifically, the output terminal OUT includes a main body portion 150 extending in the X direction along a boundary region between the first and second board assemblies 20, 40. The main body portion 150 is a band-shaped plate-like body parallel to the principal surface of the heat radiating base 2, and its front end portion (a +X direction-side end portion) is led out in the +X direction. Moreover, the main body portion 150 is formed with a narrower width at the majority of the region to be housed inside the case than that of its connection end to be led out outside the case. In a base end portion (a −X direction-side end portion) of the main body portion 150, a leg portion 151 bonded to the first upper conductor layer 24 is formed at one side edge (a +Y direction-side side edge). At the other side edge (a −Y direction-side side edge) of the base end portion, a leg portion 152 bonded to the second lower conductor layer 43 is formed.

The first power supply terminal P has a main body portion 173 arranged behind (−X direction side) the main body portion 150 of the output terminal OUT. The main body portion 173 extends in the X direction, and its front end portion (−X direction-side end portion) is led out in the −X direction. The main body portion 173 is formed of a band-shaped plate-like body parallel to the principal surface of the heat radiating base 2. On a base end portion side (a +X direction-side end portion) of the main body portion 173, a transverse portion 174 extending in the +Y direction toward the first board assembly 20 side is formed. The transverse portion 174 is formed of a band-shaped plate-like body parallel to the principal surface of the heat radiating base 2. At a front end edge (a +Y direction-side end edge) of the transverse portion 174, a leg portion 175 drooping toward the heat radiating base 2 and bonded to the first terminal bonding area 61 of the first lower conductor layer 23 is formed. The leg portion 175 is formed by bending a band-shaped plate-like body into an L-shape, and has a drooping portion 175a extending in the Z direction, and a bonding portion 175b extending in the +Y direction from a lower end (a −Z direction-side end) of the drooping portion 175a. The bonding portion 175b is bonded to the first terminal bonding area 61. The drooping portion 175a is made of a plate-like body parallel to a plane (an X-Z plane) along the X direction and the Z direction, and the bonding portion 175b is made of a plate-like body parallel to the principal surface of the heat radiating base 2.

The second power supply terminal N has a main body portion 176 arranged, behind (−X direction side) the main body portion 150 of the output terminal OUT, with a minute interval (for example, 1 mm) kept above the first power supply terminal P. The main body portion 176 extends in the X direction, and its front end portion (−X direction-side end portion) is led out in the −X direction. The main body portion 176 is formed of a band-shaped plate-like body parallel to the principal surface of the heat radiating base 2. The majority (approximately 75% level) of the region at a front end portion side (a −X direction side) in the main body portion 176 overlaps the main body portion 173 of the first power supply terminal P. More specifically, the main body portions 173, 176 of the first and second power supply terminals P, N have substantially equal widths (widths in the Y direction. For example, 6 mm), are parallel to each other, and face each other with a minute interval kept in the Z direction. The main body portions 173, 176 are led out toward the −X direction up to substantially the same positions in a plan view.

A base end portion (a +X direction-side end portion) of the main body portion 176 extends in the +X direction beyond the main body portion 173 of the first power supply terminal P. To the base end portion, a transverse portion 177 extending in the −Y direction toward the second board assembly 40 side is joined. The transverse portion 177 is formed of a band-shaped plate-like body parallel to the principal surface of the heat radiating base 2. At a front end edge (a −Y direction-side end edge) of the transverse portion 177, a leg portion 178 drooping toward the heat radiating base 2 and bonded to the second upper conductor layer 44 is formed. The leg portion 178 is formed by bending a band-shaped plate-like body into an L-shape, and has a drooping portion 178a extending in the Z direction, and a bonding portion 178b extending in the −Y direction from a lower end (a −Z direction-side end) of the drooping portion 178a. The bonding portion 178b is bonded to the second upper conductor layer 44. The drooping portion 178a is made of a band-shaped plate-like body parallel to a plane (an X-Z plane) along the X direction and the Z direction, and the bonding portion 178b is made of a band-shaped plate-like body parallel to the principal surface of the heat radiating base 2.

In this configuration example, the first and second power supply terminals P, N where currents flow in reverse directions to each other overlap each other with a minute interval kept therebetween, and thus their currents cancel out each other's inductance. Accordingly, the inductance can be reduced. Moreover, because the output terminal OUT is formed with a narrow width in the case, the interconnection path length between the first and second board assemblies 20, 40 is reduced, whereby also the inductance is reduced. With regard to this configuration, an inductance calculated for the upper arm circuit 81 (first board assembly 20) in response to a signal of a frequency of 1 MHz was 16.6 nH.

Figure 15:
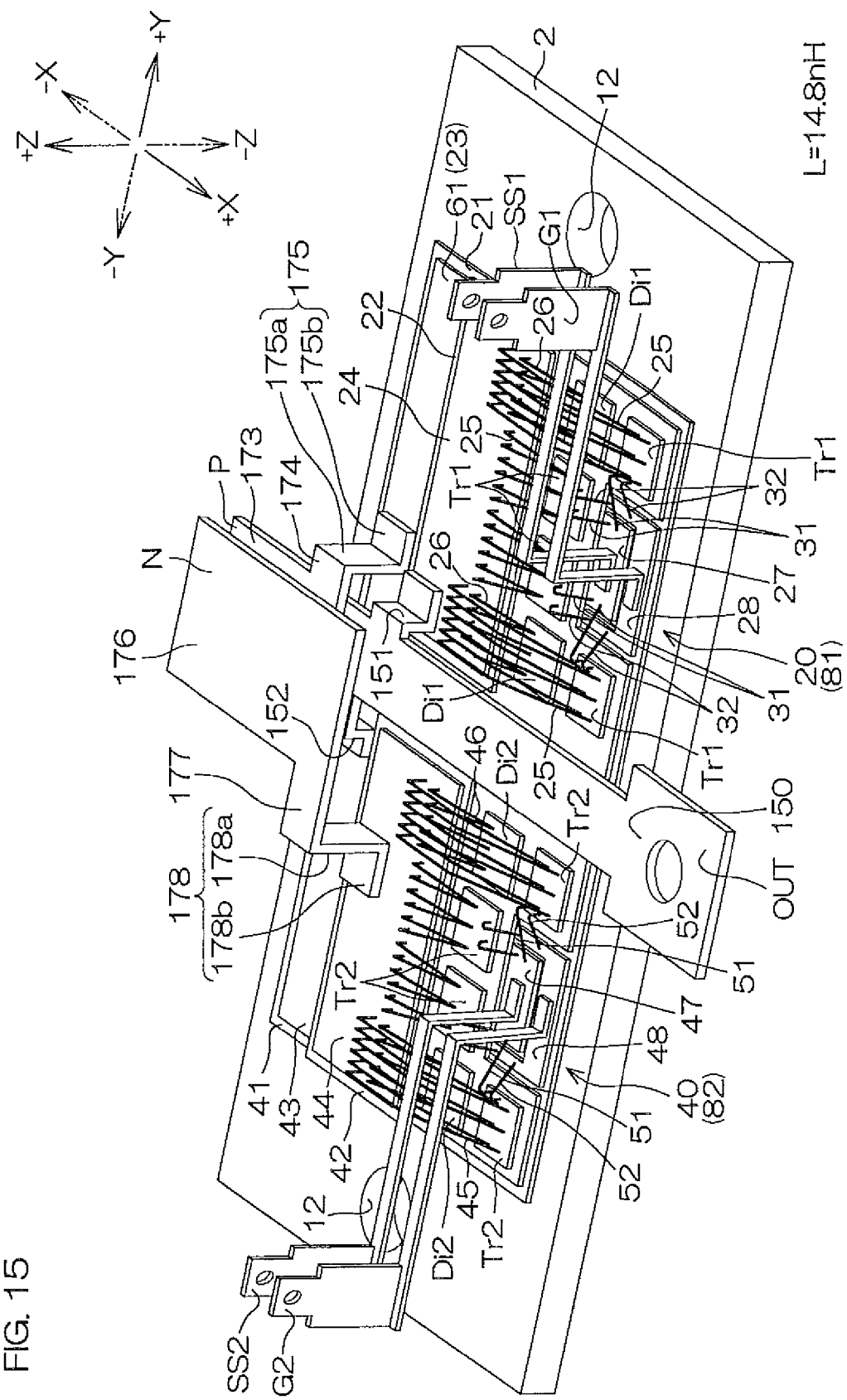
FIG. 15 is a perspective view for explaining a variation of terminals.

A configuration example of FIG. 15 is similar to the configuration example of FIG. 14. In this configuration example, the widths (widths in the Y direction) of the first and second power supply terminals P, N are provided wider (for example, 12 mm) than in the case of the configuration example of FIG. 14. The transverse portions 174, 177 are shortened accordingly. With regard to this configuration, an inductance calculated for the upper arm circuit 81 (first board assembly 20) in response to a signal of a frequency of 1 MHz was 14.8 nH. That is, in comparison with the configuration example of FIG. 14, the inductance was reduced by approximately 1 nH.

Figure 16:
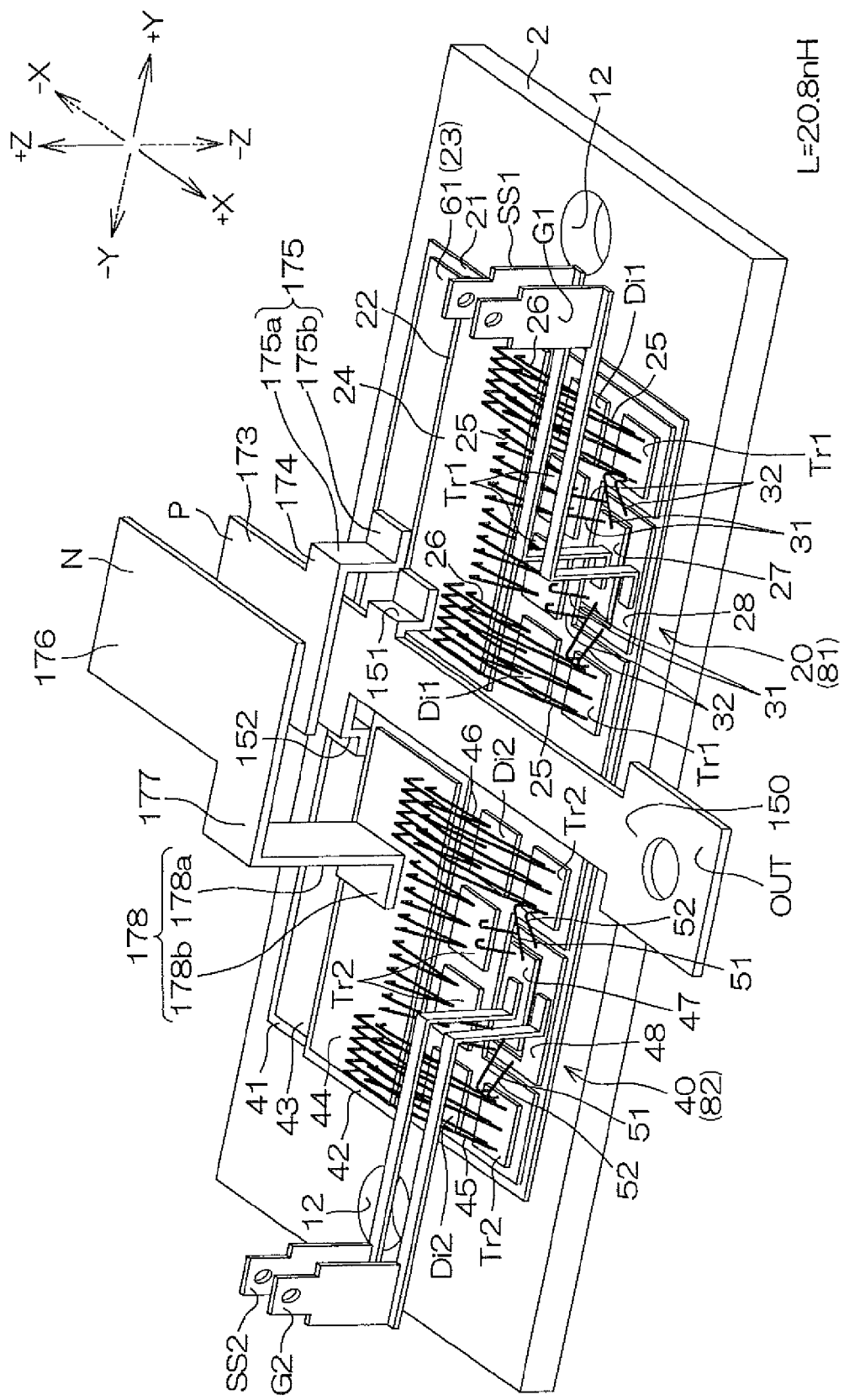
FIG. 16 is a perspective view for explaining a variation of terminals.

A configuration example of FIG. 16 is a variation of the configuration example of FIG. 15, and the interval between the first and second power supply terminals P, N (interval in the Z direction) is provided wide (for example, 5 mm). With regard to this configuration, an inductance calculated for the upper arm circuit 81 (first board assembly 20) in response to a signal of a frequency of 1 MHz was 20.8 nH. Therefore, it could be understood that the narrower the interval between the first and second power supply terminals P, N, the more advantageous for a reduction in inductance.

Figure 17:
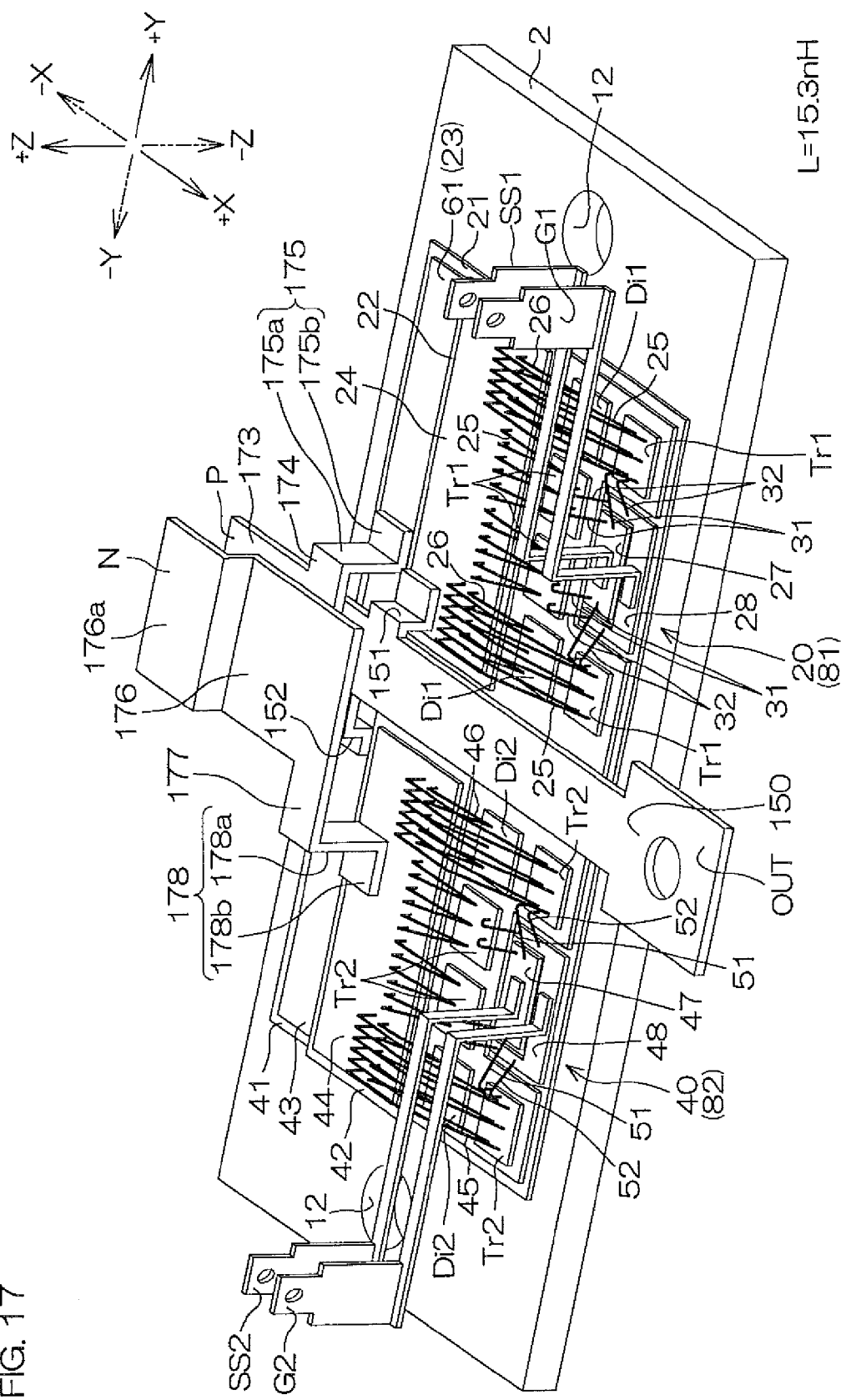
FIG. 17 is a perspective view for explaining a variation of terminals.

A configuration example of FIG. 17 is a variation of the configuration example of FIG. 15, and only a front end portion (a −X direction-side end portion) 176a is lifted in the main body portion 176 of the second power supply terminal N. That is, a region at a base end portion side of the main body portion 176 of the second power supply terminal N is arranged with a minute interval (for example, 1 mm) kept with respect to the main body portion 173 of the first power supply terminal P. On the other hand, the front end portion 176a of the second power supply terminal N is arranged with a relatively large interval (for example, 5 mm) kept with respect to the main body portion 173 of the first power supply terminal P. This structure has an advantage of making external connection (for example, a bus bar connection) to the first and second power supply terminals P, N easy. With regard to this configuration, an inductance calculated for the upper arm circuit 81 (first board assembly 20) in response to a signal of a frequency of 1 MHz was 15.3 nH. Therefore, it could be understood that an inductance reducing effect can be obtained by overlapping the first and second power supply terminals P, N with a minute interval even in a partial region.

Figure 18:
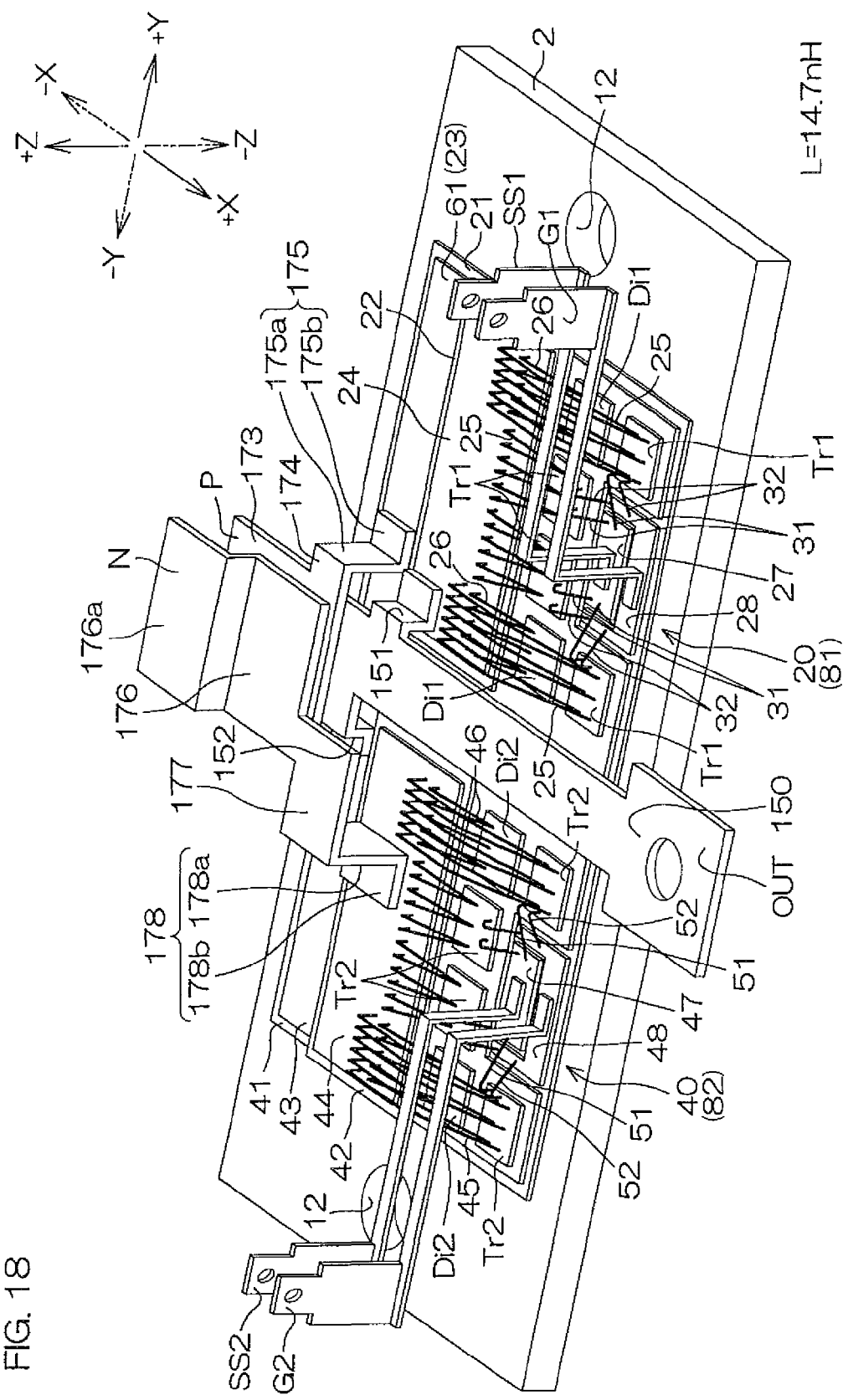
FIG. 18 is a perspective view for explaining a variation of terminals.

A configuration example of FIG. 18 is a variation of the configuration example of FIG. 17, and a base end portion side (a +X direction side) of the second power supply terminal N is cut away to eliminate an overlapping part with the output terminal OUT. The transverse portion 177 has an L-shape that extends in the +X direction from a part closer to the −Y direction of the base end portion of the main body portion 176 to reach above the second upper conductor layer 44, and is then bent in the −Y direction. In this configuration example, the bonding portion 178b of the leg portion 178 is formed wide in width (width in the X direction), and is therefore bonded to the second upper conductor layer 44 with a large area (footprint). With regard to this configuration, an inductance calculated for the upper arm circuit 81 (first board assembly 20) in response to a signal of a frequency of 1 MHz was 14.7 nH. It can be understood from this result that the inductance can be reduced by reducing an overlapping part between the second power supply terminal N and the output terminal OUT.

Figure 19:
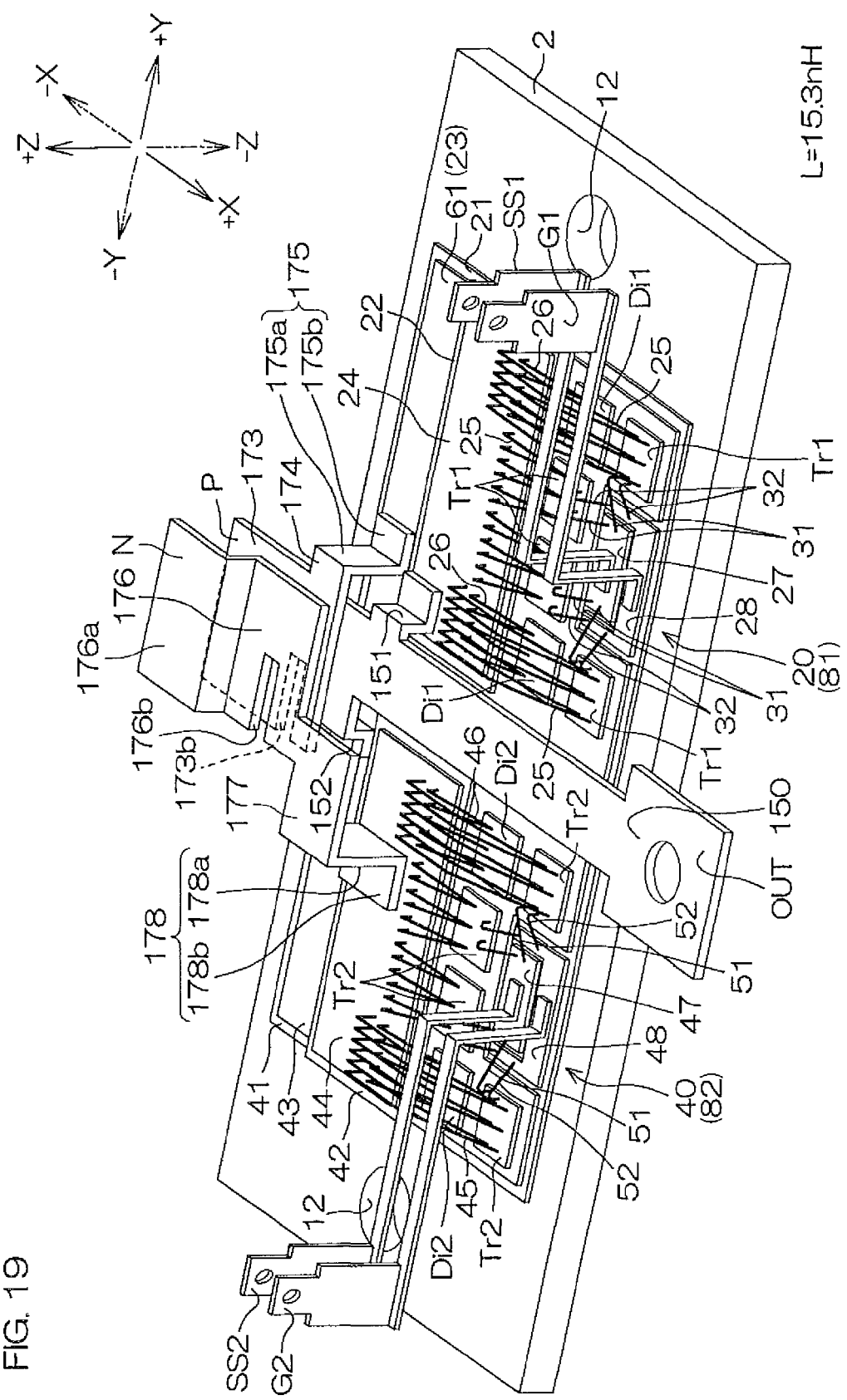
FIG. 19 is a perspective view for explaining a variation of terminals.

A configuration example of FIG. 19 is a variation of the configuration example of FIG. 18. In this configuration, a cut 176b for current confinement is formed, in the main body portion 176 of the second power supply terminal N, at a region facing the main body portion 173 of the first power supply terminal P with a minute interval. The cut 176b is linearly formed along the +Y direction from a side edge on the second board assembly 40 side toward the first board assembly 20. Also in the main body portion 173 of the first power supply terminal P, a cut 173b in the same shape is formed at a position facing the cut 176b. Due to such a configuration, the directions of currents that flow in the first and second power supply terminals P, N can be approximated to be parallel (to be exact, antiparallel), so that the inductance canceling effect can be enhanced. With regard to this configuration, an inductance calculated for the upper arm circuit 81 (first board assembly 20) in response to a signal of a frequency of 1 MHz was 15.3 nH.

Figure 20:
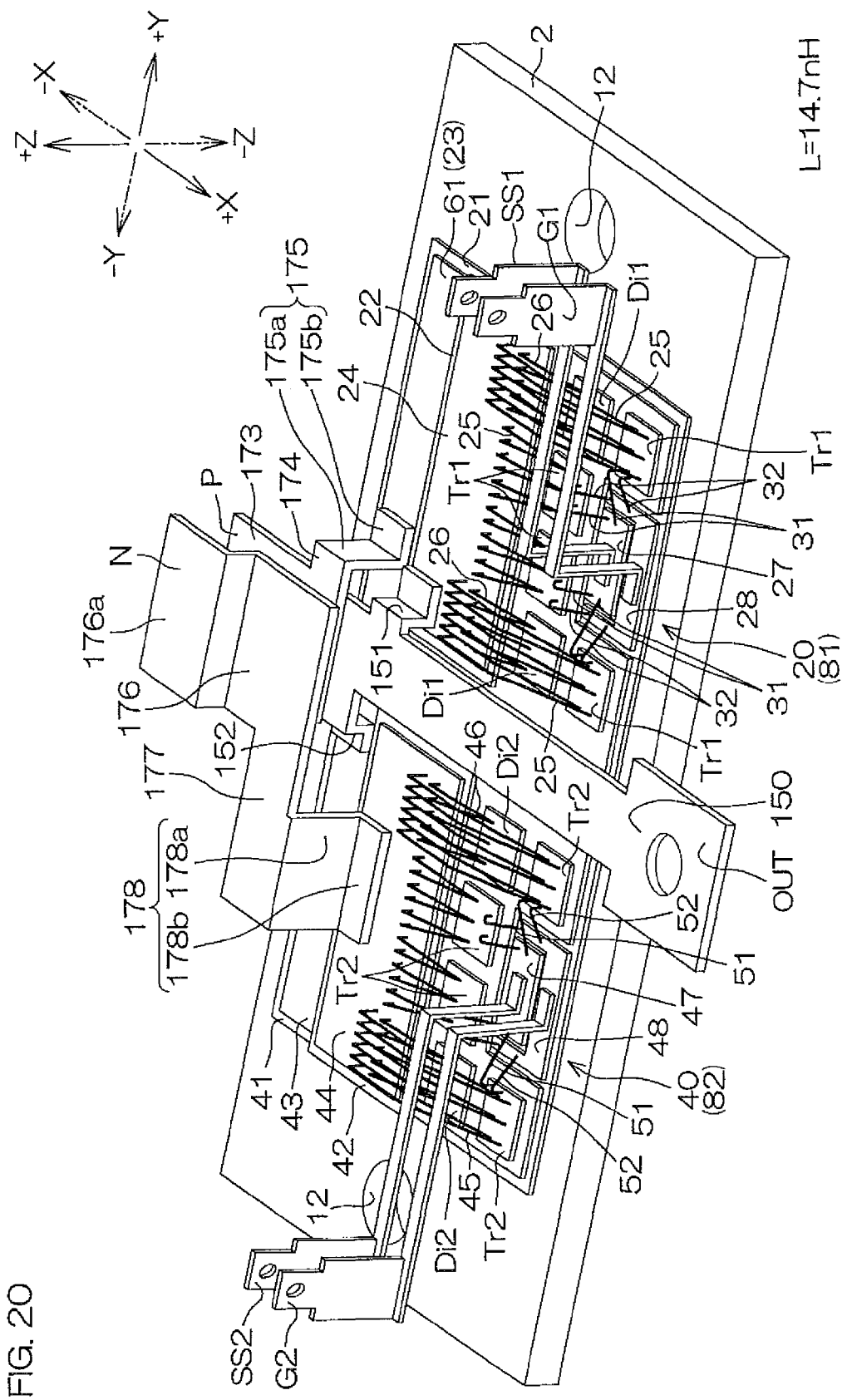
FIG. 20 is a perspective view for explaining a variation of terminals.

A configuration example of FIG. 20 is a variation of the configuration example of FIG. 18. In this configuration, the transverse portion 177 extends in the −Y direction from a side edge of the base end portion of the main body portion 176. The leg portion 178 droops from a +X direction-side edge portion of the transverse portion 177. That is, the drooping portion 178a of the leg portion 178 is formed parallel to a plane (a Y-Z plane) along the Y direction and the Z direction. The bonding portion 178b is joined to a lower edge of the drooping portion 178a. The bonding portion 178b, in this configuration example, has a rectangular shape long in the Y direction. With regard to this configuration, an inductance calculated for the upper arm circuit 81 (first board assembly 20) in response to a signal of a frequency of 1 MHz was 14.7 nH.

Figure 21:
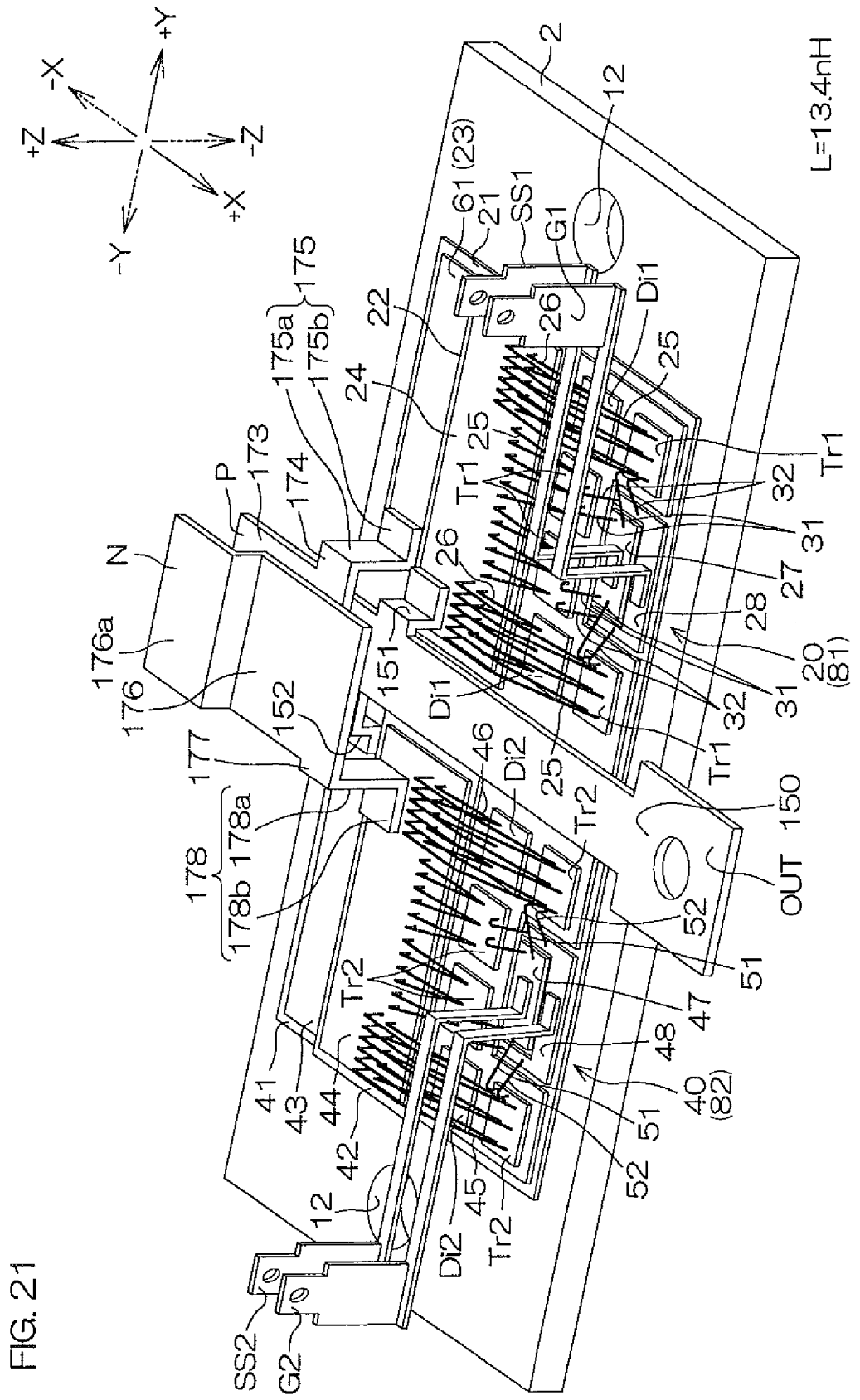
FIG. 21 is a perspective view for explaining a variation of terminals.

A configuration example of FIG. 21 is a variation of the configuration example of FIG. 17. For this configuration example, the transverse portion 177 of the second power supply terminal N is shortened (more preferably, eliminated), and at a marginal portion (a +Y direction-side marginal portion) of the second upper conductor layer 44 closer to the first board assembly 20, the leg portion 178 is bonded to the second upper conductor layer 44. Accordingly, the current path through the second power supply terminal N is shortened, which can thus contribute to a reduction in inductance. With regard to this configuration, an inductance calculated for the upper arm circuit 81 (first board assembly 20) in response to a signal of a frequency of 1 MHz was 13.4 nH.

Figure 22:
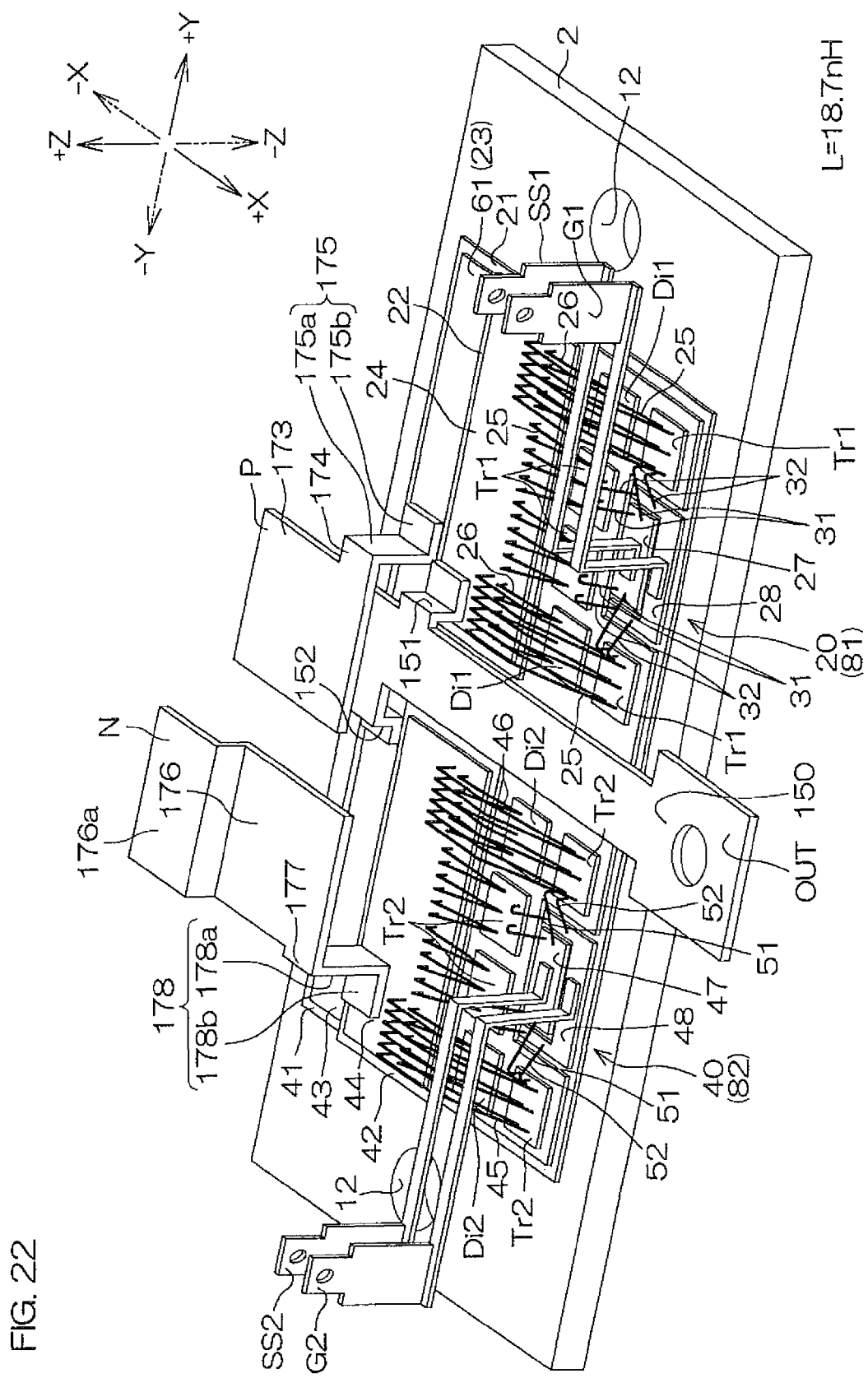
FIG. 22 is a perspective view for explaining a variation of terminals.

A configuration example of FIG. 22 is a variation of the configuration example of FIG. 21. For this configuration example, the second power supply terminal N is moved in the −Y direction, whereby an overlapping region between the first and second power supply terminals P, N is eliminated. The leg portion 178 of the second power supply terminal N is, in the vicinity of a marginal portion (a −Y direction-side marginal portion) of the second upper conductor layer 44 of an opposite side to the first board assembly 20, bonded to the second upper conductor layer 44. With regard to this configuration, an inductance calculated for the upper arm circuit 81 (first board assembly 20) in response to a signal of a frequency of 1 MHz was 18.7 nH.

Figure 23:
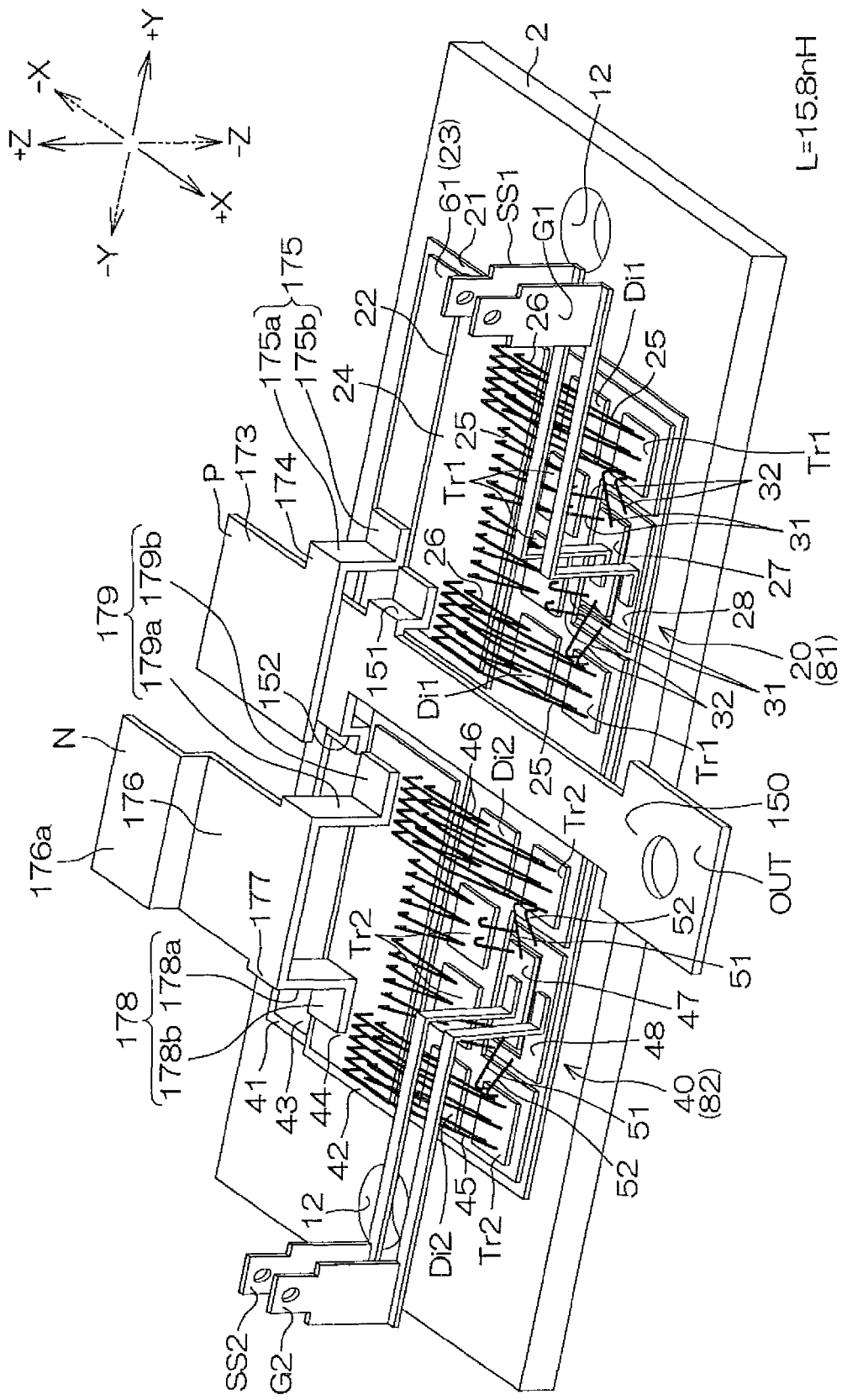
FIG. 23 is a perspective view for explaining a variation of terminals.

A configuration example of FIG. 23 is a variation of the configuration example of FIG. 22. For this configuration example, the second power supply terminal N is provided with a second leg portion 179, in addition to the leg portion 178 described above. The first leg portion 178 is provided at a −Y direction-side edge portion of the main body portion 176, while the second leg portion 179 is provided at a +Y direction-side edge portion of the main body portion 176. The second leg portion 179 includes a drooping portion 179a drooping from the main body portion 176 and a bonding portion 179b joined to a lower end of the drooping portion 179a. The drooping portion 179a is formed of a band-shaped plate-like body parallel to a plane (an X-Z plane) including the X direction and the Z direction. The bonding portion 179b is formed of a band-shaped plate-like body parallel to the principal surface of the heat radiating base 2. The bonding portion 179b is connected to a region in the vicinity of a marginal portion closer to the first board assembly 20 in the second upper conductor layer 44. In this configuration, more current flows to the second leg portion 179 close to the output terminal OUT, so that the current path length can be substantially reduced. Accordingly, the inductance is reduced. With regard to this configuration, an inductance calculated for the upper arm circuit 81 (first board assembly 20) in response to a signal of a frequency of 1 MHz was 15.8 nH.

Figure 24:
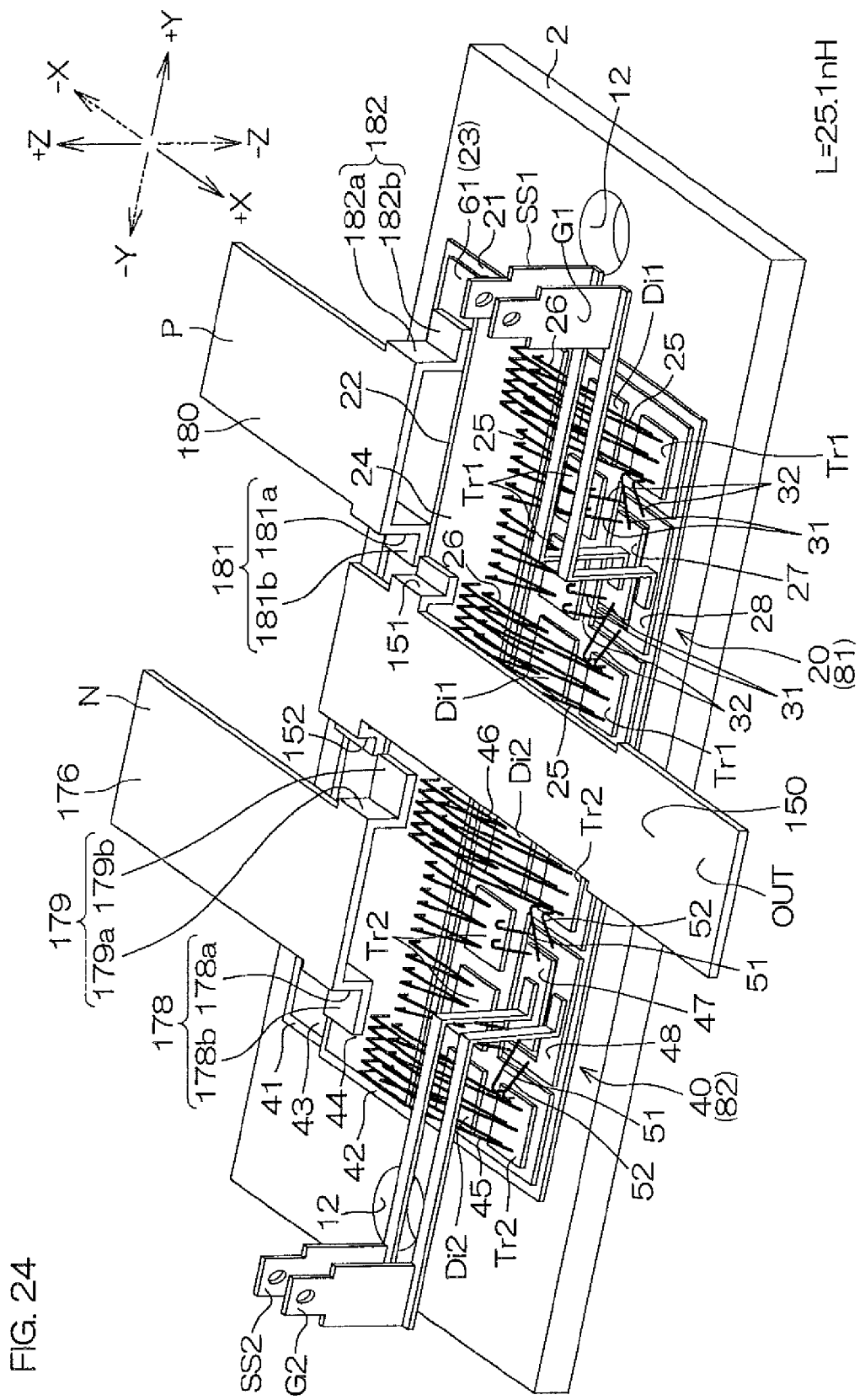
FIG. 24 is a perspective view for explaining a variation of terminals.

A configuration example of FIG. 24 is a variation of the configuration example of FIG. 23. The first power supply terminal P is located further on the first board assembly 20 side (+Y direction side) than the output terminal OUT, and is led out in the −X direction. The power supply terminal P has a main body portion 180 made of a band-shaped plate-like body and first and second leg portions 181 and 182 drooping from both side edges of a base end side (a +X direction side) of the main body portion 180 and bonded to the first lower conductor layer 23. The main body portion 180 is, at substantially the same height position as that of the output terminal OUT, arranged parallel to the principal surface of the heat radiating base 2. The first and second leg portions 181, 182 have drooping portions 181a, 182a drooping from side edges of the main body portion 180 and bonding portions 181b, 182b bent at lower end edges of the drooping portions 181a, 182a, respectively. The drooping portions 181a, 182a are both made of band-shaped plate-like bodies formed along a plane (an X-Z plane) parallel to the X direction and the Z direction, are formed parallel to each other, and face each other in the Y direction. The bonding portions 181b, 182b are made of band-shaped platebodies parallel to the principal surface of the heat radiating base 2, the bonding portion 181b extends in the −Y direction from the lower end edge of the drooping portion 181a, and the bonding portion 182b extends in the +Y direction from a lower end portion of the drooping portion 182a. Therefore, the bonding portion 181b is bonded in the vicinity of a marginal portion on the second board assembly 40 side in a −X direction-side marginal portion of the first lower conductor layer 23, and the bonding portion 182b is bonded in the vicinity of a marginal portion of an opposite side to the second board assembly 40 in a +X direction-side marginal portion of the first lower conductor layer 23. The second power supply terminal N has substantially the same configuration as in the case of the configuration example of FIG. 23, but the first and second leg portions 178, 179 are shorter, and the main body portion 176 is arranged at substantially the same height position as that of the output terminal OUT. The main body portion 176 does not have in its front end portion an offset part to the above (+Z direction), and is in its entirety formed in a flat plate shape parallel to the principal surface of the heat radiating base 2. The main portion 150 of the output terminal OUT is formed in a plate-like body with a substantially uniform width from its base end side to its front end side, and is broader in width than in the case of the configuration example of FIG. 23. With regard to this configuration, an inductance calculated for the upper arm circuit 81 (first board assembly 20) in response to a signal of a frequency of 1 MHz was 25.1 nH.

Figure 25:
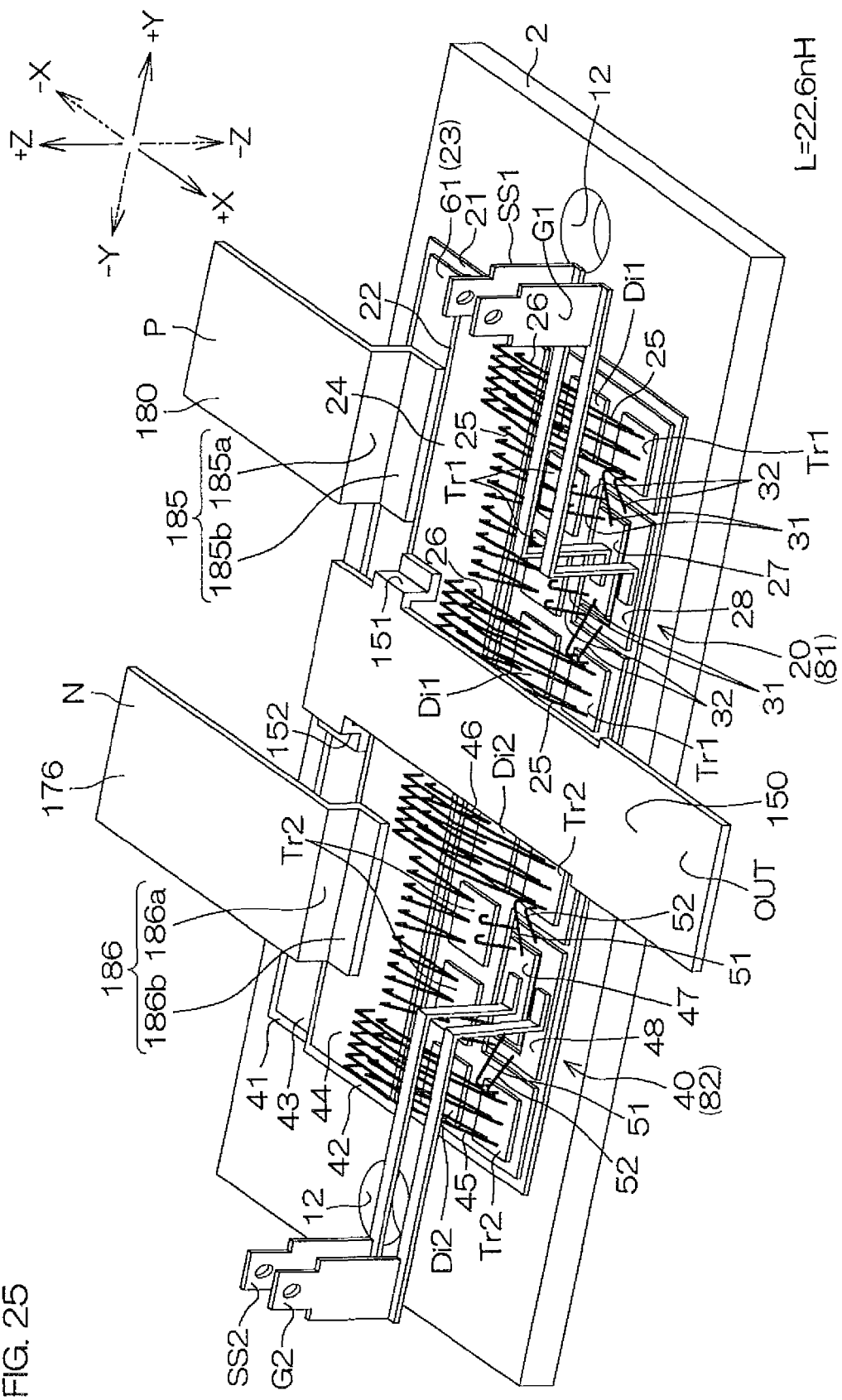
FIG. 25 is a perspective view for explaining a variation of terminals.

A configuration example of FIG. 25 is similar to the configuration example of FIG. 24, but is different in the structure of connecting portions of the first and second power supply terminals P, N. Specifically, the first power supply terminal P is bonded to the first lower conductor layer 23 by a single leg portion 185 drooping from a base end edge (an +X direction-side end portion) of the main body portion 180. The leg portion 185 has a drooping portion 185a substantially the same in width as the main body portion 180 and a bonding portion 185b substantially the same in width as the drooping portion 185a. The drooping portion 185a droops in the −Z direction from the base end edge of the main body portion 180 toward the first lower conductor layer 23, and is made of a band-shaped plate-like body parallel to a plane (a Y-Z plane) including the Y direction and the Z direction. The bonding portion 185b is bent at a right angle from a lower end edge (a −Z direction-side end edge) of the drooping portion 185a toward the +X direction, and is made of a band-shaped plate-like body parallel to the principal surface of the heat radiating base 2. The bonding portion 185b is bonded to the first lower conductor layer 23. Therefore, the bonding width is substantially equal to the width of the first power supply terminal P. The second power supply terminal N also has substantially the same structure. That is, the second power supply terminal N is bonded to the second upper conductor layer 44 by a single leg portion 186 drooping from a base end edge (an +X direction-side end portion) of the main body portion 176. The leg portion 186 has a drooping portion 186a substantially the same in width as the main body portion 176 and a bonding portion 186b substantially the same in width as the drooping portion 186a. The drooping portion 186a droops in the −Z direction from the base end edge of the main body portion 176 toward the second upper conductor layer 44, and is made of a band-shaped plate-like body parallel to a plane (a Y-Z plane) including the Y direction and the Z direction. The bonding portion 186b is bent at a right angle from a lower end edge (a −Z direction-side end edge) of the drooping portion 186a toward the +X direction, and is made of a band-shaped plate-like body parallel to the principal surface of the heat radiating base 2. The bonding portion 186b is bonded to the second upper conductor layer 44. Therefore, the bonding width is substantially equal to the width of the second power supply terminal N. With regard to this configuration, an inductance calculated for the upper arm circuit 81 (first board assembly 20) in response to a signal of a frequency of 1 MHz was 22.6 nH.

Figure 26:
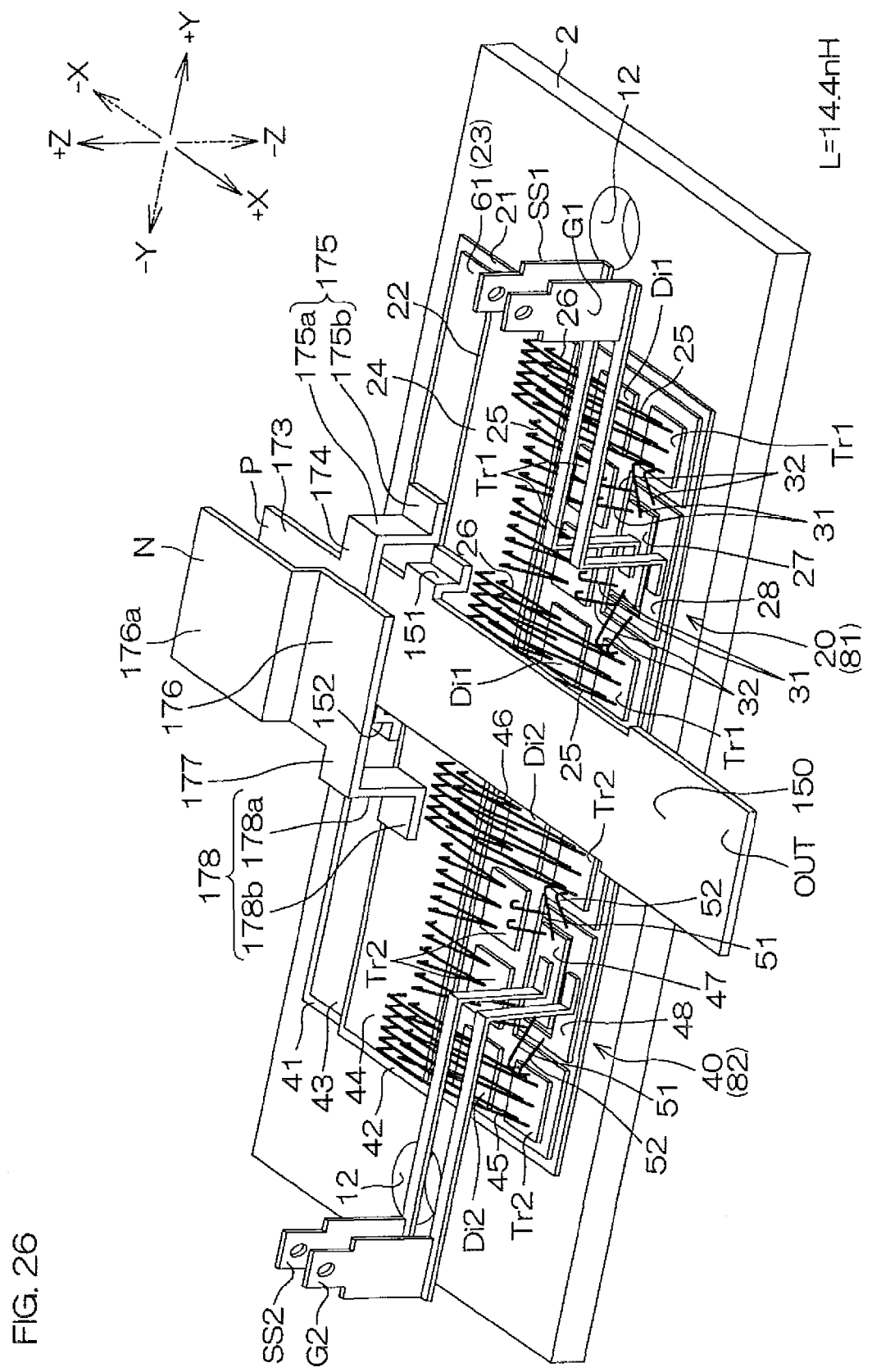
FIG. 26 is a perspective view for explaining a variation of terminals.

A configuration example of FIG. 26 approximates the configuration example of FIG. 21. However, the width of the main body portion 150 of the output terminal OUT is increased, and accordingly, the length of the transverse portion 177 of the second power supply terminal N is slightly longer than that of the configuration example of FIG. 21. Moreover, the length of a part where the main body portion 176 of the second power supply terminal N and the first power supply terminal P overlap with a minute interval (for example, 1 mm) therebetween is shorter than that in the configuration of FIG. 21. More specifically, in the configuration example of FIG. 21, the main body portion 176 of the second power supply terminal N overlaps a region not less than 50% of the main body portion 173 of the first power supply terminal P with a minute interval therebetween. On the other hand, in the configuration example of FIG. 26, the main body portion 176 of the second power supply terminal N overlaps a region less than 50% (for example, approximately 30%) of the main body portion 173 of the first power supply terminal P with a minute interval therebetween. With regard to this configuration, an inductance calculated for the upper arm circuit 81 (first board assembly 20) in response to a signal of a frequency of 1 MHz was 14.4 nH.

Figure 27:
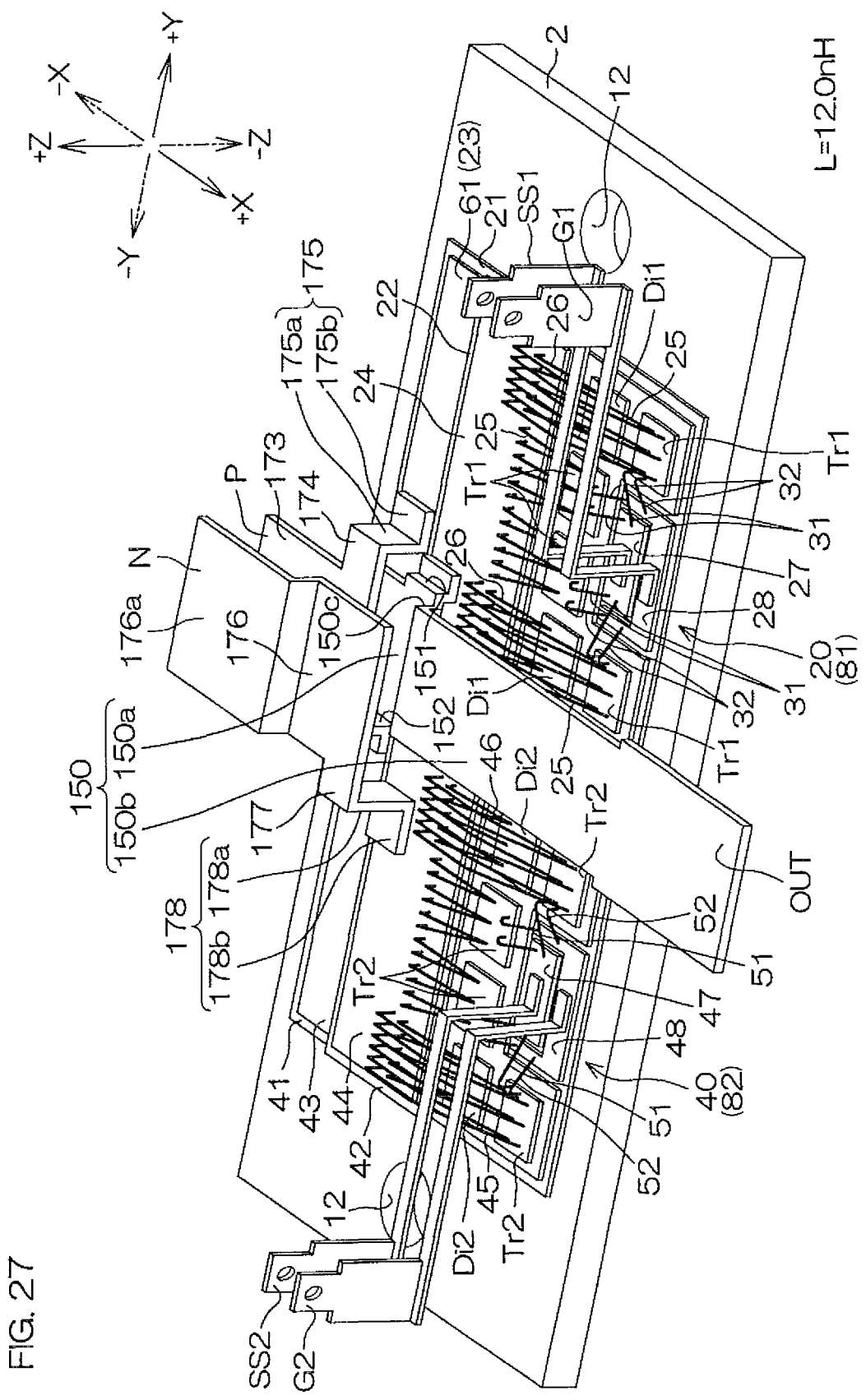
FIG. 27 is a perspective view for explaining a variation of terminals.

A configuration example of FIG. 27 is a variation of the configuration example of FIG. 26. In this configuration example, the heights of the first and second power supply terminals P, N are reduced (reduced by, for example, 2 mm as compared with the configuration example of FIG. 26). Therefore, the main body portion 150 of the output terminal OUT has a low portion 150a with a lower height at its base end portion side (−X direction side), has a high portion 150b further at a +X direction side than the low portion 150a, and has a step portion 150c formed between the low portion 150a and the high portion 150b. The main body portion 173 of the first power supply terminal P is formed with substantially the same height as that of the low portion 150a, and accordingly, the length of the leg portion 175 (length of the drooping portion 175a) is shorter than that in the configuration example of FIG. 26. The main body portion 176 of the second power supply terminal N has, at its base end side (−X direction side), a region formed with substantially the same height as that of the high portion 150b, and the region overlaps the first power supply terminal P with a minute interval (for example, 1 mm) kept therebetween. That is, the step 150c is substantially equal to a sum of the thickness of the main body portion 176 of the second power supply terminal N and the minute interval. According to this configuration, a lead-out position of the second power supply terminal N can be arranged at a position sufficiently lower than a top surface of the case 123 (refer to FIG. 8), which is advantageous in securing the strength (resin stiffness) of the case 123 in the neighborhood of the lead-out position of the second power supply terminal N. Of course, the power module can be reduced in height concurrently. Further, because the lengths of the leg portions 151, 152, 175, 178 of the terminals P, N, OUT are reduced, the current path lengths can be reduced, and the inductance can be accordingly reduced. With regard to this configuration, an inductance calculated for the upper arm circuit 81 (first board assembly 20) in response to a signal of a frequency of 1 MHz was 12.0 nH.

Figure 28:
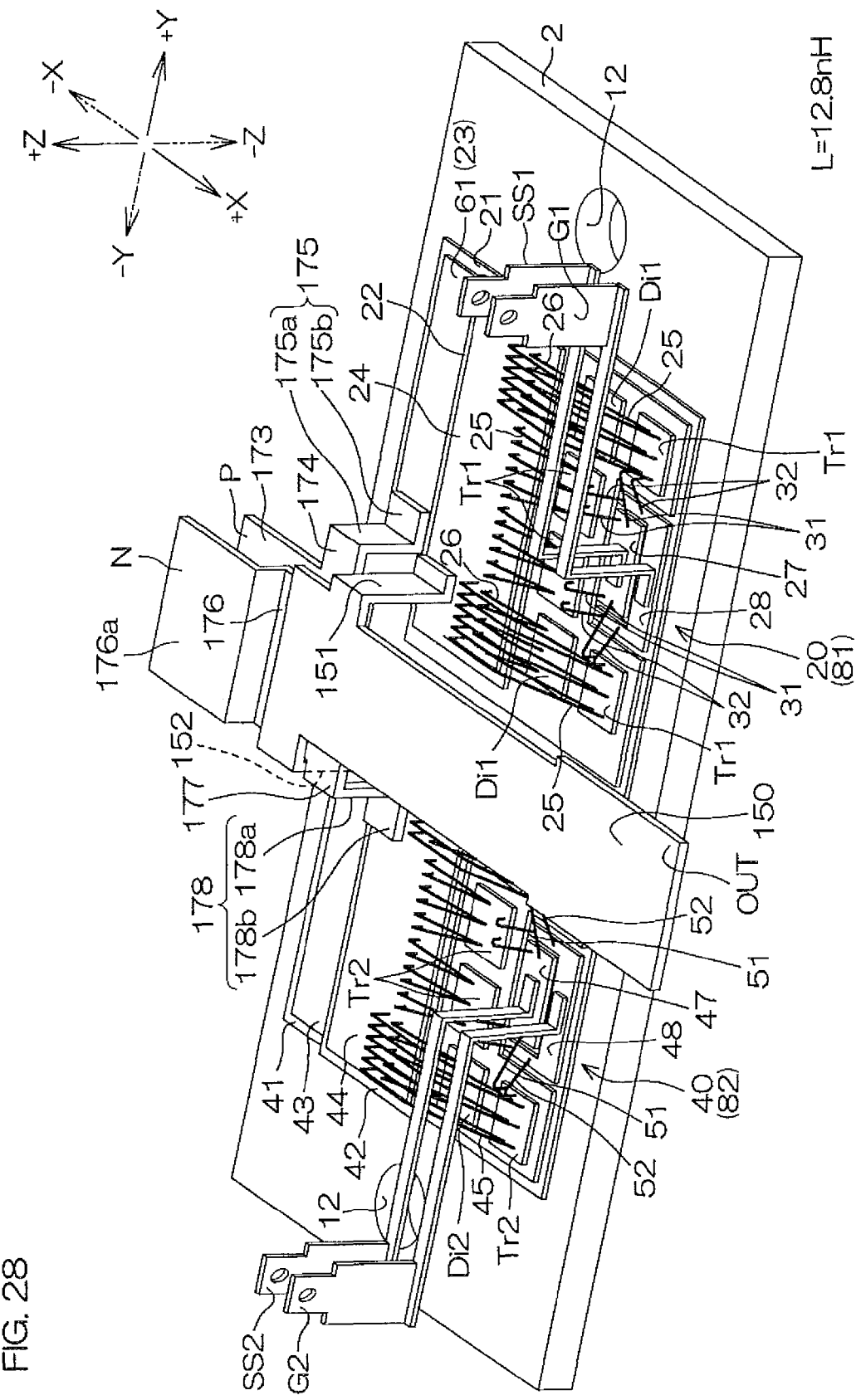
FIG. 28 is a perspective view for explaining a variation of terminals.

A configuration example of FIG. 28 is a variation of the configuration example of FIG. 26. In this configuration example, the main body portion 150 of the output terminal OUT is arranged at a position higher than that of the main body portions 173, 176 of the first and second power supply terminals P, N. Accordingly, the leg portion 175 of the first power supply terminal P and the leg portion 178 of the second power supply terminal N are shortened. The main body portion 150 of the output terminal OUT is, at its base end portion (−X direction side), located above the main body portion 176 (a lower region facing the first power supply terminal P with a minute clearance) of the second power supply terminal N, and overlaps the main body portion 176. Because it is not necessary for the second power supply terminal N to evade the output terminal OUT, the length of its transverse portion 177 can be provided as the minimum distance (preferably, zero). Thus, the current path lengths of the first and second power supply terminals P, N are reduced, so that the inductance can be reduced. With regard to this configuration, an inductance calculated for the upper arm circuit 81 (first board assembly 20) in response to a signal of a frequency of 1 MHz was 12.8 nH.

Figure 29:
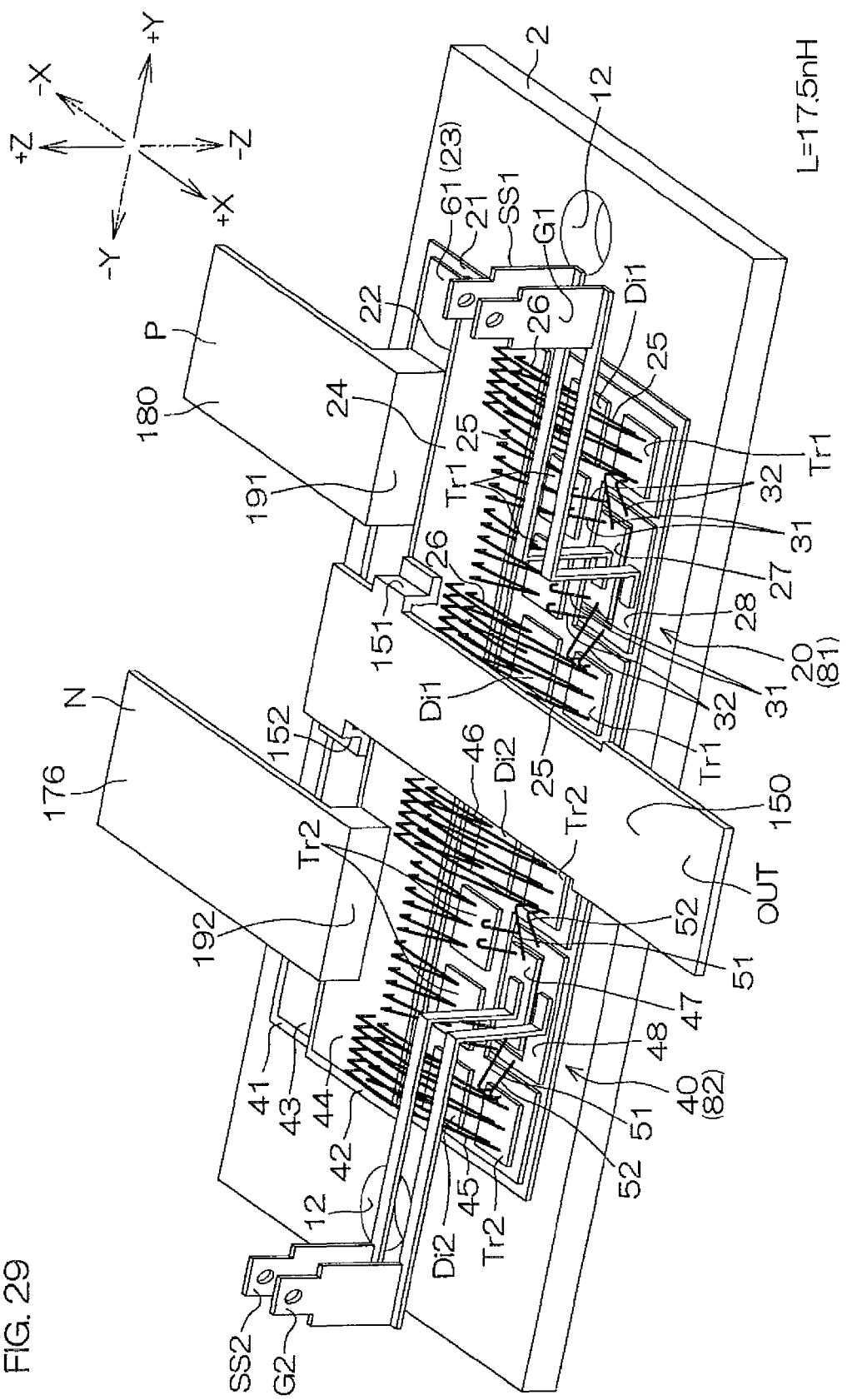
FIG. 29 is a perspective view for explaining a variation of terminals.

A configuration example of FIG. 29 is a variation of the configuration example of FIG. 25. In this configuration example, the first power supply terminal P is bonded to the first lower conductor layer 23 by a block-shaped leg portion 191 drooping from the base end edge (X direction-side end portion) of the main body portion 180. The leg portion 191 has a rectangular parallelepiped shape substantially the same in width as the main body portion 180, and a bottom surface of the leg portion 191 is bonded to the first lower conductor layer 23. Therefore, the bonding width is substantially equal to the width of the main body portion 180. The second power supply terminal N also has substantially the same structure. That is, the second power supply terminal N is bonded to the second upper conductor layer 44 by a block-shaped leg portion 192 drooping from the base end edge (X direction-side end portion) of the main body portion 176. The leg portion 192 has a rectangular parallelepiped shape substantially the same in width as the main body portion 176, and a bottom surface of the leg portion 192 is bonded to the second upper conductor layer 44. Therefore, the bonding width is substantially equal to the width of the main body portion 176. With regard to this configuration, an inductance calculated for the upper arm circuit 81 (first board assembly 20) in response to a signal of a frequency of 1 MHz was 17.5 nH.

Figure 30:
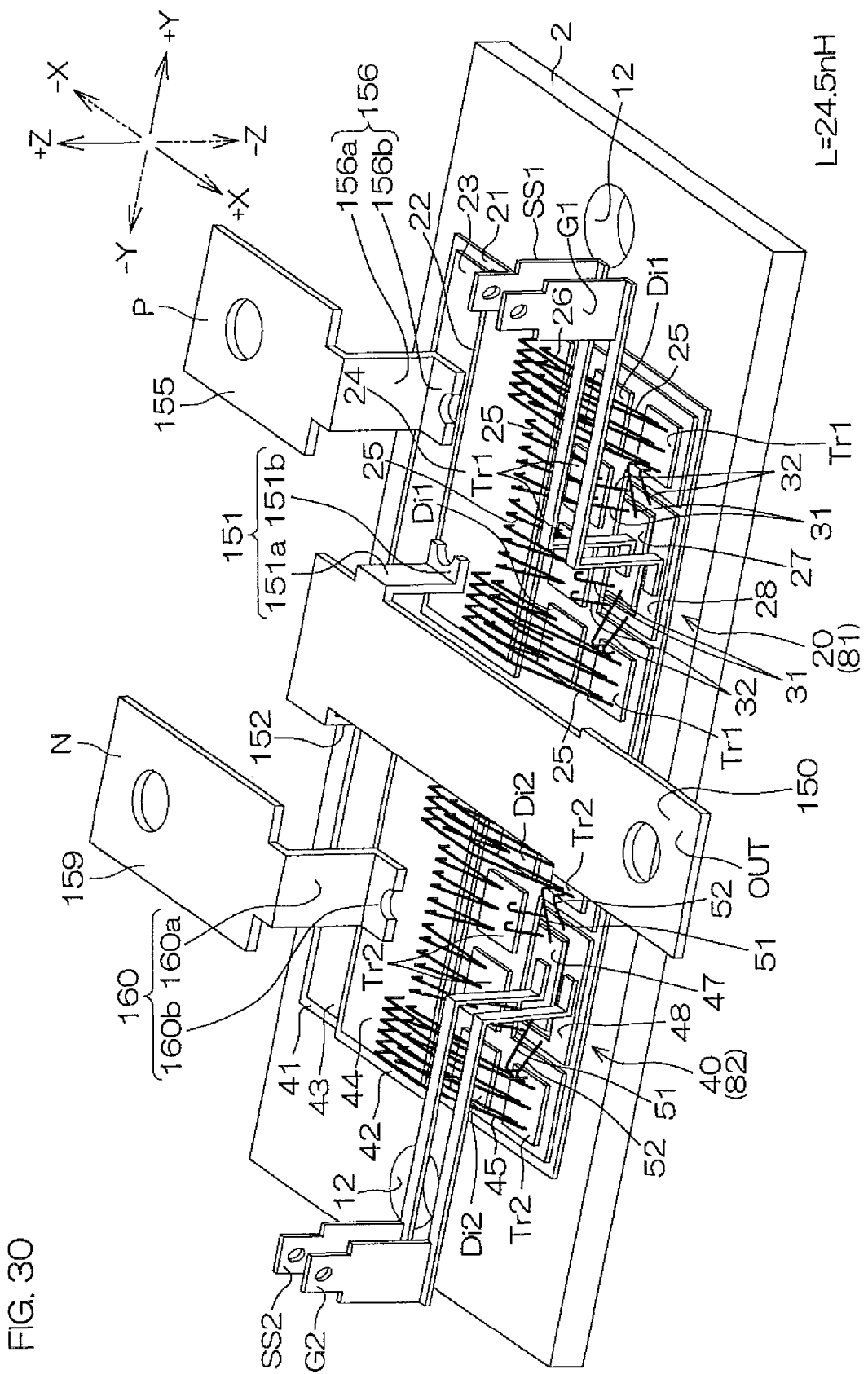
FIG. 30 is a perspective view for explaining a variation of terminals.

A configuration example of FIG. 30 is similar to the second embodiment. In this configuration example, the lengths of the leg portions of the first and second power supply terminals P, N are provided longer (longer by, for example, 2 mm) than those in the case of the second embodiment. Thereby, it is intended to secure a sufficient clearance with the surface of a gel material arranged on the first and second board assemblies 20, 40. With regard to this configuration, an inductance calculated for the upper arm circuit 81 (first board assembly 20) in response to a signal of a frequency of 1 MHz was 24.5 nH.

In the embodiments described above, a description has been given, as examples of switching elements, of the MOS field-effect transistors formed of SiC semiconductor devices, but other forms of switching elements such as IGBTs (Insulated Gate Bipolar Transistors) may be applied. Also, in the embodiments described above, a description has been given of the examples where switching elements and diode elements are connected by means of wires, but ribbons that are band-shaped connecting members having rectangular sections may be used instead. Alternatively, a lead frame may be used instead of using a plurality of wires. Further, in the embodiments described above, a description has been given of the configurations including switching elements and diode elements, but this invention can be applied also to a semiconductor device not including diode elements. Moreover, the semiconductor device does not necessarily constitute a power module.

[Third Embodiment]

Figure 31A:
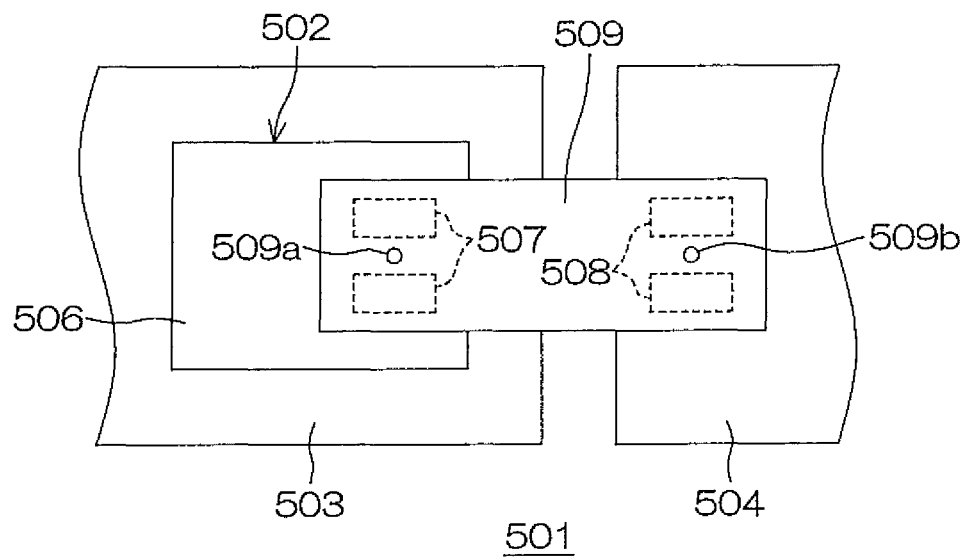
FIG. 31A is a schematic plan view showing an internal structure of a power module according to a third embodiment of the present invention.
Figure 31B:
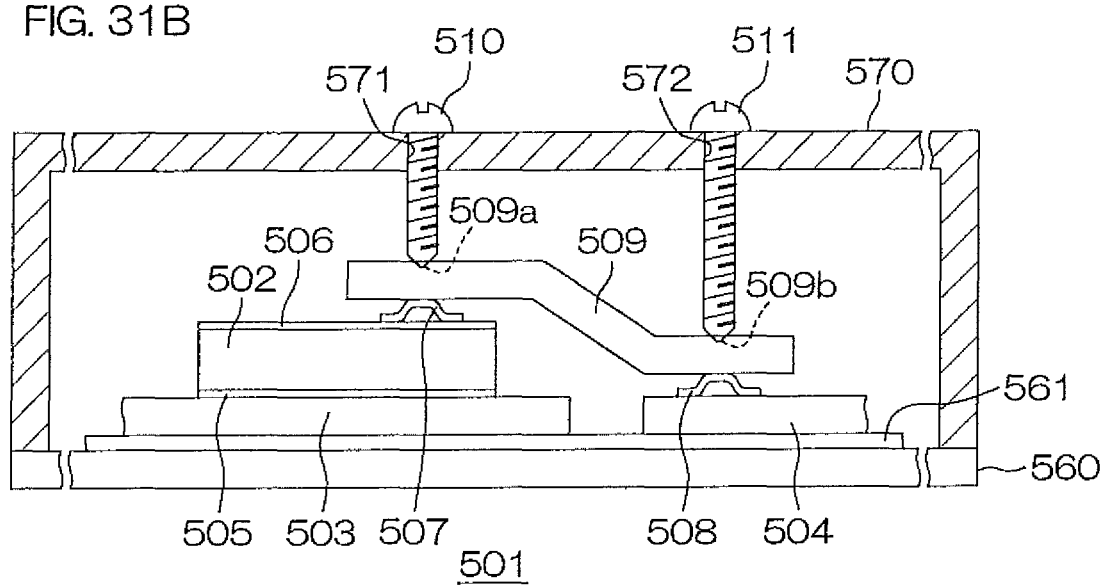
FIG. 31B is a schematic side view of the internal structure of the power module shown in FIG. 31A.

FIG. 31A is a schematic plan view showing an internal structure of a power module according to a third embodiment of the present invention. FIG. 31B is a schematic side view of the internal structure of the power module shown in FIG. 31A.

The power module 501 includes a heat radiating base 560 and a case 570. The case 570 is formed of an insulating resin material.

Moreover, the power module 501 includes, for example, an IGBT chip 502 which is a semiconductor chip with an IGBT. The IGBT chip 502 is formed in a rectangular shape in a plan view.

Moreover, the power module 501 includes a thin plate-like first electrode bar 503 and second electrode bar 504. The first electrode bar 503 and the second electrode bar 504 are arranged on an insulating board 561 provided on the heat radiating base 560. The first electrode bar 503 and the second electrode bar 504 are provided side by side separated from each other. The electrode bars 503, 504 are made of, for example, Cu (copper).

A surface at the collector side of the IGBT chip 502 is bonded to the first electrode bar 503 via a conductive adhesive 505 such as a solder. On a surface of the emitter side of the IGBT chip 502, an emitter electrode 506 is formed.

On the emitter electrode 506, at, for example, a position one-sided to the second electrode bar 504 side, a resilient member 507 with conductivity is provided. The resilient member 507 is made of, for example, a ribbon wire of Al (aluminum) or Au (gold). The resilient member 507, as a result of being formed in a shape whose both ends are fixed to the emitter electrode 506 and whose central portion is floating up from the emitter electrode 506, is resiliently deformable at its central portion. The resilient member 507 in such a shape is formed, by means of a wire bonder, by ultrasonic-bonding one end of a ribbon wire to the emitter electrode 506, moving the capillary, and then ultrasonic-bonding the other end of the ribbon wire to another position on the emitter electrode 506.

Moreover, on the second electrode bar 504, at a position one-sided to the first electrode bar 503 side, a resilient member 508 having the same configuration as that of the resilient member 507 is provided.

As shown in FIG. 31A, in the power module 501, two each of resilient members 507, 508 are provided, but the number of resilient members 507, 508 are not particularly limited, and it may be one, and may be three or more.

Between the IGBT chip 502 and the second electrode bar 504, a frame 509 for wiring is stretched. The frame 509 is made of, for example, Cu, and is formed in a thin plate shape extending in the direction in which the first electrode bar 503 and the second electrode bar 504 are arranged side by side. One end portion in the longitudinal direction of the frame 509 (hereinafter, simply referred to as "one end portion of the frame 509") is almost parallel to the emitter electrode 506, and is in pressure contact with the resilient members 507 on the emitter electrode 506 from above. On the other hand, the other end portion at the opposite side to one end portion in the longitudinal direction of the frame 509 (hereinafter, simply referred to as "the other end portion of the frame 509") is almost parallel to the second electrode bar 504, and is in pressure contact with the resilient members 508 on the second electrode bar 504 from above. The frame 509 is bent between its one end portion and the other end portion, and forms, for example, as shown in FIG. 31B, a substantially crank shape in a side view. The emitter electrode 506 and the second electrode bar 504 are electrically connected via the resilient members 507, 508 and the frame 509.

A structure including the IGBT chip 502, the first electrode bar 503, the second electrode bar 504, the resilient members 507, 508, and the frame 509 is housed inside the case 570. In the case 570, screw holes 571, 572 are formed at positions facing one end portion and the other end portion of the frame 509. Moreover, in one end portion and the other end portion of an upper surface of the frame 509, concavities 509a, 509b are formed, in a plan view, at positions facing center portions of the screw holes 571, 572. Into the screw holes 571, 572 of the case 570, pressing screws 510, 511 are fitted by screwing from above the case 570, respectively. Then, front end portions of the pressing screws 510, 511 are fitted to the concavities 509a, 509b, respectively. Accordingly, the frame 509 is fixed to the case 570. Front ends of the pressing screws 510, 511 press one end portion and the other end portion of the frame 509, respectively. Accordingly, one end portion and the other end portion of the frame 509 press the resilient members 507, 508, respectively, by pressing forces received from the pressing screws 510, 511, respectively, and are reliably connected to the resilient members 507, 508, respectively.

As in the above, in the power module 501, the collector-side surface of the IGBT chip 502 is bonded to the first electrode bar 503. On the emitter-side surface of the IGBT chip 502, the emitter electrode 506 is formed. The emitter electrode 506 is electrically connected with the second electrode bar 504 via the frame 509 for wiring. The frame 509 forms a thin plate shape, and has a sectional area larger than that of bonding wires (for example, thin gold wires). For this reason, by adopting the frame 509, the self-inductance can be reduced more than in a structure for which bonding wires are adopted. As a result, a surge voltage that occurs at the time of switching (turn-off) of the IGBT can be reduced.

In addition, between the emitter electrode 506 of the IGBT chip 502 and the frame 509, the resilient member 507 that is resiliently deformable at its central portion is interposed. A connection between the frame 509 and the resilient member 507 is achieved not by soldering but as a result of the resilient member 507 being pressed to the IGBT chip 502 side by the frame 509. Therefore, even if a thermal expansion/contraction difference occurs between the IGBT chip 502 and the frame 509, the thermal expansion/contraction difference can be absorbed by deformation of the resilient member 507 or a relative shift between the frame 509 and the resilient member 507. Thus, separation of the frame 509 from the resilient member 507 (IGBT chip 502) can be prevented. Moreover, propagation of a stress caused by a thermal expansion/contraction difference to the IGBT chip 502 can be prevented, and the occurrence of cracks of the IGBT chip 502 resulting from the propagation of stress can be prevented.

Therefore, according to the structure of the power module 501, the self-inductance can be reduced, and reliability against heat cycle can be improved.

Moreover, between the second electrode bar 504 and a part of the frame 509 facing the second electrode bar 504, the resilient member 508 that is resiliently deformable at its central portion is interposed. A connection between the frame 509 and the resilient member 508 is achieved not by soldering but as a result of the resilient member 508 being pressed to the second electrode bar 504 side by the frame 509. Therefore, even if a thermal expansion/contraction difference occurs between the frame 509 and the second electrode bar 504, the thermal expansion/contraction difference can be absorbed by deformation of the resilient member 508 or a relative shift between the frame 509 and the resilient member 508. Accordingly, separation of the frame 509 from the resilient member 508 (second electrode bar 504) can be prevented.

In the third embodiment, the concavities 509a, 509b are formed on the upper surface of the frame 509, and front end portions of the pressing screws 510, 511 are fitted to the concavities 509a, 509b, whereby the frame 509 is fixed to the case 570, but the frame 509 may be fixed to the case 570 without forming the concavities 509a, 509b on the upper surface of the frame 509. For example, the front end portions of the pressing screws 510, 511 may be sharpened to make the front ends of the pressing screws 510, 511 cut into the upper surface of the frame 509. Alternatively, the front end portions of the pressing screws 510, 511 may be fixed to the frame 509 by an adhesive. Further, enclosures (for example, cylindrical projections) to enclose the surroundings of the front end portions of the pressing screws 510, 511 may be formed on the upper surface of the frame 509.

[Fourth Embodiment]

Figure 32A:
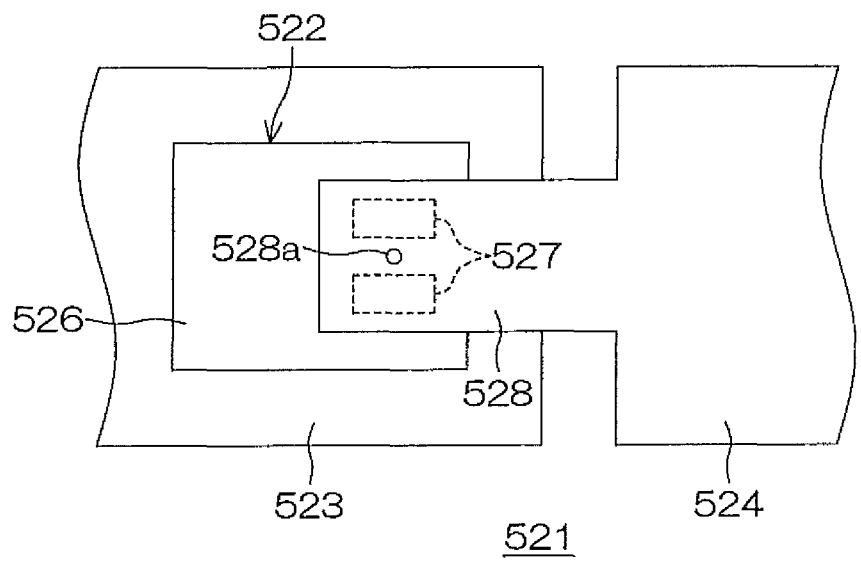
FIG. 32A is a schematic plan view showing an internal structure of a power module according to a fourth embodiment of the present invention.
Figure 32B:
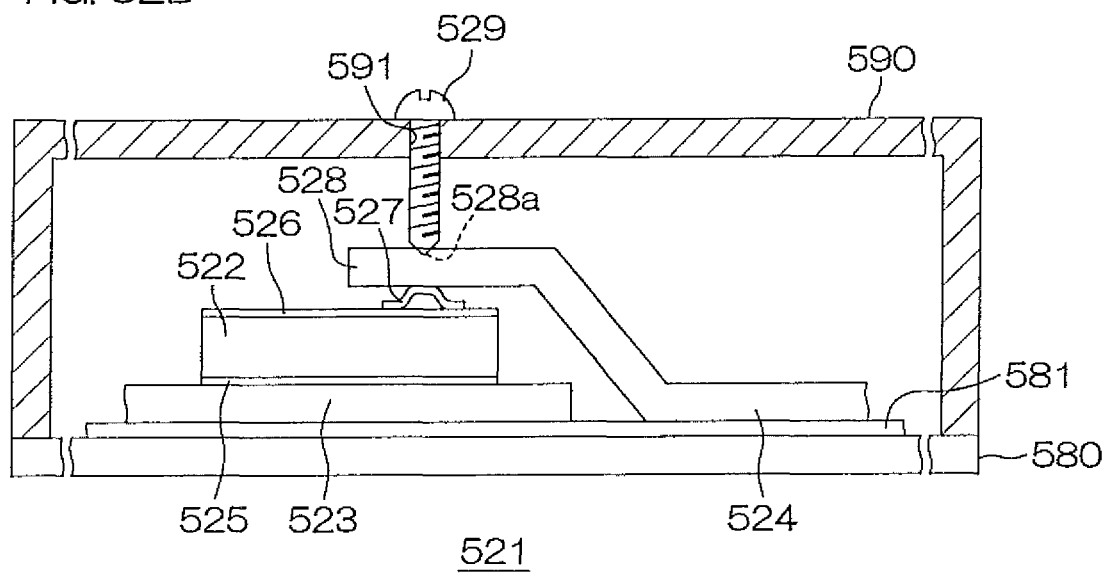
FIG. 32B is a schematic side view of the internal structure of the power module shown in FIG. 32A.

FIG. 32A is a schematic plan view showing an internal structure of a power module according to a fourth embodiment of the present invention. FIG. 32B is a schematic side view of the internal structure of the power module shown in FIG. 32A.

The power module 521 shown in FIGS. 32A and 32B includes a heat radiating base 580 and a case 590. The case 590 is formed of an insulating resin material.

Moreover, the power module 521 includes, for example, an IGBT chip 522 which is a semiconductor chip with an IGBT. The IGBT chip 522 is formed in a rectangular shape in a plan view.

Moreover, the power module 521 includes a thin plate-like first electrode bar 523 and second electrode bar 524. The first electrode bar 523 and the second electrode bar 524 are arranged on an insulating board 581 provided on the heat radiating base 580. The first electrode bar 523 and the second electrode bar 524 are provided side by side separated from each other. These electrode bars 523, 524 are made of, for example, Cu (copper).

A surface at the collector side of the IGBT chip 522 is bonded to the first electrode bar 523 via a conductive adhesive 525 such as a solder. On a surface of the emitter side of the IGBT chip 522, an emitter electrode 526 is formed.

On the emitter electrode 526, at a position one-sided to the second electrode bar 524 side, a resilient member 527 with conductivity is provided. The resilient member 527 has the same configuration as that of the resilient member 507 shown in FIGS. 31A and 31B.

As shown in FIG. 32A, in the power module 521, two resilient members 527 are provided, but the number of resilient members 527 are not particularly limited, and it may be one, and may be three or more.

In addition, with the second electrode bar 524, a frame 528 is integrally formed. The frame 528 extends from an end edge on the first electrode bar 523 side toward the above of the emitter electrode 526 of the IGBT chip 522. The frame 528 is bent at its halfway portion, and its front end portion is almost parallel to the emitter electrode 526, and is in pressure contact with the resilient members 527 on the emitter electrode 526 from above. The emitter electrode 526 and the second electrode bar 524 are electrically connected via the resilient members 527 and the frame 528.

A structure including the IGBT chip 522, the first electrode bar 523, the second electrode bar 524, the resilient member 527, and the frame 528 is housed inside the case 590. In the case 590, a screw hole 591 is formed at a position facing the front end portion of the frame 528. Moreover, on an upper surface of the front end portion of the frame 528, a concavity 528a is formed, in a plan view, at a position facing a center portion of the screw hole 591. Into the screw hole 591 of the case 590, a pressing screw 529 is fitted by screwing from above the case 590. Then, a front end portion of the pressing screw 529 is fitted to the concavity 528a. A front end of the pressing screw 529 presses the front end portion of the frame 528. Accordingly, the front end portion of the frame 528 presses the resilient member 527 by a pressing force received from the pressing screw 529, and is reliably connected to the resilient member 527.

Also in the power module 521, the same advantageous effects as those in the power module 501 shown in FIGS. 31A and 31B can be provided.

Figure 33:
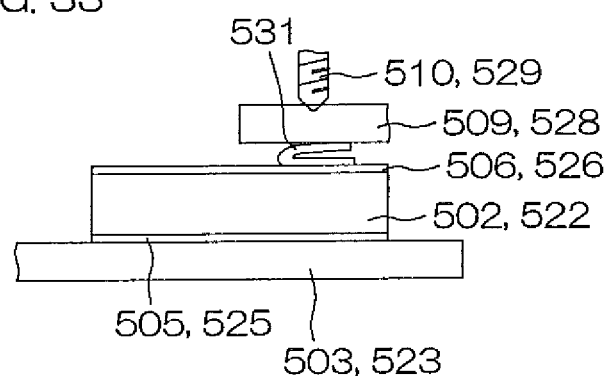
FIG. 33 is a schematic side view showing another configuration of a resilient member.

FIG. 33 is a schematic side view showing another configuration of a resilient member.

The resilient member 531 shown in FIG. 33 may be used in place of the resilient members 507, 508 shown in FIG. 31B and the resilient member 527 shown in FIG. 32B. The resilient member 531 is formed by, for example, bending into a V-shape a thin plate made of a metal such as Al or Au. When the resilient member 531 is used for the power module 501, 521, one section of the resilient member 531 is joined to the emitter electrode 506, 526, and the other section is pressed by the frame 509, 528.

In the third embodiment or the fourth embodiment, the IGBT chip 502, 522 having an IGBT has been mentioned as a semiconductor chip, but the semiconductor chip may have an element such as a power MOSFET (Metal Oxide Semiconductor Field Effect Transistor) or a diode.

[Fifth Embodiment]

Figure 34:
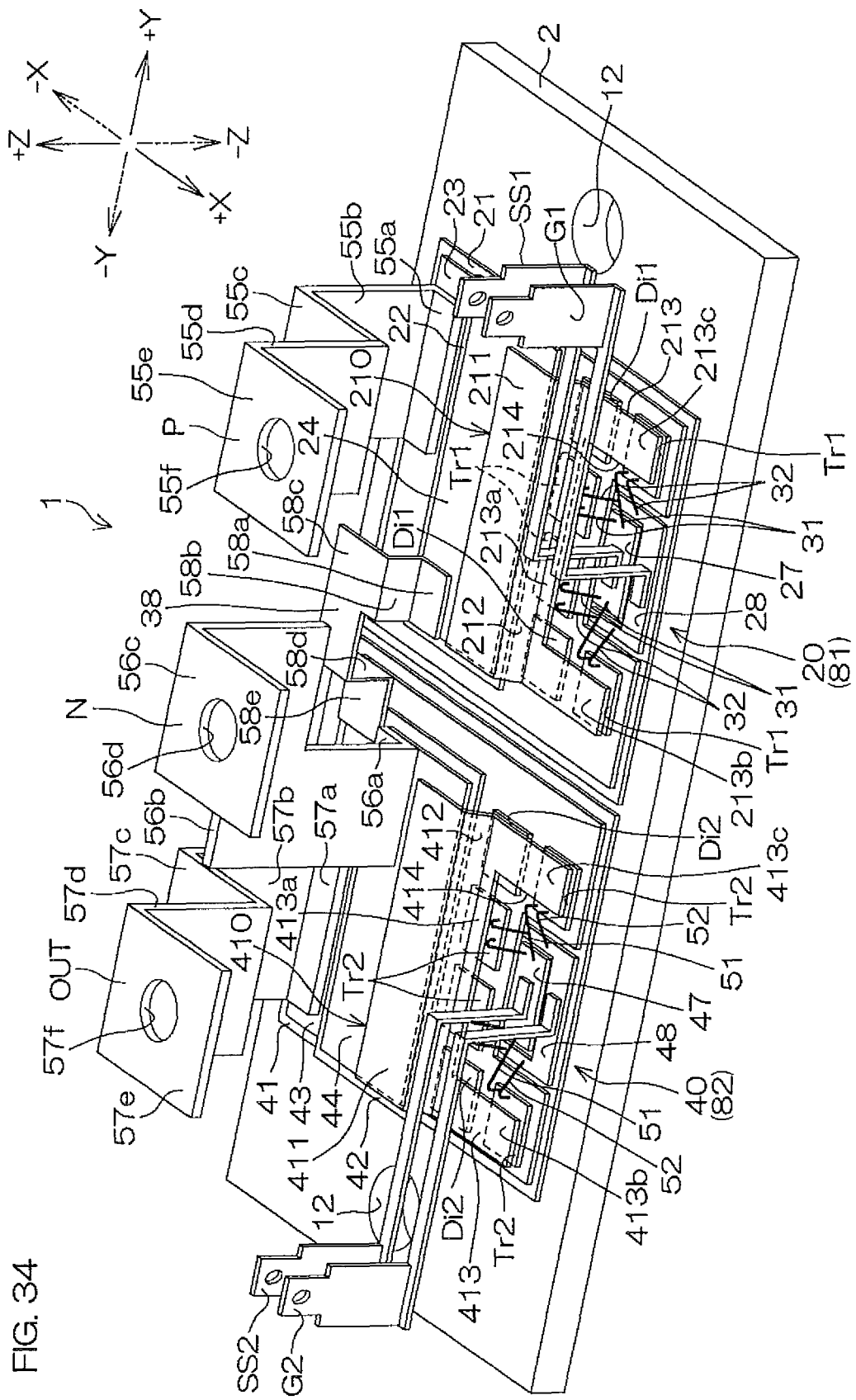
FIG. 34 is an illustrative perspective view for explaining a configuration of a power module circuit in a power module according to a fifth embodiment of this invention.
Figure 35:
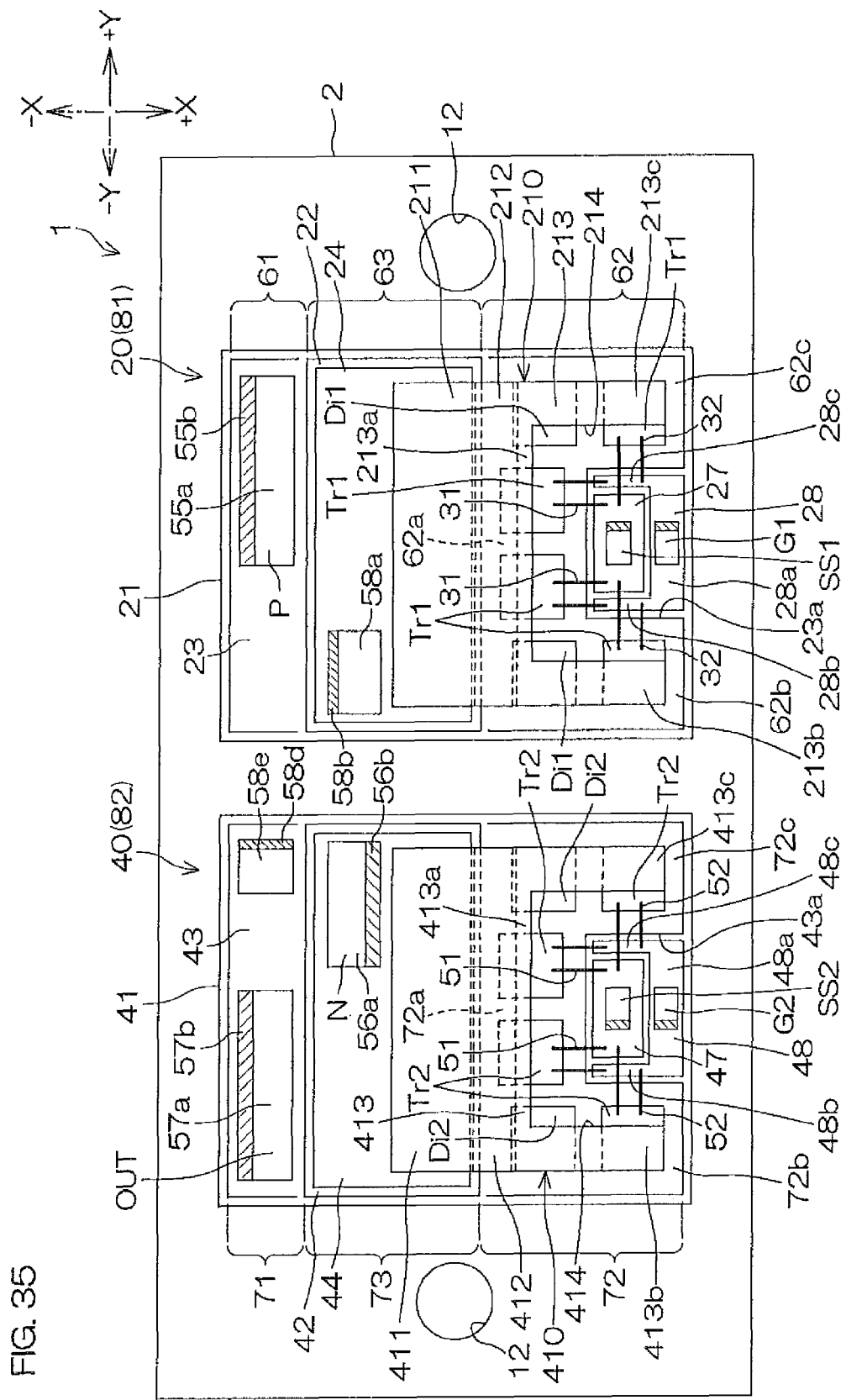
FIG. 35 is an illustrative plan view showing first and second board assemblies.
Figure 36A:
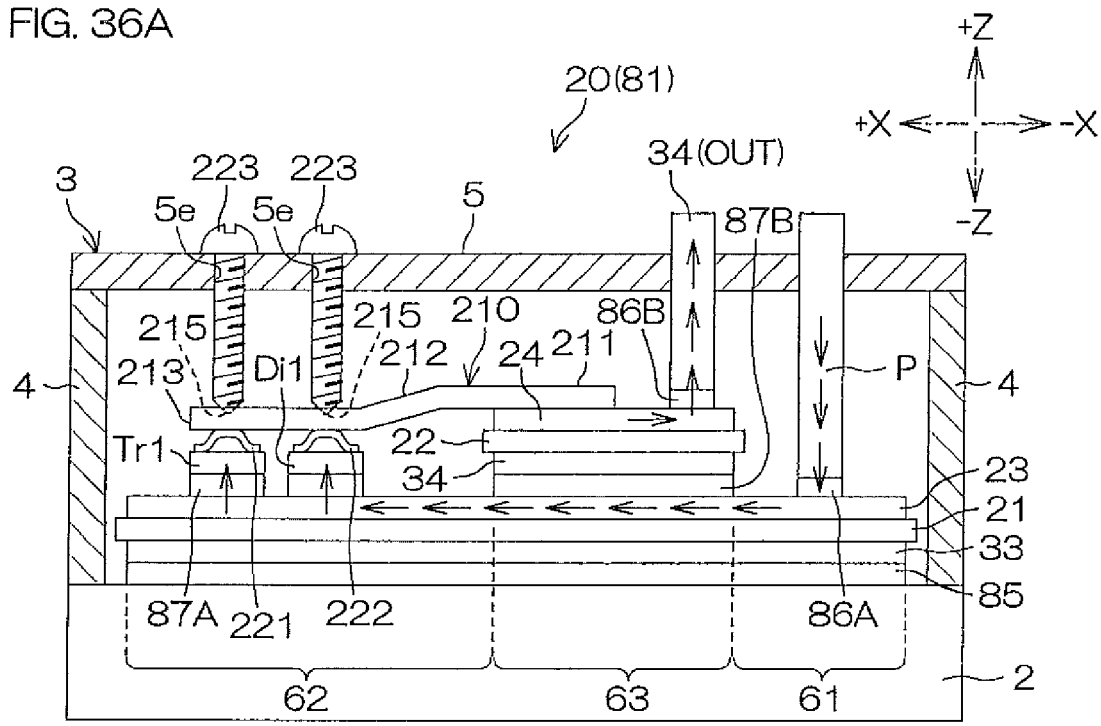
FIG. 36A is an illustrative sectional view showing a first board assembly.
Figure 36B:
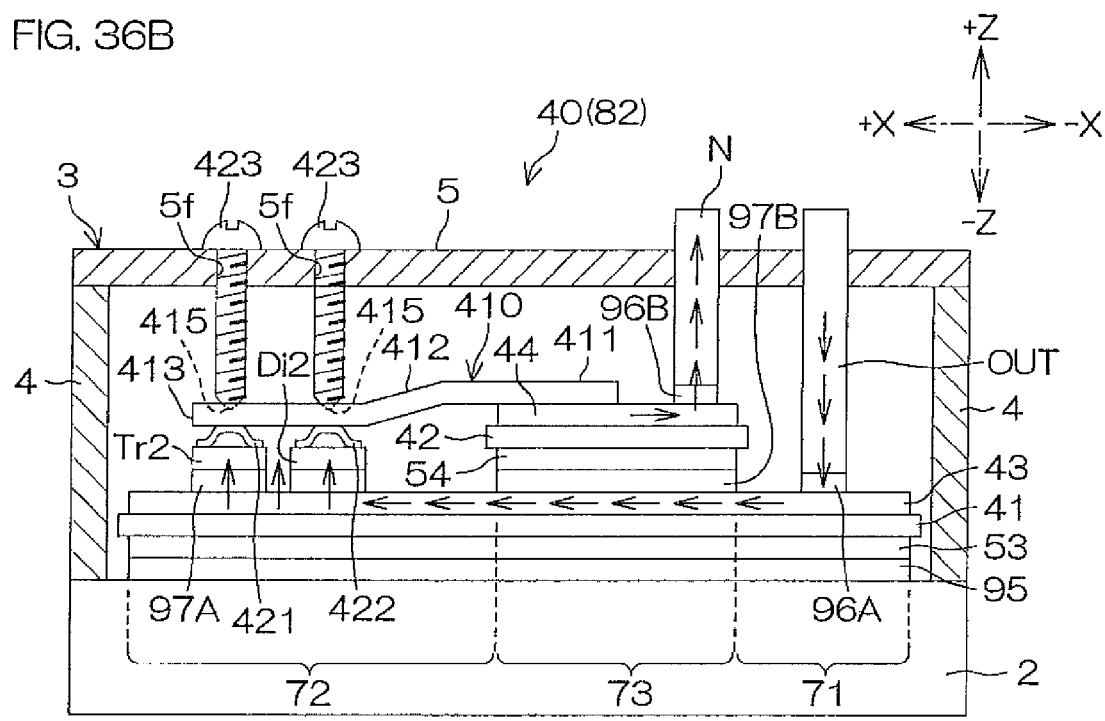
FIG. 36B is an illustrative sectional view showing a second board assembly.

FIG. 34 to FIG. 36B show a fifth embodiment of this invention. FIG. 34 is an illustrative perspective view showing a configuration of a power module circuit housed inside a case. FIG. 35 is an illustrative plan view showing first and second board assemblies. FIG. 36A is an illustrative sectional view of a first board assembly, and FIG. 36B is an illustrative sectional view of a second board assembly. In FIG. 34, the same parts as those in FIG. 2 are denoted by the same reference signs as in FIG. 2. In FIG. 35, the same parts as those in FIG. 3 are denoted by the same reference signs as in FIG. 3. In FIG. 36A or FIG. 36B, the same parts as those in FIG. 5A or FIG. 5B are denoted by the same reference signs as in FIG. 5A or FIG. 5B.

The power module according to the fifth embodiment has substantially the same configuration as that of the power module according to the first embodiment shown in FIG. 1 to FIG. 7B. In the power module according to the fifth embodiment, an electrical connection structure between the first switching element Tr1 and the first diode Di1 and the first upper conductor layer 24 and an electrical connection structure between the second switching element Tr2 and the second diode Di2 and the second upper conductor layer 44 are different from those of the first embodiment.

In the fifth embodiment, a plate-shaped frame 210 is used in the first board assembly 20 in place of the wires 25, 26 used in the first board assembly 20 of FIG. 2. The source of each first switching element Tr1 and the anode of each first diode Di1 are, in the same manner as in the third embodiment described by using FIG. 31A and FIG. 31B, via resilient members 221, 222 (refer to FIG. 36A) and the plate-shaped frame 210, connected to the first upper conductor layer 24 on the first upper board 22.

As shown in FIG. 36A, on an upper surface (a +Z direction surface) of each first switching element Tr1 and an upper surface (a +Z direction-side surface) of each first diode Di1, resilient members 221, 222 with conductivity are provided, respectively. The resilient members 221, 222 are the same as the resilient member 507 in the third embodiment described above. The resilient members 221, 222 are made of, for example, ribbon wires of Al (aluminum) or Au (gold).

The resilient member 221, as a result of being formed in a shape whose both ends are fixed to the upper surface of the first switching element Tr1 and whose central portion is floating up from the upper surface of the first switching element Tr1, is resiliently deformable at the central portion. Similarly, the resilient member 222, as a result of being formed in a shape whose both ends are fixed to the upper surface of the first diode Di1 and whose central portion is floating up from the upper surface of the first diode Di1, is resiliently deformable at its central portion. Such resilient members 221, 222 may be provided individually for each corresponding element, or two or more resilient members may be provided.

As shown in FIG. 34, FIG. 35, and FIG. 36A, the frame 210 is made of a conductive plate-like body (for example, Cu). The frame 210 has a bonding portion 211 whose major portion is bonded to the first upper conductor layer 24, a pressure contact portion 213 that is in pressure contact with the resilient members 221, 222 provided on the upper surfaces of each first switching element Tr1 and each first diode Di1, and a joining portion 212 that joins the bonding portion 211 and the pressure contact portion 213.

The major portion of the bonding portion 211 is ultrasonic-bonded to a region from the vicinity of a middle portion of the width in the X direction of the first upper conductor layer 24 to a +X direction-side edge portion. The bonding portion 211 is formed in a rectangular shape extending in the Y direction in a plan view. The bonding portion 211 is made of a plate-like body parallel to the first upper conductor layer 24, and its major part is bonded to the first upper conductor layer 24. The joining portion 212 extends in an intermediate direction between the +X direction and −Z direction from a +X direction-side edge portion of the bonding portion 211. The joining portion 212 is made of a band-shaped plate-like body.

The pressure contact portion 213 extends in the +X direction from a +X direction-side edge portion of the joining portion 212. The pressure contact portion 213 is formed, in a plan view, in a U-shape having a cut-away 214 opened toward the +X direction side. The pressure contact portion 213 has a base portion 213a joined to the +X direction-side edge portion of the joining portion 212 and a pair of arm portions 213b, 213c extending in the +X direction from both end portions of the base portion 213a. The base portion 213a is formed, in a plan view, in a rectangular shape extending in the Y direction. The base portion 213a faces in the Z direction to a part of the upper surface of each of the two first diodes Di1 and a part of the upper surface of each of the two first switching elements Tr1 between those diodes Di1. The arm portions 213b, 213c face in the Z direction to a part of the upper surface of each of the two first diodes Di1 and a part of the upper surface of each of the two first switching elements Tr1 present on the +X direction side of those diodes Di1.

The pressure contact portion 213 is in pressure contact from above with the resilient members 221, 222 formed on the upper surface of each first switching element Tr1 and the upper surface of each first diode Di1. Specifically, with the resilient members 221 on the two first switching elements Tr1 present on the +X direction side of the two first diodes Di1, the arm portions 213b, 213c of the pressure contact portion 213 are in pressure contact. With the resilient members 221 on the two first switching elements Tr1 present between the two first diodes Di1, the base portion 213a of the pressure contact portion 213 is in pressure contact. With the resilient members 222 on the two first diodes Di1, one or both of the base portion 213a of the pressure contact portion 213 and the arm portions 213b, 213c is in pressure contact. Accordingly, the source of each first switching element Tr1 and the anode of each first diode Di1 are electrically connected to the first upper conductor layer 24 via the resilient members 221, 222 and the frame 210.

As shown in FIG. 36A, in the top plate 5 of the case 3, a plurality of screw holes 5e are formed at positions facing the pressure contact portions 213 of the frame 210. It is preferable that a screw hole 5e is formed, in a region of the top plate 5 facing the pressure contact portion 213, at each of the positions facing each first switching element Tr1 and each first diode Di1. Moreover, on an upper surface of the pressure contact portion 213, concavities 215 are formed, in a plan view, at positions facing center portions of the screw holes 5e. Into the screw holes 5e of the top plate 5, pressing screws 223 are fitted by screwing from above the top plate 5, respectively. Then, front end portions of the pressing screws 223 are fitted to the corresponding concavities 215, respectively. A front end of each pressing screw 223 presses the pressure contact portion 213 of the frame 210. Accordingly, the pressure contact portion 213 of the frame 210 presses the resilient members 221, 222 by pressing forces received from the pressing screws 223, and are reliably connected to the resilient members 221, 222, respectively.

As shown in FIG. 34 and FIG. 35, a part of each first switching element Tr1 and a part of each first diode Di1 are exposed, in a plan view, from the cut-away 214 of the pressure contact portion 213. In the exposed part of each first switching element Tr1, the source of each first switching element Tr1 is, via each wire 31, connected to the controlling conductor layer 27 for the source sense terminal SS1. Moreover, in the exposed part of each first switching element Tr1, the gate of each first switching element Tr1 is, via each wire 32, connected to the controlling conductor layer 28 for the gate terminal G1.

In the fifth embodiment, a plate-shaped frame 410 is used in the second board assembly 40 in place of the wires 45, 46 used in the second board assembly 40 of FIG. 2. The source of each second switching element Tr2 and the anode of each second diode Di2 are, via resilient members 421, 422 (refer to FIG. 36B) and the plate-shaped frame 410, connected to the second upper conductor layer 44 on the second upper board 42.

As shown in FIG. 36B, on an upper surface (a +Z direction surface) of each second switching element Tr2 and an upper surface (a +Z direction-side surface) of each second diode Di2, resilient members 421, 422 with conductivity are provided, respectively. The configuration of the resilient members 421, 422 is the same as the configuration of the resilient members 221, 222 described above. Such resilient members 421, 422 may be provided individually for each corresponding element, or two or more resilient members may be provided.

As shown in FIG. 34, FIG. 35, and FIG. 36B, the frame 410 is made of a conductive plate-like body (for example, Cu). The frame 410 has a bonding portion 411 whose major portion is bonded to the second upper conductor layer 44, a pressure contact portion 413 that is in pressure contact with the resilient members 421, 422 provided on the upper surfaces of each second switching element Tr2 and each second diode Di2, and a joining portion 412 that joins the bonding portion 411 and the pressure contact portion 413.

The major portion of the bonding portion 411 is ultrasonic-bonded to a region from the vicinity of a middle portion of the width in the X direction of the second upper conductor layer 44 to a +X direction-side edge portion. The bonding portion 411 is formed in a rectangular shape extending in the Y direction in a plan view. The bonding portion 411 is made of a plate-like body parallel to the second upper conductor layer 44, and its major part is bonded to the second upper conductor layer 44. The joining portion 412 extends in an intermediate direction between the +X direction and −Z direction from a +X direction-side edge portion of the bonding portion 411. The joining portion 412 is made of a band-shaped plate-like body.

The pressure contact portion 413 extends in the +X direction from a +X direction-side edge portion of the joining portion 412. The pressure contact portion 413 is formed, in a plan view, in a U-shape having a cut-away 414 opened toward the +X direction side. The pressure contact portion 413 has a base portion 413a joined to the +X direction-side edge portion of the joining portion 412 and a pair of arm portions 413b, 413c extending in the +X direction from both end portions of the base portion 413a. The base portion 413a is formed, in a plan view, in a rectangular shape extending in the Y direction. The base portion 413a faces in the Z direction to a part of the upper surface of each of the two second diodes Di2 and a part of the upper surface of each of the two second switching elements Tr2 between those diodes Di2. The arm portions 413b, 413c face in the Z direction to a part of the upper surface of each of the two second diodes Di2 and a part of the upper surface of each of the two second switching elements Tr2 present on the +X direction side of those diodes Di2.

The pressure contact portion 413 is in pressure contact from above with the resilient members 421, 422 formed on the upper surface of each second switching element Tr2 and the upper surface of each second diode Di2. Specifically, with the resilient members 421 on the two second switching elements Tr2 present on the +X direction side of the two second diodes Di2, the arm portions 413b, 413c of the pressure contact portion 413 are in pressure contact. With the resilient members 421 on the two second switching elements Tr2 present between the two second diodes Di2, the base portion 413a of the pressure contact portion 413 is in pressure contact. With the resilient members 422 on the two second diodes Di2, one or both of the base portion 413a of the pressure contact portion 413 and the arm portions 413b, 413c is in pressure contact. Accordingly, the source of each second switching element Tr2 and the anode of each second diode Di2 are electrically connected to the second upper conductor layer 44 via the resilient members 421, 422 and the frame 410.

As shown in FIG. 36B, in the top plate 5 of the case 3, a plurality of screw holes 5f are formed at positions facing the pressure contact portion 413 of the frame 410. It is preferable that a screw hole 5f is formed, in a region of the top plate 5 facing the pressure contact portion 413, at each of the positions facing each second switching element Tr2 and each second diode Di2. Moreover, on an upper surface of the pressure contact portion 413, concavities 415 are formed, in a plan view, at positions facing center portions of the screw holes 5f. Into the screw holes 5f of the top plate 5, pressing screws 423 are fitted by screwing from above the top plate 5, respectively. Then, front end portions of the pressing screws 423 are fitted to the corresponding concavities 415, respectively. A front end of each pressing screw 423 presses the pressure contact portion 413 of the frame 410. Accordingly, the pressure contact portion 413 of the frame 410 presses the resilient members 421, 422 by pressing forces received from the pressing screws 423, and are reliably connected to the resilient members 421, 422, respectively.

As shown in FIG. 34 and FIG. 35, apart of each second switching element Tr2 and a part of each second diode Di2 are exposed, in a plan view, from the cut-away 414 of the pressure contact portion 413. In the exposed part of each second switching element Tr2, the source of each second switching element Tr2 is, via each wire 51, connected to the controlling conductor layer 47 for the source sense terminal SS2. Moreover, in the exposed part of each second switching element Tr2, the gate of each second switching element Tr2 is, via each wire 52, connected to the controlling conductor layer 48 for the gate terminal G2.

Also in the fifth embodiment, the same effects as in the first embodiment described above can be obtained. Further, in the fifth embodiment, the first switching element Tr1 and the first diode Di1 are electrically connected to the first upper conductor layer 24 via the frame 210 for wiring in the first board assembly 20. The frame 210 has a sectional area larger than that of bonding wires. For this reason, in the fifth embodiment, the inductance can be reduced as compared with that of a structure where the first switching element Tr1 and the first diode Di1 are electrically connected to the first upper conductor layer 24 by wires. Accordingly, a surge voltage that occurs at the time of turn-off of the switching element Tr1 can be reduced.

Between the first switching element Tr1 and the first diode Di1 and the frame 210, the resilient members 221, 222 are interposed. In addition, a connection between the frame 210 and the elements Tr1, Di1 is achieved not by soldering but as a result of the resilient members 221, 222 being pressed to the element Tr1, Di1 side by the frame 210.

Therefore, even if a thermal expansion/contraction difference occurs between each element Tr1, Di1 and the frame 210, the thermal expansion/contraction difference can be absorbed by deformation of the resilient member 221, 222 or a relative shift between the frame 210 and the resilient member 221, 222. Thus, separation of the frame 210 from the resilient member 221, 222 (element Tr1, Di1) can be prevented. Moreover, propagation of a stress caused by a thermal expansion/contraction difference between each element Tr1, Di1 and the frame 210 to each element Tr1, Di1 can be prevented. Accordingly, the occurrence of cracks in each element Tr1, Di1 due to propagation of a stress caused by a thermal expansion/contraction difference can be prevented.

Also with regard to the second board assembly 40, the same effects as the effects of the first board assembly 20 as described above can be obtained.

In the fifth embodiment, the elements Tr1, Di1 on the first board assembly 20 are connected to the first upper conductor layer 24 by the single frame 210, but the elements Tr1, Di1 on the first board assembly 20 may be connected to the first upper conductor layer 24 by a plurality of plate-shaped frames. For example, in place of the frame 210 described above, four frames in rectangular shapes whose widths in the Y direction are short in a plan view may be used. In this case, the four frames are arranged at intervals in the Y direction. One of the first diodes Di1 present at the most −Y direction side and a first transistor Tr1 present on its +X direction side are connected to the first upper conductor layer 24 by a frame arranged at the most −Y direction side. The other first diode Di1 present at the most +Y direction side and a first transistor Tr1 present on its +X direction side are connected to the first upper conductor layer 24 by a frame arranged at the most +Y direction side. Two first transistors present between the two first diodes Di1 are connected to the first upper conductor layer 24 by the two remaining frames, respectively.

Similarly, the elements Tr2, Di2 on the second board assemblies 40 may be connected to the second upper conductor layer 44 by a plurality of plate-shaped frames.

[Sixth Embodiment]

Figure 37:
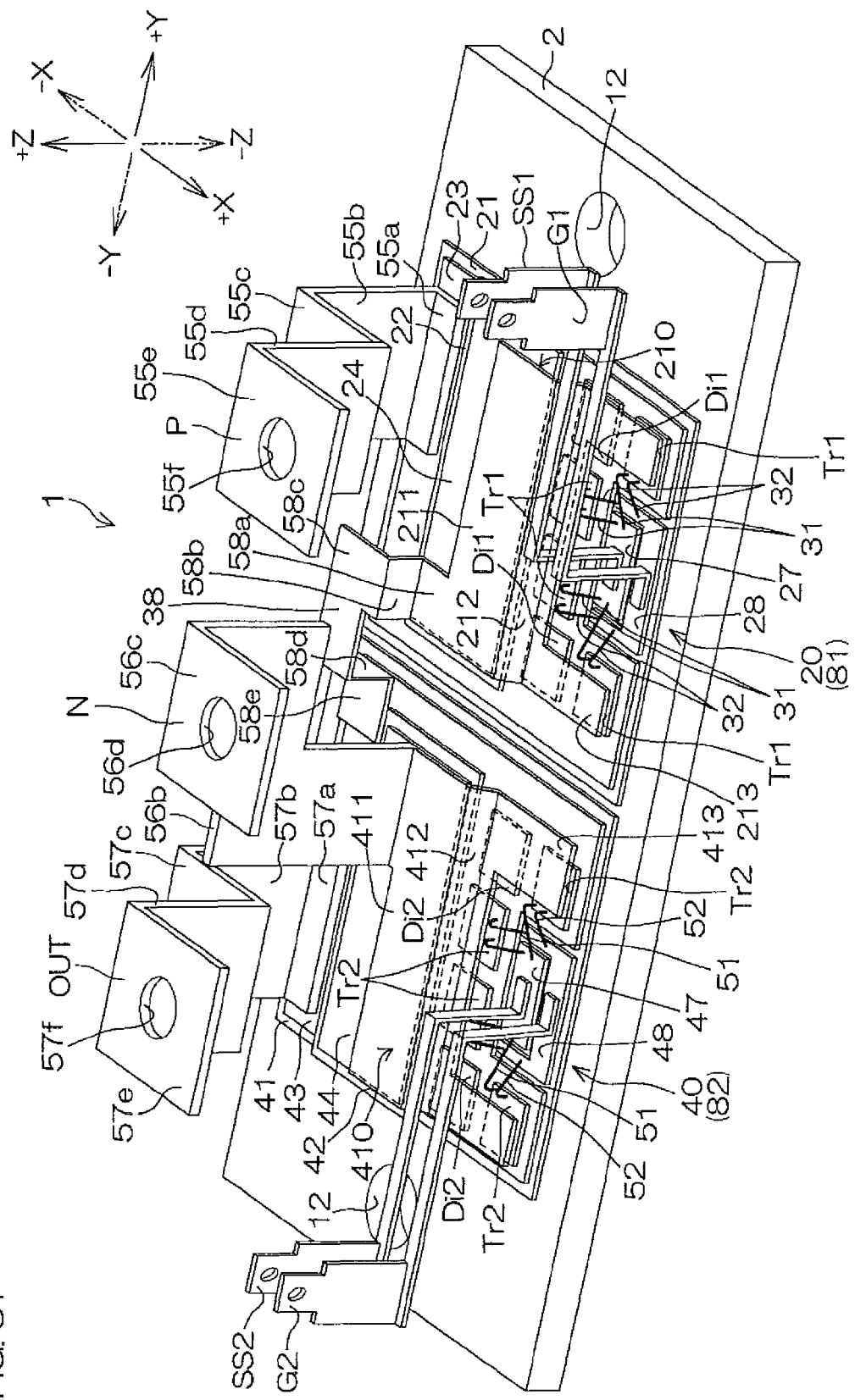
FIG. 37 is an illustrative perspective view for explaining a configuration of a power module circuit in a power module according to a sixth embodiment of this invention.

FIG. 37 shows a sixth embodiment of this invention. FIG. 37 is an illustrative perspective view showing a configuration of a power module circuit housed inside a case. The power module according to the sixth embodiment has substantially the same configuration as that of the power module according to the fifth embodiment shown in FIG. 34. In FIG. 37, the same parts as those in FIG. 34 are denoted by the same reference signs as in FIG. 34.

In the first board assembly 20, the source of each first switching element Tr1 and the anode of each first diode Di1 are, in the same manner as in the fifth embodiment shown in FIG. 34, via the resilient members 221, 222 (not shown in FIG. 37) and the frame 210, electrically connected to the first upper conductor layer 24. The frame 210 is, as explained in the fifth embodiment, made of a bonding portion 211, a pressure contact portion 213, and a joining portion 212 that join those. Moreover, the frame 210 is formed integrally with a connecting member 38. That is, a part closer to a −Y direction-side edge portion in a −X direction-side edge portion of the bonding portion 211 of the frame 210 is joined to a +X direction-side edge portion of the bonding portion 58a of the connecting member 38.

In the second board assembly 40, the source of each second switching element Tr2 and the anode of each second diode Di2 are, in the same manner as in the fifth embodiment shown in FIG. 34, via the resilient members 421, 422 (not shown in FIG. 37) and the frame 410, electrically connected to the second upper conductor layer 44. The frame 410 is, as explained in the fifth embodiment, made of a bonding portion 411, a pressure contact portion 413, and a joining portion 412 that join those. Moreover, the frame 410 is formed integrally with the second power supply terminal N.

That is, a part closer to a +Y direction-side edge portion in a −X direction-side edge portion of the bonding portion 411 of the frame 410 is connected to a −Z direction-side edge portion of the rising portion 56b of the second power supply terminal N. However, as compared with the frame 410 of the fifth embodiment shown in FIG. 34, the frame 410 of this embodiment is extended in the +Y direction so that its +Y direction-side edge portion is in alignment with a +Y direction-side edge portion in the −Z direction-side edge portion of the rising portion 56b of the second power supply terminal N. Moreover, unlike the second power supply terminal N of the fifth embodiment, in the second power supply terminal N of this embodiment, a bonding portion 56a extending in the −X direction from the −Z direction-side edge portion of the rising portion 56b does not exist.

In the sixth embodiment, the same effects as in the fifth embodiment can be obtained. Further, in the sixth embodiment, the connecting member 38 and the frame 210 are integrally formed, and the second power supply terminal N and the frame 410 are integrally formed, so that the number of components can be reduced, and manufacturing of a power module is simplified.

[Seventh Embodiment]

Figure 38:
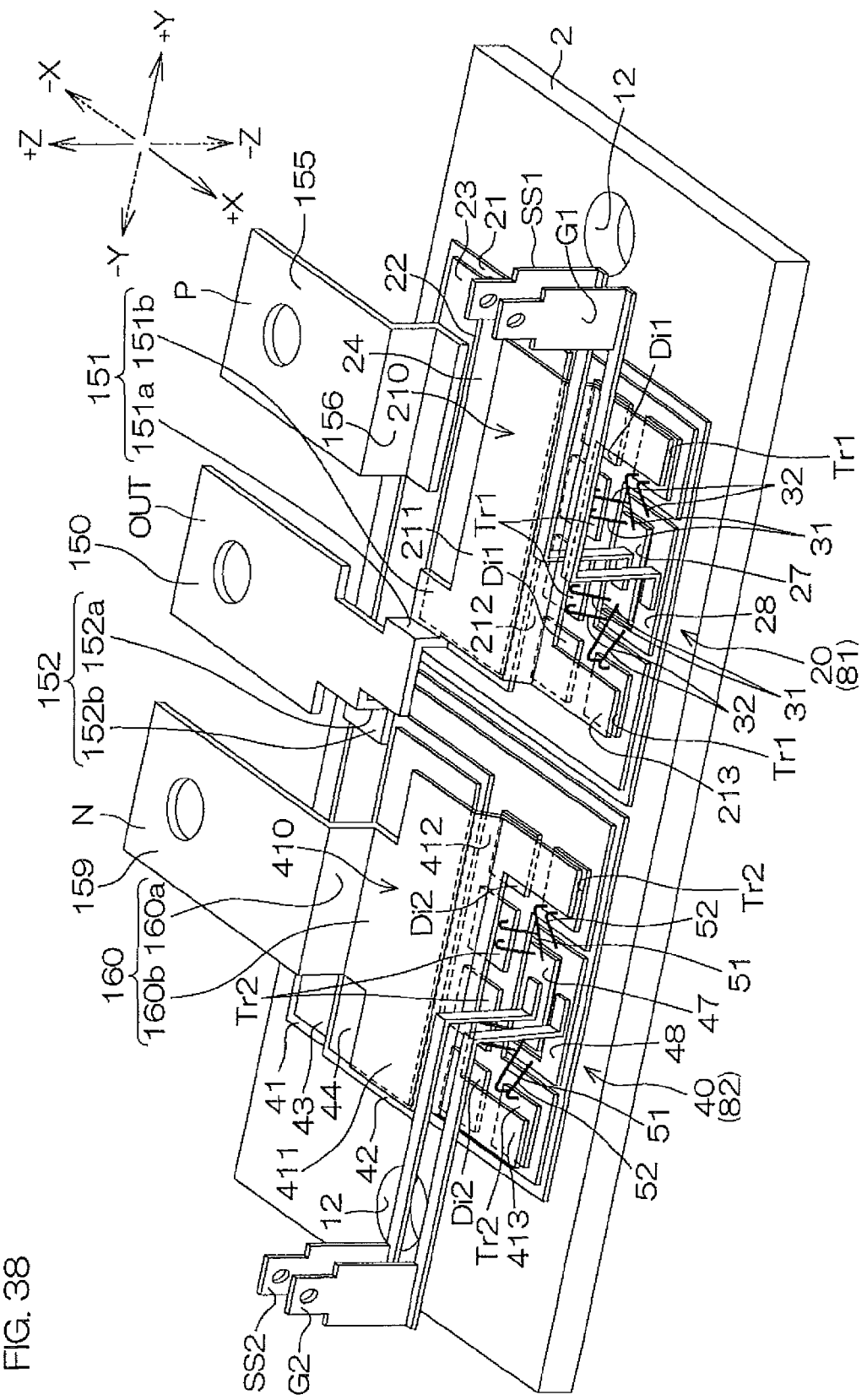
FIG. 38 is an illustrative perspective view for explaining a configuration of a power module circuit in a power module according to a seventh embodiment of this invention.

FIG. 38 shows a seventh embodiment of this invention. FIG. 38 is an illustrative perspective view showing a configuration of a power module circuit housed inside a case. In the power module according to the seventh embodiment, the shapes and arrangement of the terminals P, N, OUT are the same as the shapes and arrangement of the terminals P, N, OUT in the power module shown in FIG. 13. In FIG. 38, the same parts as those in FIG. 13 are denoted by the same reference signs as in FIG. 13.

In the first board assembly 20, the source of each first switching element Tr1 and the anode of each first diode Di1 are, in the same manner as in the fifth embodiment shown in FIG. 34, via the resilient members 221, 222 (not shown in FIG. 38) and the frame 210, electrically connected to the first upper conductor layer 24. The frame 210 is, as explained in the fifth embodiment, made of a bonding portion 211, a pressure contact portion 213, and a joining portion 212 that join those. Moreover, the frame 210 is formed integrally with the output terminal OUT. That is, a part closer to a −Y direction-side edge portion in a −X direction-side edge portion of the bonding portion 211 of the frame 210 is joined to a +X direction-side edge portion of the bonding portion 151b of the output terminal OUT.

In the second board assembly 40, the source of each second switching element Tr2 and the anode of each second diode Di2 are, in the same manner as in the fifth embodiment shown in FIG. 34, via the resilient members 421, 422 (not shown in FIG. 38) and the frame 410, electrically connected to the second upper conductor layer 44. The frame 410 is, as explained in the fifth embodiment, made of a bonding portion 411, a pressure contact portion 413, and a joining portion 412 that join those. Moreover, the frame 410 is formed integrally with the second power supply terminal N. That is, a middle portion in the Y direction of a −X direction-side edge portion of the bonding portion 411 of the frame 410 is joined to a +X direction-side edge portion of the bonding portion 160b of the second power supply terminal N.

In the seventh embodiment, the same effects as in the fifth embodiment can be obtained. Further, in the seventh embodiment, the output terminal OUT and the frame 210 are integrally formed, and the second power supply terminal N and the frame 410 are integrally formed, so that the number of components can be reduced, and manufacturing of a power module is simplified.

Although the embodiments of the present invention have been described in detail, these are merely specific examples used to clarify the technical contents of the present invention, and the present invention should not be interpreted as being limited to only these specific examples, and the scope of the present invention shall be limited only by the accompanying claims.

This application corresponds to Japanese Patent Application No. 2009-230017 filed on Oct. 1, 2009 in the Japan Patent Office and Japanese Patent Application No. 2009-117271 filed on May 14, 2009 in the Japan Patent Office, and the entire disclosures of these applications are herein incorporated by reference.

REFERENCE SIGNS LIST

1 Power module
2 Heat radiating base
3 Case
4 Frame portion
5 Top plate
6, 7 Side plate
8, 9 End plate
20 First board assembly
Tr1 First switching element
Di1 First diode element
21 First lower board
22 First upper board
23 First lower conductor layer
23a Cut-away
24 First upper conductor layer
25, 26 Wire
27, 28 Controlling conductor layer
SS1 Source sense terminal
G1 Gate terminal
31, 32 Wire
40 Second board assembly
Tr2 Second switching element
Di2 Second diode element
41 Second lower board
42 Second upper board
43 Second lower conductor layer
43a Cut-away
44 Second upper conductor layer
45, 46 Wire
47, 48 Controlling conductor layer
SS2 Source sense terminal
G2 Gate terminal
51, 52 Wire
P First power supply terminal
N Second power supply terminal
OUT Output terminal
61 First terminal bonding area
62 First element bonding area
63 First board bonding area
71 Second terminal bonding area
72 Second element bonding area
73 Second board bonding area
81 Upper arm circuit
82 Lower arm circuit
110 Pedestal
111 Lower surface of top plate
113 Terminal retainer
120 Power module
123 Case
124 Frame portion
125 Top plate
126, 127 Side plate
128, 129 End plate
135, 136 Bolt
140, 141, 142 Slit-shaped insertion hole

The invention claimed is:

1. A semiconductor device comprising:
a lower board having a lower conductor layer formed on a surface thereof;
a plurality of switching elements bonded to the lower conductor layer in an element bonding area;
a diode element bonded to the lower conductor layer in an element bonding area;
a terminal bonded to the lower conductor layer in a terminal bonding area;
an upper board stacked on the lower board in a board bonding area between the element bonding area and the terminal bonding area, and having an upper conductor layer on a surface thereof;
a switching element connecting member which connects the plurality of switching elements with the upper conductor layer and is elongated parallel to a direction from the element bonding area to the terminal bonding area; and
a diode element connecting member which connects the diode element with the upper conductor layer,
wherein the plurality of switching elements include a plurality of switching elements arranged spaced from the diode element at almost the same intervals around the diode element and in a direction which is different from a direction opposed to one another.

2. The semiconductor device according to claim 1, wherein the upper conductor layer is formed in a rectangular shape, the plurality of switching elements are facing one side of the rectangular-shaped upper conductor layer, and the switching elements include a pair of switching elements facing both end portions of the one side.

3. The semiconductor device according to claim 1, wherein the upper conductor layer is formed in a rectangular shape, a plurality of diode elements are facing one side of the rectangular-shaped upper conductor layer, and the diode elements include a pair of diode elements facing both end portions of the one side.

4. The semiconductor device according to claim 1, wherein the switching element is an element using a SiC semiconductor.

5. The semiconductor device according to claim 1, wherein
the element bonding area includes a first area along one side of the upper conductor layer, a second area extending from the first area in a direction to separate from the upper board, and a third area extending from the first area in a direction to separate from the first area at a position different from the second area, and
at least one switching element is bonded to each of the first area, second area, and third area,
the semiconductor device further comprising:
a first controlling conductor layer arranged facing the first area;
a second controlling conductor layer arranged facing the first controlling conductor layer from an opposite side to the first area, and extending between the first controlling conductor layer and the second area and third area; and
controlling wiring members for respective connections between the switching elements arranged in the first area, second area and third area and the first controlling conductor layer and second controlling conductor layer.

6. A semiconductor device comprising:
a first lower board having a first lower conductor layer formed on a surface thereof;
a plurality of first switching elements bonded to the first lower conductor layer in a first element bonding area;
a first diode element bonded to the first lower conductor layer in a first element bonding area;
a first power supply terminal bonded to the first lower conductor layer in a first terminal bonding area;
a first upper board stacked on the first lower board in a first board bonding area between the first element bonding area and the first terminal bonding area, and having a first upper conductor layer on a surface thereof;
a first switching element connecting member which connects the plurality of first switching elements with the first upper conductor layer and is elongated parallel to a direction from the first element bonding area to the first terminal bonding area;
a first diode element connecting member which connects the first diode element with the first upper conductor layer;
a second lower board having a second lower conductor layer formed on a surface thereof;
a plurality of second switching elements bonded to the second lower conductor layer in a second element bonding area;
a second diode element bonded to the second lower conductor layer in a second element bonding area;
an output terminal electrically connected to the first upper conductor layer, and bonded to the second lower conductor layer in a second terminal bonding area;
a second upper board stacked on the second lower board in a second board bonding area between the second element bonding area and the second terminal bonding area, and having a second upper conductor layer on a surface thereof,
a second switching element connecting member which connects the plurality of second switching elements with the second upper conductor layer and is elongated parallel to a direction from the second element bonding area to the second terminal bonding area;
a second diode element connecting member which connects the second diode element with the second upper conductor layer;
a second power supply terminal bonded to the second upper conductor layer; and
a holding base which holds the first lower board and the second lower board so that the first and second terminal bonding areas are adjacent to each other,
wherein the plurality of first switching elements include a plurality of first switching elements arranged spaced from the first diode element at almost the same intervals around the first diode element and in a direction which is different from a direction opposed to one another, and
wherein the plurality of second switching elements include a plurality of second switching elements arranged spaced from the second diode element at almost the same intervals around the second diode element.

7. The semiconductor device according to claim 6, wherein the first power supply terminal and second power supply terminal have plate-shaped parts facing each other with a predetermined interval kept therebetween.

8. A semiconductor device according to claim 1, wherein the terminal extends parallel to a principal surface of the lower board,
comprising a resin case which surrounds the lower board and the upper board, wherein
the resin case is made of an assembly including a first case component having an insertion hole through which the terminal is inserted and a second case component which is combined with the first case component.

9. A semiconductor device comprising:
a lower board having a lower conductor layer formed on a surface thereof;
a plurality of switching elements bonded to the lower conductor layer in an element bonding area;
a diode element bonded to the lower conductor layer in an element bonding area;
a terminal bonded to the lower conductor layer in a terminal bonding area;
an upper board stacked on the lower board in a board bonding area between the element bonding area and the terminal bonding area, and having an upper conductor layer on a surface thereof;
a switching element connecting member which connects the plurality of switching elements with the upper conductor layer and is elongated parallel to a direction from the element bonding area to the terminal bonding area;
a diode element connecting member which connects the diode element with the upper conductor layer;
a switching element controlling terminal having a bonding portion bonded to the lower board, a first rising portion rising from the bonding portion in a direction to separate from a principal surface of the lower board, a transverse portion extending from an upper end of the first rising portion along the principal surface of the lower board, and a second rising portion rising from the transverse portion in a direction to separate from the principal surface of the lower board;

a terminal pedestal arranged between the second rising portion and the principal surface of the lower board; and a terminal retainer arranged so as to make contact with or approximate the transverse portion from an opposite side to the principal surface of the lower board, wherein the plurality of switching elements include a plurality of switching elements arranged spaced from the diode element at almost the same intervals around the diode element and in a direction which is different from a direction opposed to one another.

10. The semiconductor device according to claim 9, further comprising a case which surrounds the board assembly, wherein the case includes a case plate in which an insertion hole through which the second rising portion is inserted is formed, and the case plate is provided with the terminal retainer.

11. The semiconductor device according to claim 10, wherein the terminal retainer is an inner surface of the case plate facing the transverse portion, and the case plate is attached to the case so that the inner surface is arranged substantially flush with the transverse portion.

12. The semiconductor device according to claim 1, wherein the switching element connecting member is a switching element connecting frame made of a plate-like body.

13. The semiconductor device according to claim 12, further comprising a switching element connecting resilient member with conductivity interposed between the switching element and the switching element connecting frame; and a pressing member which presses the switching element connecting frame to the switching element side so that the switching element connecting resilient member is pressed to the switching element side by the switching element connecting frame.

14. The semiconductor device according to claim 1, wherein the diode element connecting member is a diode element connecting frame made of a plate-like body.

15. The semiconductor device according to claim 14, further comprising a diode element connecting resilient member with conductivity interposed between the diode element and the diode element connecting frame; and a pressing member which presses the diode element connecting frame to the diode element side so that the diode element connecting resilient member is pressed to the diode element side by the diode element connecting frame.

16. The semiconductor device according to claim 1, wherein the switching element connecting member and the diode element connecting member are a single element connecting frame made of a plate-like body.

17. The semiconductor device according to claim 16, further comprising a switching element connecting resilient member with conductivity interposed between the switching element and the element connecting frame;

a diode element connecting resilient member with conductivity interposed between the diode element and the element connecting frame; and a pressing member which presses the element connecting frame to the switching element side and the diode element side so that the switching element connecting resilient member is pressed to the switching element side and the diode element connecting resilient member is pressed to the diode element side by the element connecting frame.

18. The semiconductor device according to claim 2, further comprising:

a diode element bonded to the lower conductor layer in the element bonding area; and a diode element connecting member which connects the diode element with the upper conductor layer.

19. The semiconductor device according to claim 18, wherein the upper conductor layer is formed in a rectangular shape, a plurality of diode elements are facing one side of the rectangular-shaped upper conductor layer, and the diode elements include a pair of diode elements facing both end portions of the one side.

20. A semiconductor device according to claim 6, wherein the first power supply terminal, the output terminal and the second power supply terminal extend parallel to a principal surface of the lower board, comprising a resin case which surrounds the first lower board, the first upper board, the second lower board and the second upper board wherein the resin case is made of an assembly including a first case component having a plurality of insertion holes through which each of the terminals is inserted respectively and a second case component which is combined with the first case component.

* * * * *